US012573452B2

(12) United States Patent
Tran

(10) Patent No.: US 12,573,452 B2
(45) Date of Patent: Mar. 10, 2026

(54) DETERMINATION OF A BIAS VOLTAGE TO APPLY TO ONE OR MORE MEMORY CELLS

(71) Applicant: Silicon Storage Technology, Inc., San Jose, CA (US)

(72) Inventor: Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 59 days.

(21) Appl. No.: 18/385,256

(22) Filed: Oct. 30, 2023

(65) Prior Publication Data

US 2024/0062812 A1 Feb. 22, 2024

Related U.S. Application Data

(62) Division of application No. 17/585,452, filed on Jan. 26, 2022, now Pat. No. 12,230,319.

(60) Provisional application No. 63/279,028, filed on Nov. 12, 2021.

(51) Int. Cl.
| | |
|---|---|
| *G11C 11/54* | (2006.01) |
| *G06N 3/063* | (2023.01) |
| *G11C 16/04* | (2006.01) |
| *G11C 16/10* | (2006.01) |
| *G11C 16/24* | (2006.01) |
| *G11C 16/26* | (2006.01) |
| *H10B 41/30* | (2023.01) |

(52) U.S. Cl.
CPC .............. *G11C 11/54* (2013.01); *G06N 3/063* (2013.01); *G11C 16/0425* (2013.01); *G11C 16/10* (2013.01); *G11C 16/24* (2013.01); *G11C 16/26* (2013.01); *H10B 41/30* (2023.02)

(58) Field of Classification Search
CPC ..... G11C 11/54; G11C 16/0425; G11C 16/10; G11C 16/24; G11C 16/26; G11C 7/1006; G11C 7/04; G06N 3/063; H10B 41/30
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan | |
| 10,748,630 B2 | 8/2020 | Tran | |
| 2007/0222653 A1* | 9/2007 | Briaire | ................ H03M 1/0653 341/144 |

(Continued)

FOREIGN PATENT DOCUMENTS

| | | |
|---|---|---|
| TW | 202137074 | 10/2021 |
| WO | 2021/011923 | 1/2021 |

OTHER PUBLICATIONS

Taiwanese Office Action mailed on Sep. 27, 2023 corresponding to the related Taiwanese Patent Application No. 111138728.

(Continued)

*Primary Examiner* — Sultana Begum
(74) *Attorney, Agent, or Firm* — Vedder Price P.C.

(57) ABSTRACT

In one example, a method comprises programming a memory cell capable of storing any of N values with 1 of the N values; applying a series of currents of increasing size to a bit line of the memory cell; comparing a voltage of the bit line to a reference voltage to generate a comparison output; and when the comparison output changes value, measuring a voltage of a control gate terminal of the memory cell and storing the voltage in a bias lookup table.

12 Claims, 53 Drawing Sheets

Calibration Method 4450

4451 — Program memory cell 4401 with 1 of N values

4452 — Current digital to analog converter 4402 varies the bitline current from a low current to increasingly higher currents until the output of comparator 4403 changes in value (e.g., from "0" to "1")

4453 — Measure the control gate voltage of memory cell 4401 when the flip occurs and store the voltage value in lookup table 4470

4454 — Repeat steps 4451, 4452, and 4453 for all other values of the N values that can be stored in memory cell 4401

(56) References Cited

U.S. PATENT DOCUMENTS

| | | | | |
|---|---|---|---|---|
| 2012/0134213 | A1 | 5/2012 | Choi | |
| 2012/0244547 | A1 | 9/2012 | Mazzari | |
| 2014/0032949 | A1 | 1/2014 | Kim | |
| 2017/0337466 | A1 | 11/2017 | Bayat | |
| 2020/0275041 | A1* | 8/2020 | Higuchi | H04N 25/618 |
| 2020/0359265 | A1 | 11/2020 | Azizi et al. | |
| 2022/0321813 | A1* | 10/2022 | Lei | H04N 25/77 |
| 2023/0005529 | A1* | 1/2023 | Hwang | G06F 7/50 |

OTHER PUBLICATIONS

PCT Invitation to Pay Additional Fees dated Jul. 15, 2022 corresponding to the related PCT Patent Application No. US 2022/014166.
PCT Search Report and Written Opinion mailed on Sep. 7, 2022 corresponding to the related PCT Patent Application No. US2022/014166.
Office Action from European Patent Office, filed under European Application No. 22704668.7, 5 pages.
Hokchhay Tann, etal.; Runtime Configurable Deep Neural Networks for Energy-Accuracy Trade-off; IEEE International Conference on Hardware/Software Codesign and System Synthesis; Jul. 2016; 10 pages.
Boyu Zhang, etal.; Exploring Energy and Accuracy Tradeoff in Structure Simplification of Trained Deep Neural Networks; IEEE Journal on Emerging and Selected Topics in Circuits and Systems, Dec. 2018, pp. 836-848, vol. 8, No. 4.

* cited by examiner

Memory Cell
210

Memory Cell
310

Memory Cell
410

FIGURE 14 (PRIOR ART)

LSTM 1400

FIGURE 16

LSTM Cell
1600

LSTM Cell
1700

VMM System
3210 w+ array
3211 w- array
3212

3213

VMM System
3300

| VCG | Accuracy % |
| --- | --- |
| 1.8 | 95.6 |
| 1.7 | 95.6 |
| 1.6 | 95.6 |
| 1.5 | 95 |
| 1.4 | 87 |

3502

3501

Neural Network
Layer Method
3600

3601
Apply default biases to array of a layer

3602
Performance inference

3603
Performance data collection

3604
Modulate biases

3605
Performance
data target check
?

Yes

No

3606
Done

Neural Network
Array
3700

FIGURE 40B

BIAS LUT
4020

DIN [m:0] → Array (4021) → Dout [n:0] → DAC (4022) → Vout

FIGURE 42

Scaling
Circuit
4200

4201 — Temp Sensor D[n:0]

Ineu

4202 — Scaler ITV

VO

4203 — ADC

D[n:0]

Scaling
Circuit
4300

Calibration
Circuit
4400

FIGURE 44B

Calibration
Method
4450

4451 — Program memory cell 4401 with 1 of N values

4452 — Current digital to analog converter 4402 varies the bitline current from a low current to increasingly higher currents until the output of comparator 4403 changes in value (e.g., from "0" to "1")

4453 — Measure the control gate voltage of memory cell 4401 when the flip occurs and store the voltage value in lookup table 4470

4454 — Repeat steps 4451, 4452, and 4453 for all other values of the N values that can be stored in memory cell 4401

VOUT

4507

4501-n 4501-0

4504-0

4503-0

4505-0

4502-0

VINn

VIN0

4506-0

Bias
Average
Circuit
4500

FIGURE 48

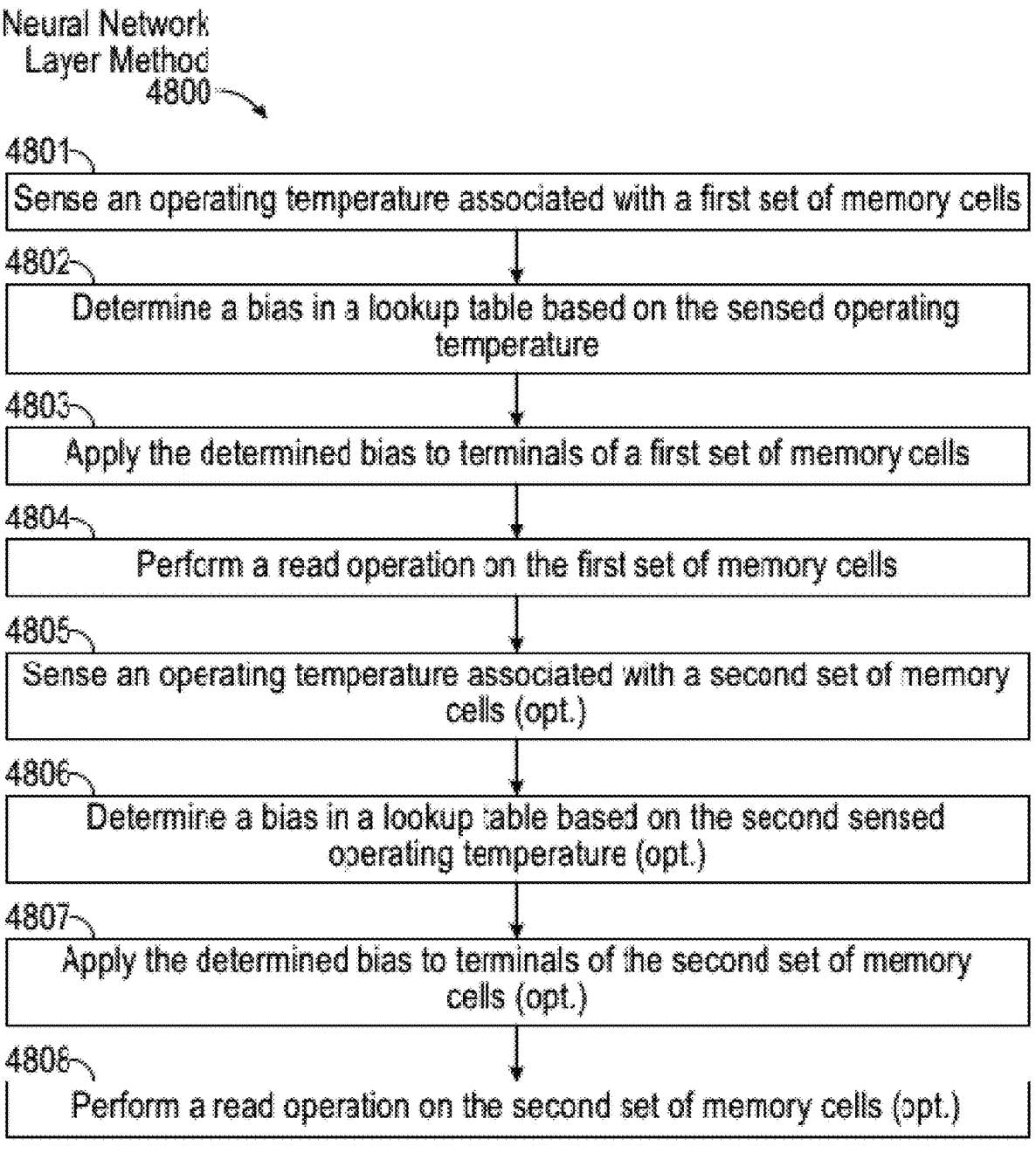

Neural Network
Layer Method
4800

4801
Sense an operating temperature associated with a first set of memory cells

4802
Determine a bias in a lookup table based on the sensed operating temperature 4803
Apply the determined bias to terminals of a first set of memory cells 4804
Perform a read operation on the first set of memory cells 4805
Sense an operating temperature associated with a second set of memory cells (opt.)

4806
Determine a bias in a lookup table based on the second sensed operating temperature (opt.)

4807
Apply the determined bias to terminals of the second set of memory cells (opt.)

4808
Perform a read operation on the second set of memory cells (opt.)

FIGURE 49

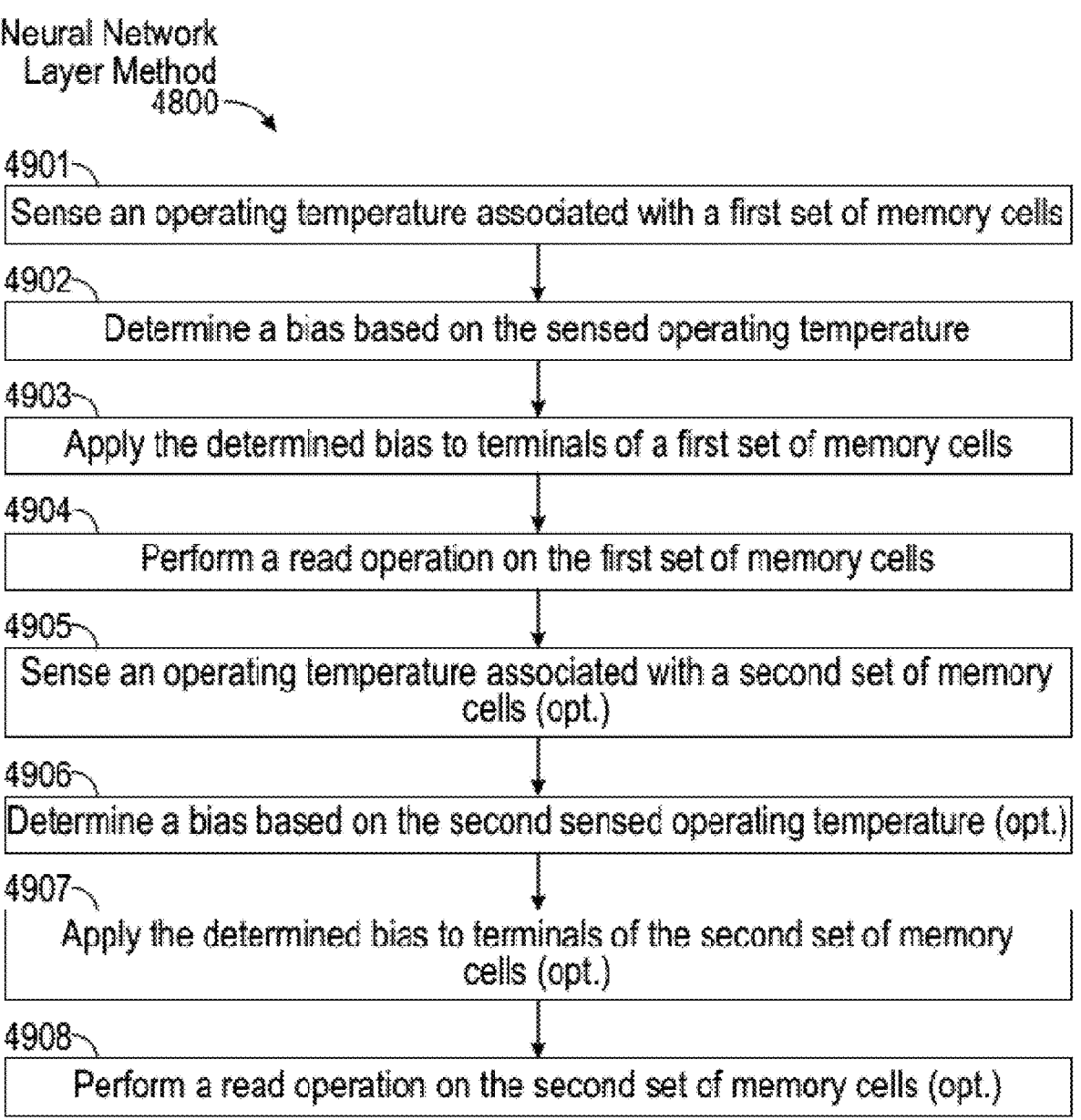

Neural Network
Layer Method
4800

4901
Sense an operating temperature associated with a first set of memory cells

4902
Determine a bias based on the sensed operating temperature

4903
Apply the determined bias to terminals of a first set of memory cells

4904
Perform a read operation on the first set of memory cells

4905
Sense an operating temperature associated with a second set of memory cells (opt.)

4906
Determine a bias based on the second sensed operating temperature (opt.)

4907
Apply the determined bias to terminals of the second set of memory cells (opt.)

4908
Perform a read operation on the second set of memory cells (opt.)

FIGURE 50

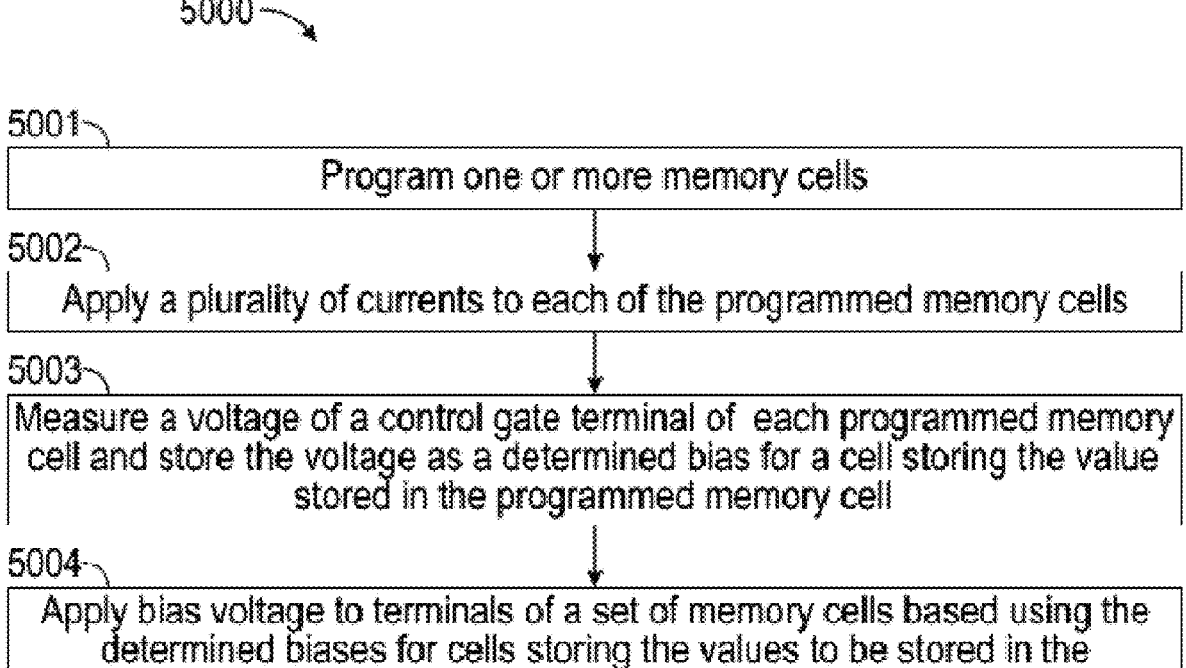

Neural Network
Method
5000

5001
| Program one or more memory cells |

5002
| Apply a plurality of currents to each of the programmed memory cells |

5003
| Measure a voltage of a control gate terminal of each programmed memory cell and store the voltage as a determined bias for a cell storing the value stored in the programmed memory cell |

5004
| Apply bias voltage to terminals of a set of memory cells based using the determined biases for cells storing the values to be stored in the set of memory cells |

5005
| Perform a read operation on the set of memory cells |

1

DETERMINATION OF A BIAS VOLTAGE TO APPLY TO ONE OR MORE MEMORY CELLS

PRIORITY CLAIM

This application is a divisional application of U.S. patent application Ser. No. 17/585,452, filed on Jan. 26, 2022, and titled, "Determination of a Bias Voltage to Apple to One Or More Memory Cells in a Neural Network," which claims priority to U.S. Provisional Patent Application No. 63/279,028, filed on Nov. 12, 2021, and titled, "Optimization of Analog Neural Memory in a Deep Learning Artificial Neural Network as to Performance, Power, or Temperature," which are incorporated by reference herein.

FIELD OF THE INVENTION

Numerous embodiments for improving an analog neural memory in a deep learning artificial neural network as to performance or power in a varying temperature environment are disclosed.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE NO. 1

| Operation of Flash Memory Cell 210 of FIG. 3 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

| Operation of Flash Memory Cell 310 of FIG. 3 | | | | |
|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0V/−8 V | 8-12 V | 0 V |
| Program | 1 V | 0.1-1 µA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 410 for performing read, erase, and program operations:

TABLE NO. 3

| Operation of Flash Memory Cell 410 of FIG. 4 | | | |
|---|---|---|---|
| | WL/SG | BL | EG | SL |
| Read | 0.7-2.2 V | 0.6-2 V | 0-2.6 V | 0 V |
| Erase | −0.5V/0 V | 0 V | 11.5 V | 0 V |
| Program | 1 V | 0.2-3 µA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | −8 to −10V/0V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapse weights of the neural network.

Neural Networks Employing Non-Volatile Memory Cell Arrays

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a,

32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, are preferably configured to operate in a sub-threshold region.

The non-volatile reference memory cells and the non-volatile memory cells described herein are biased in weak inversion (sub threshold region):

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg=n*Vt*log[Ids/wp*Io]$$

where, wp is w of a reference or peripheral memory cell.

For a memory array used as a vector matrix multiplier VMM array with the current input, the output current is:

$$Iout=wa*Io*e^{(Vg)/nVt}, \text{ namely}$$

$$Iout=(wa/wp)*Iin=W*Iin$$

$$W=e^{(Vthp-Vtha)/nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth=Vth0+gamma(SQRT|Vsb-2*\varphi F|-SQRT|2*\varphi F|)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids=beta*(Vgs-Vth)*Vds; beta=u*Cox*Wt/L$$

$$W=\alpha(Vgs-Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids=\frac{1}{2}*beta*(Vgs-Vth)^2; beta=u*Cox*Wt/L$$

$$W\alpha(Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other embodiments for VMM array 32 of FIG. 7 are described in U.S. Pat. No. 10,748,630, which is incorporated by reference herein. As described in that application. a sourceline or a bitline can be used as the neuron output (current summation output).

voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1000 of FIG. 10: | | | | | | |
|---|---|---|---|---|---|---|
| | WL | WL -unsel | BL | BL -unsel | SL | SL -unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| Operation of VMM Array 1100 of FIG. 11 | | | | | | |
|---|---|---|---|---|---|---|
| | WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT | adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| | | | | | | CG - | | | | | |
| | | WL - | | BL - | | unsel same | CG - | | EG - | | SL - |
| | WL | unsel | BL | unsel | CG | sector | unsel | EG | unsel | SL | unsel |
|---|---|---|---|---|---|---|---|---|---|---|---|
| | | | | | Operation of VMM Array 1200 of FIG. 12 | | | | | | |
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

TABLE NO. 8

Operation of VMM Array 1300 of FIG. 13

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0$ . . . , $INPUT_N$ are received on bit lines $BL_0$, . . . $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 23:
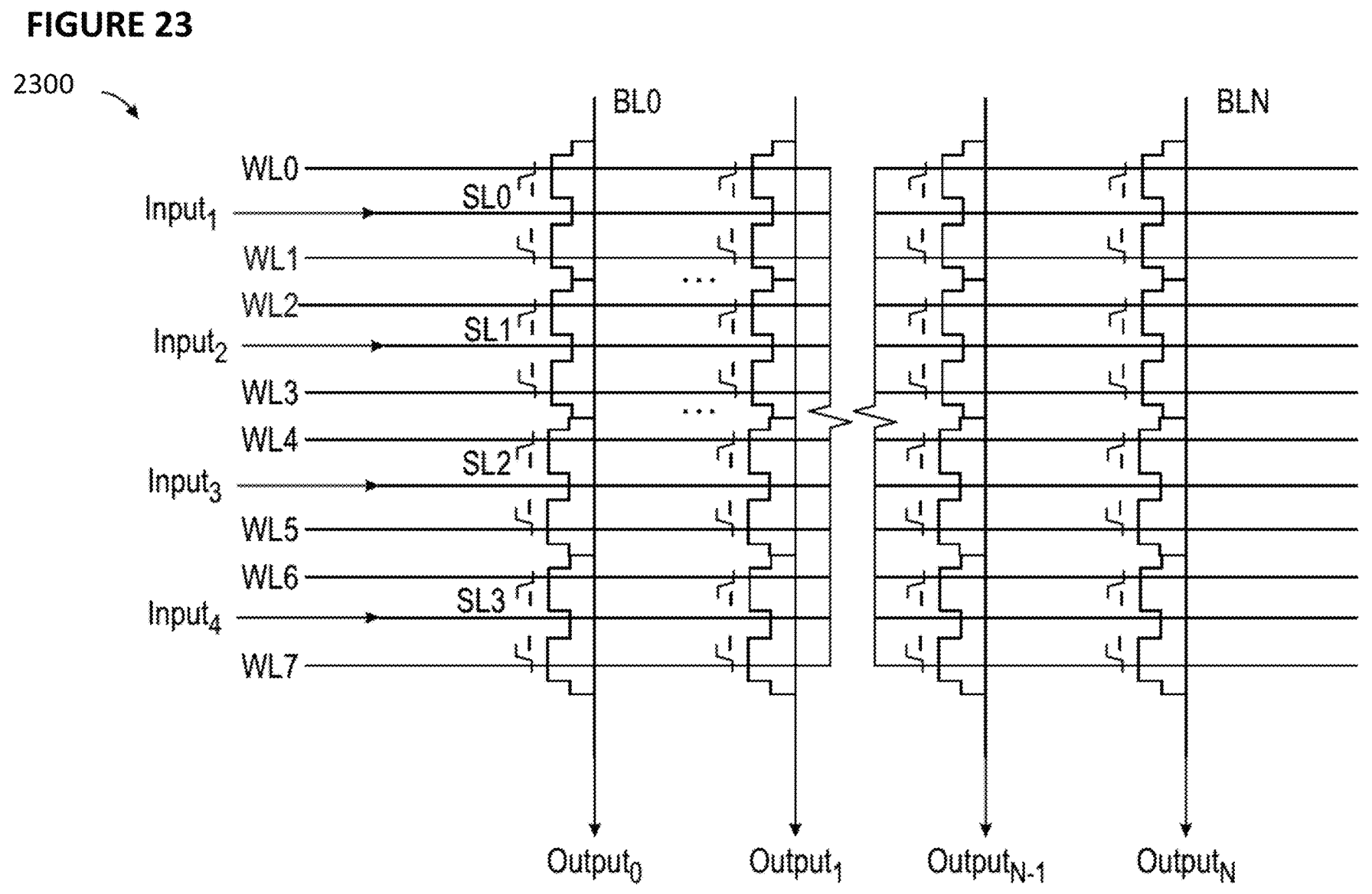

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0$, . . . $OUTPUT_N$ are generated on bit lines $BL_0$, . . . , $BL_N$.

Figure 24:
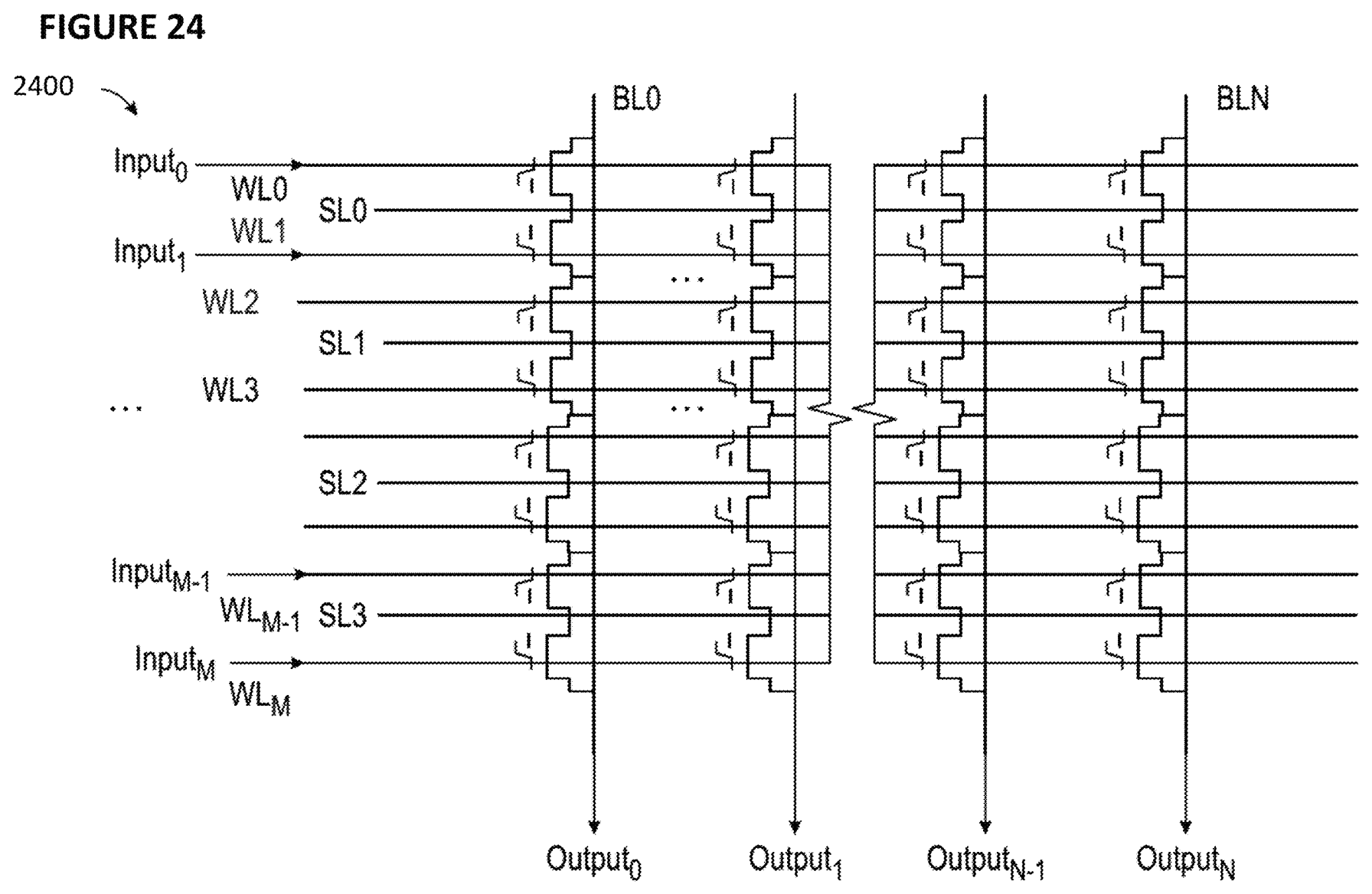

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0$, . . . , $INPUT_n$ are received on vertical control gate lines $CG_0$, . . . , $CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4, and is utilized as the synapses and parts of neurons between an input layer and the next layer. In this example, the inputs $INPUT_0$, . . . , $INPUT_N$ are received on the gates of bit line control gates 2701-1, 2701-2, . . . , 2701-(N−1), and 2701-N, respectively, which are coupled to bit lines $BL_0$, . . . , $BL_N$, respectively. Exemplary outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on word lines $WL_0$, . . . , $WL_M$, and the outputs $OUTPUT_0$, . . . , $OUTPUT_N$ are generated on bit lines $BL_0$, . . . , $BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical source lines $SL_0$, . . . , $SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical bit lines $BL_0$, . . . , $BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 14:
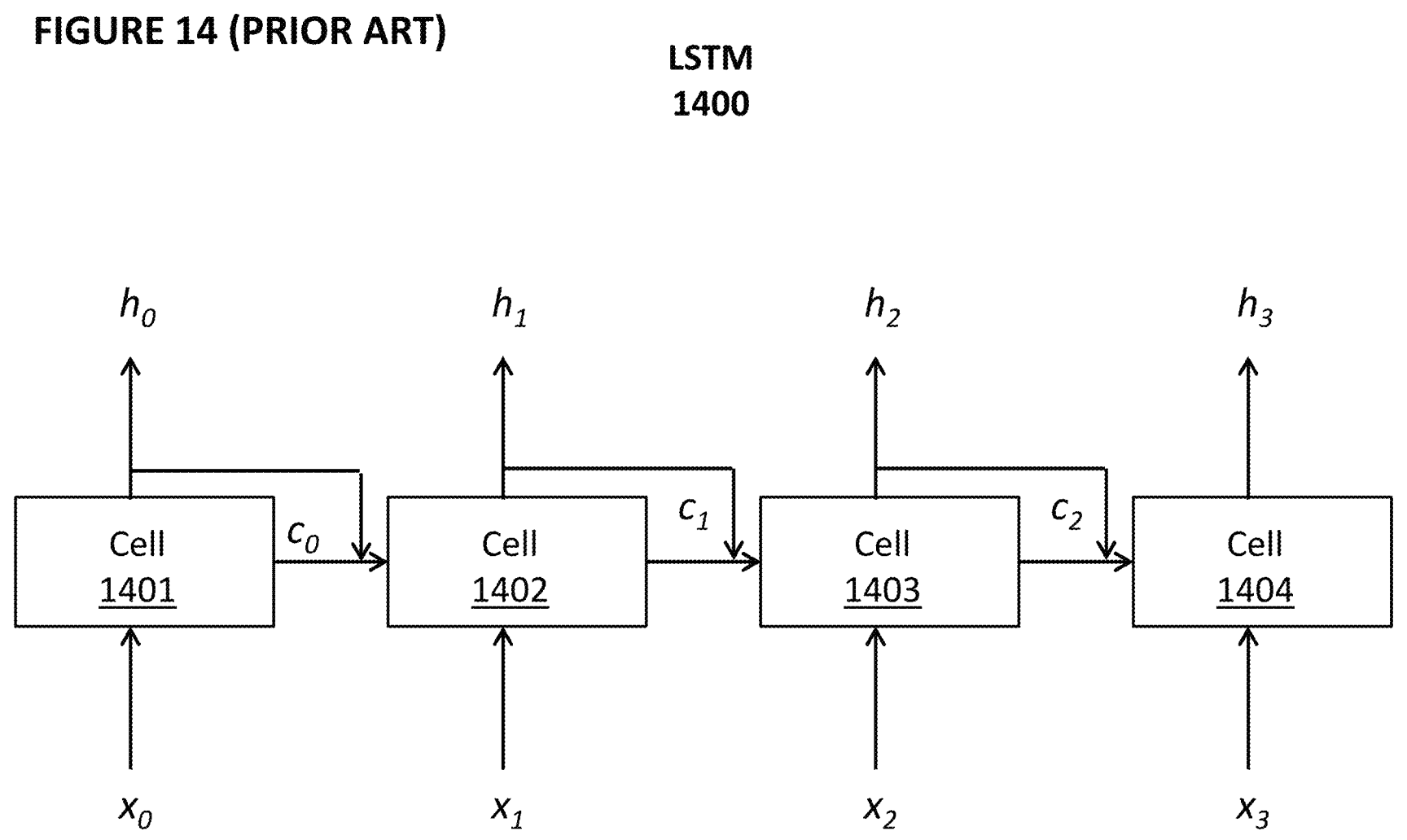

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an exemplary implementation of an LSTM cell 1500, which can be used for cells 1401, 1402, 1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

Figure 16:
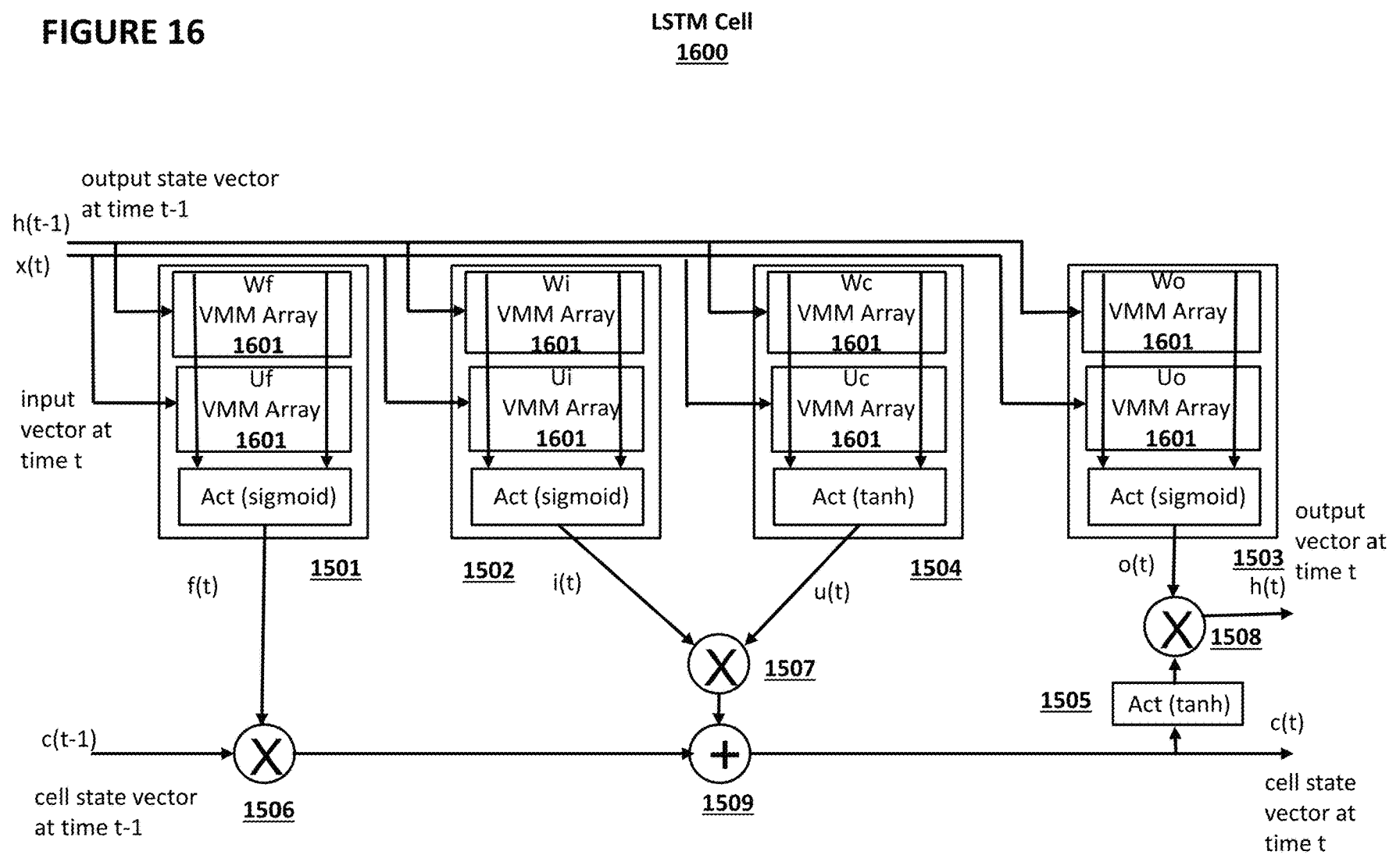

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602, Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tan h device 1505 (which comprises activation function block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an exemplary implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t), GRU cell 1900 comprises sigmoid function devices 1901 and 1902, each of which applies a number between 0 and 1 to components from output vector h(t−1) and input vector x(t). GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value h^(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The embodiments described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some embodiments, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other embodiments W+ lines and W− lines can be arbitrarily located anywhere in the array.

FIG. 32 depicts another embodiment. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. the weights, W, stored in a VMM array are stored as differential pairs, W+ (positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate should hold one of N different values, where N is the number of different weights that can be indicated by each cell. Examples of N include 16, 32, 64, 128, and 256.

Similarly, a read operation should be able to accurately discern between N different levels.

In some instances, accuracy is of high importance, and it is desirable to improve the accuracy of a system (perhaps at the expense of power consumption). In other instances, power management is of high importance, and it is desirable to improve the power consumption (i.e., reduce the power consumption) of a system (perhaps at the expense of accuracy). In other instances, the ability to maintain accuracy when operating temperatures change is desirable. Other characteristics, such as latency or other performance criteria, can be maximized instead of power consumption and accuracy.

It would be desirable to be able to alter the characteristics of a neural network system to improve accuracy or power consumption in a varying temperature environment.

SUMMARY OF THE INVENTION

Numerous embodiments for improving an analog neural memory in a deep learning artificial neural network as to accuracy, power consumption, or other criteria as temperature changes are disclosed. In some embodiments, a method is performed to determine in real-time a bias value to apply to one or more memory cells in a neural network. In other embodiments, a bias voltage is determined from a lookup table and is applied to a terminal of a memory cell during a read operation.

BRIEF DESCRIPTION OF THE DRAWINGS

FIG. 14 depicts a prior art long short-term memory system.

FIG. 16 depicts an embodiment of the exemplary cell of FIG. 15.

FIG. 23 depicts another embodiment of a vector-by-matrix multiplication system.

FIG. 24 depicts another embodiment of a vector-by-matrix multiplication system.

FIG. 40B depicts a bias look up table.

FIG. 42 depicts a method.

FIG. 44B depicts a calibration method.

FIG. 48 depicts a neural network method.

FIG. 49 depicts a neural network method.

FIG. 50 depicts a neural network method.

DETAILED DESCRIPTION OF THE INVENTION

The artificial neural networks of the present invention utilize a combination of CMOS technology and non-volatile memory arrays.

VMM System Overview

Figure 1:
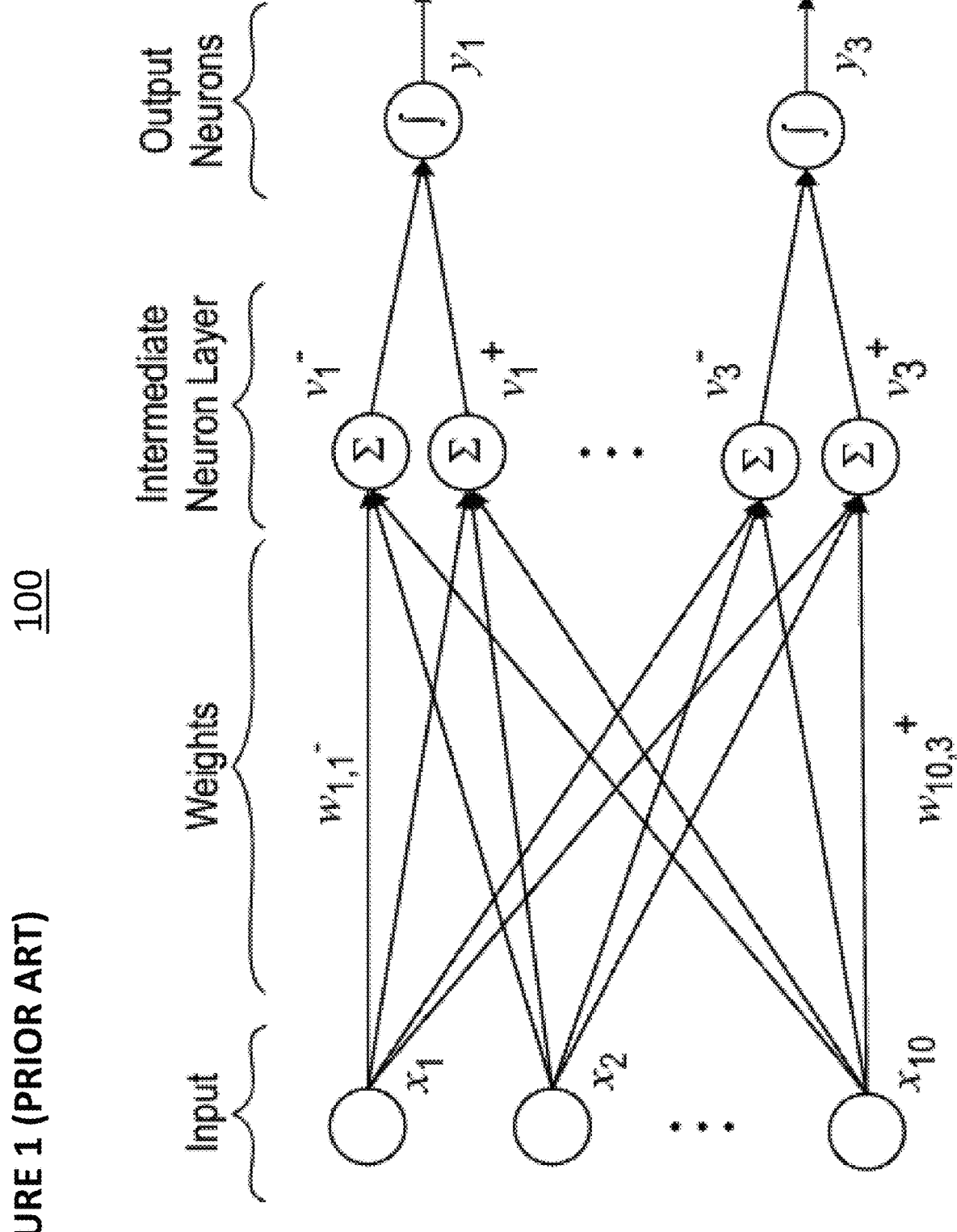
FIG. 1 is a diagram that illustrates an artificial neural network.
Figure 2:
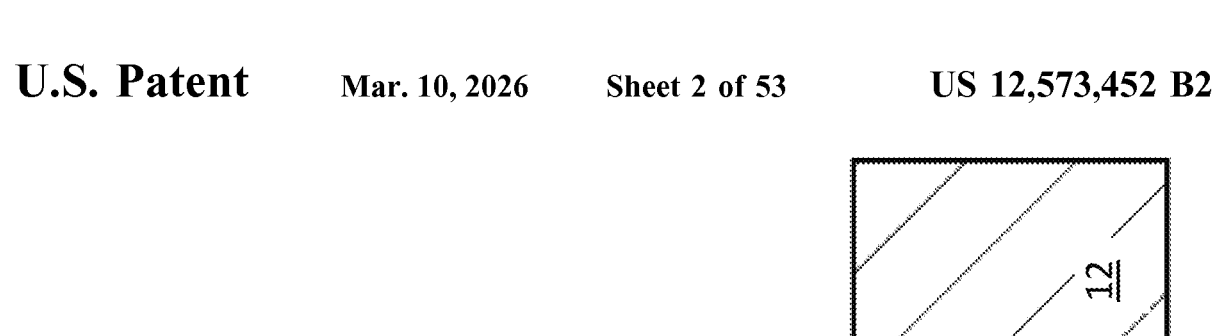
FIG. 2 depicts a prior art split gate flash memory cell.
Figure 3:
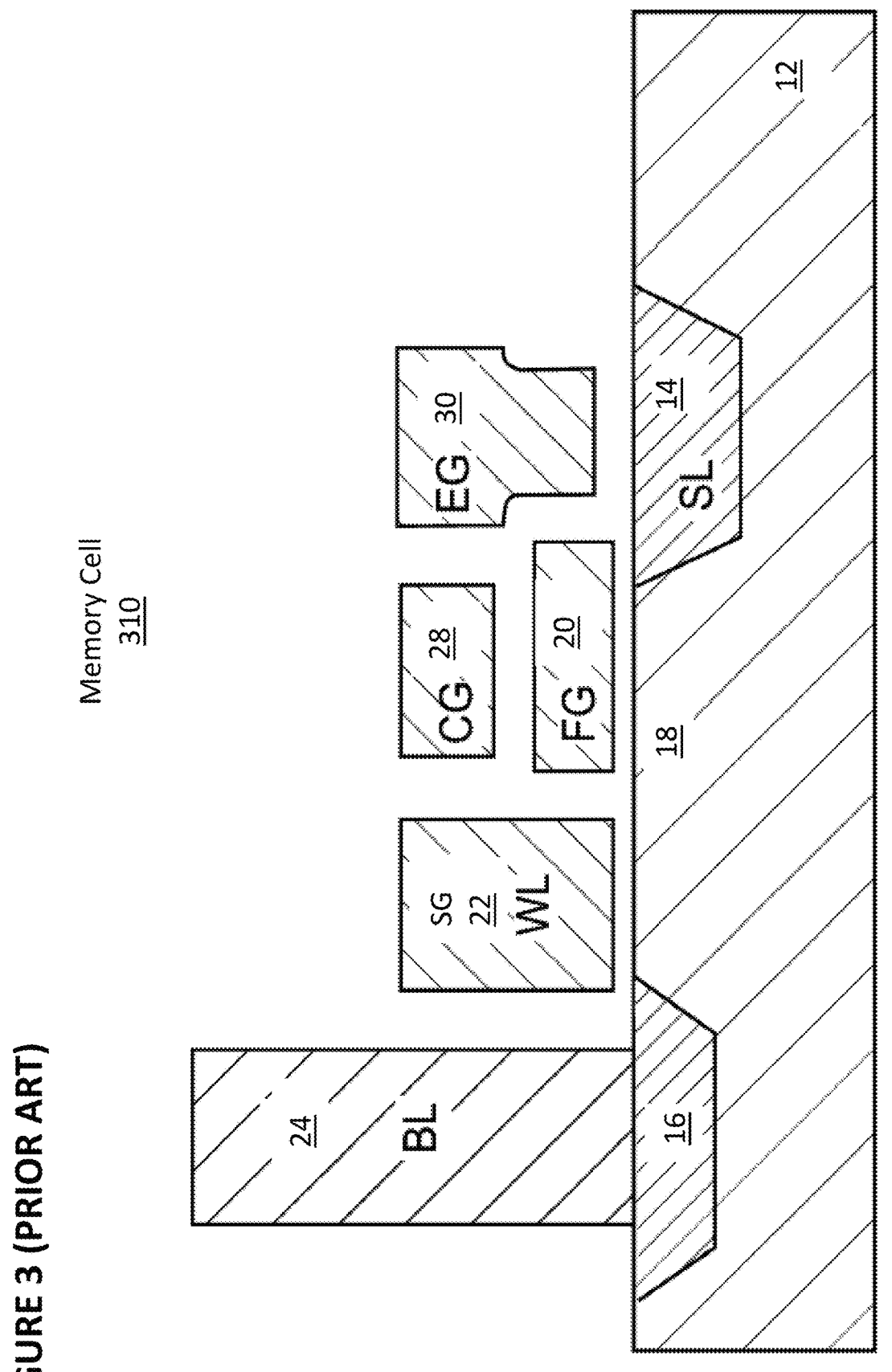
FIG. 3 depicts another prior art split gate flash memory cell.
Figure 4:
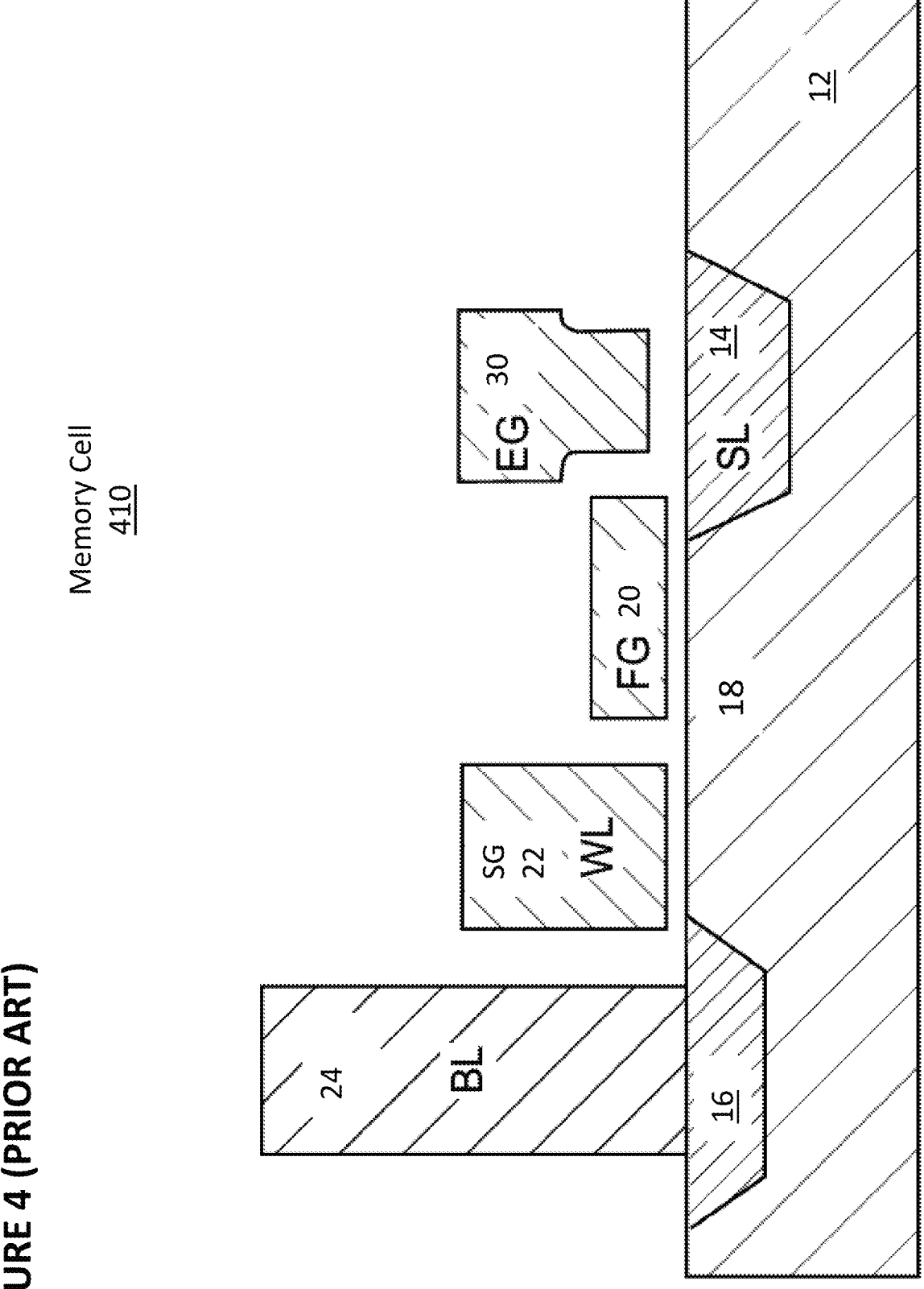
FIG. 4 depicts another prior art split gate flash memory cell.
Figure 5:
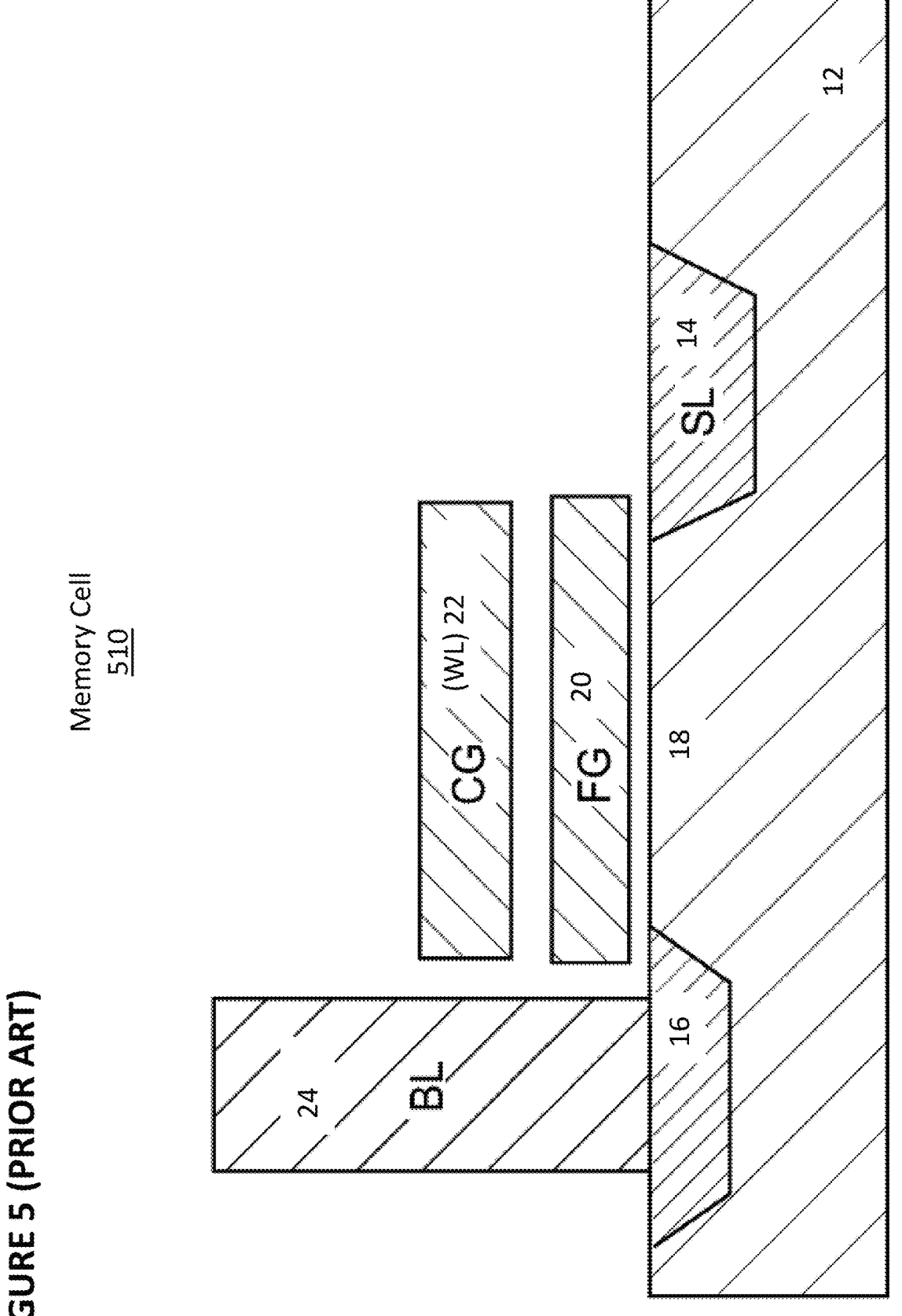
FIG. 5 depicts another prior art split gate flash memory cell.
Figure 6:
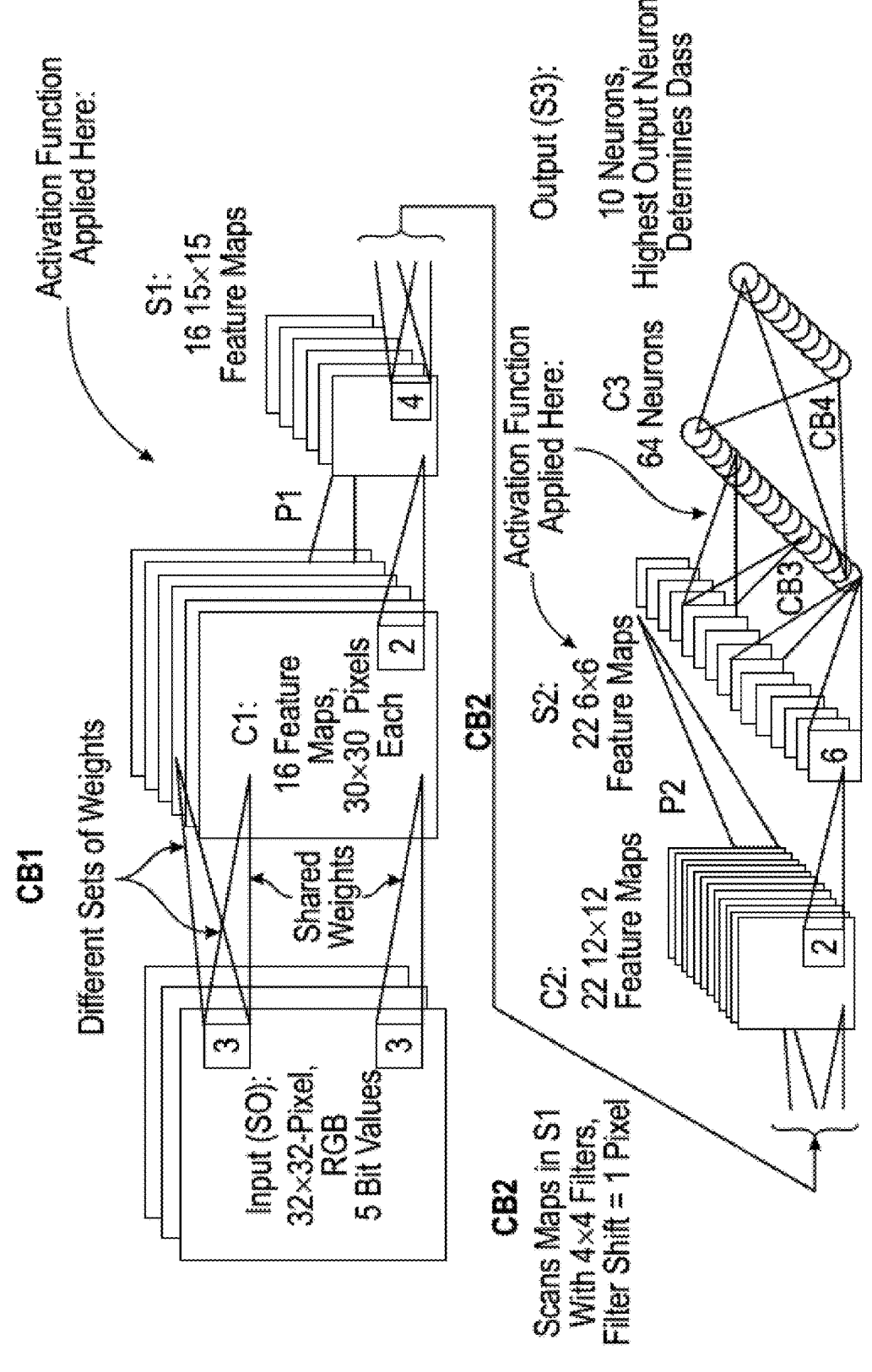
FIG. 6 is a diagram illustrating the different levels of an exemplary artificial neural network utilizing one or more non-volatile memory arrays.
Figure 7:
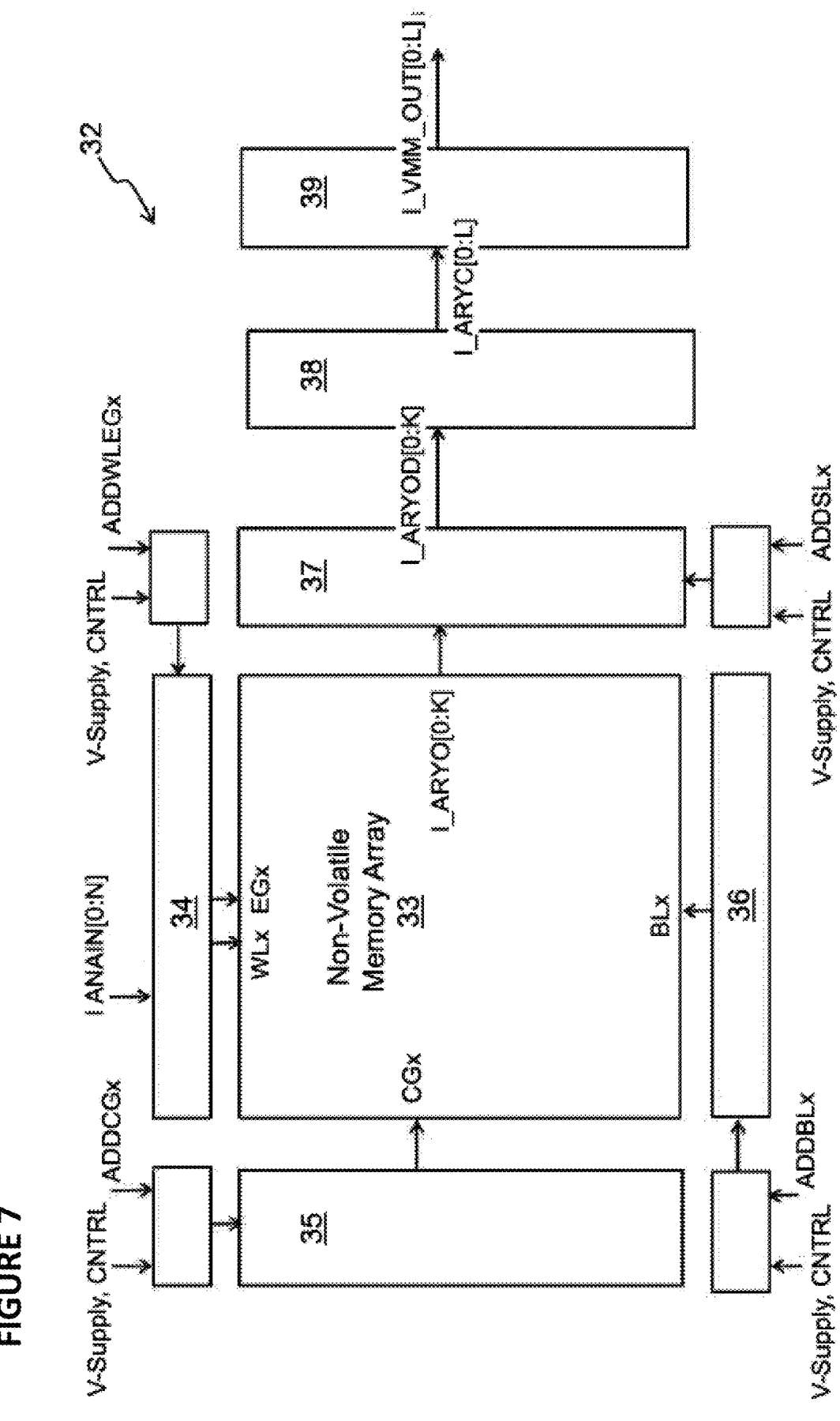
FIG. 7 is a block diagram illustrating a vector-by-matrix multiplication system.
Figure 8:
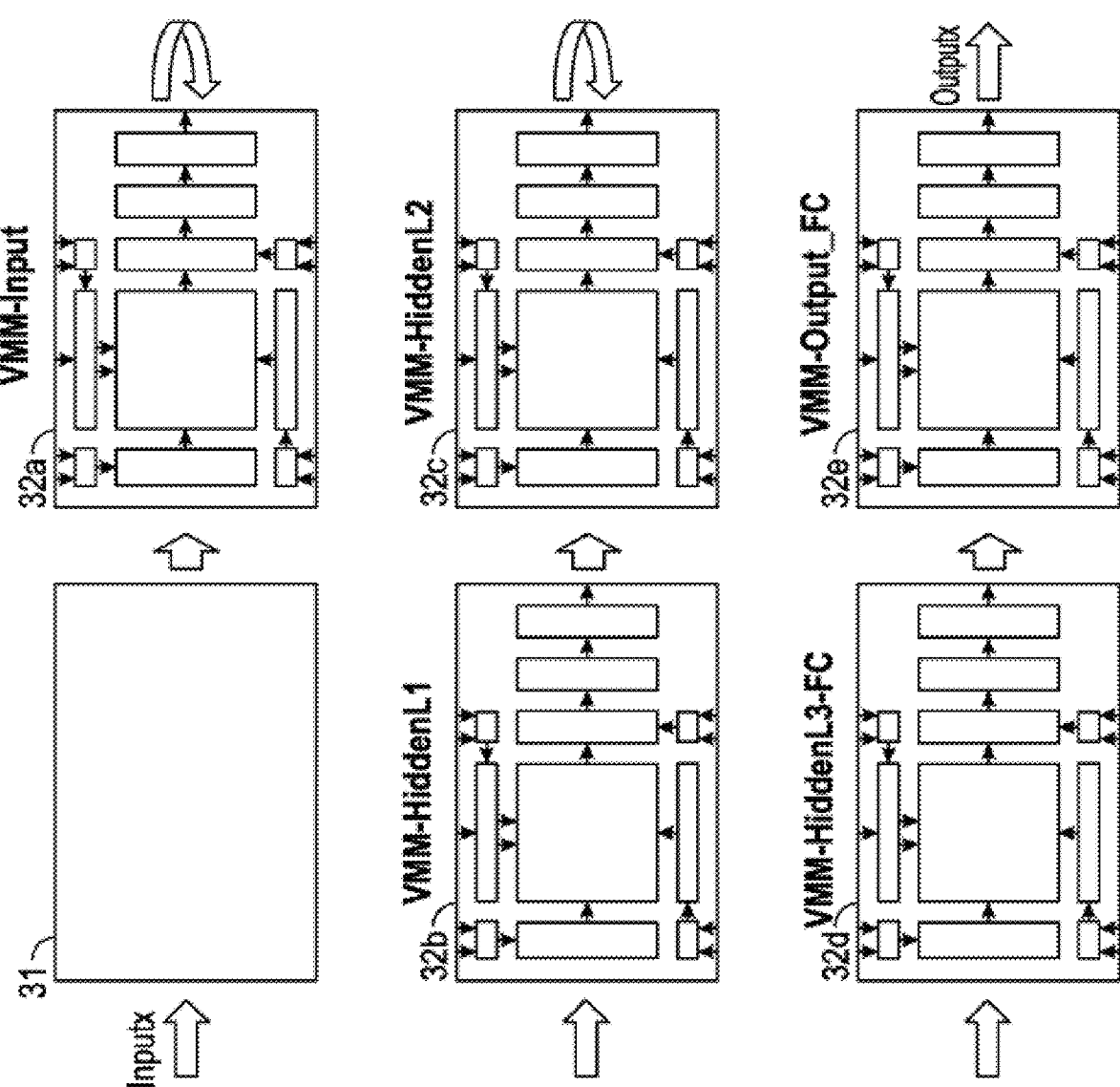
FIG. 8 is a block diagram illustrates an exemplary artificial neural network utilizing one or more vector-by-matrix multiplication systems.
Figure 9:
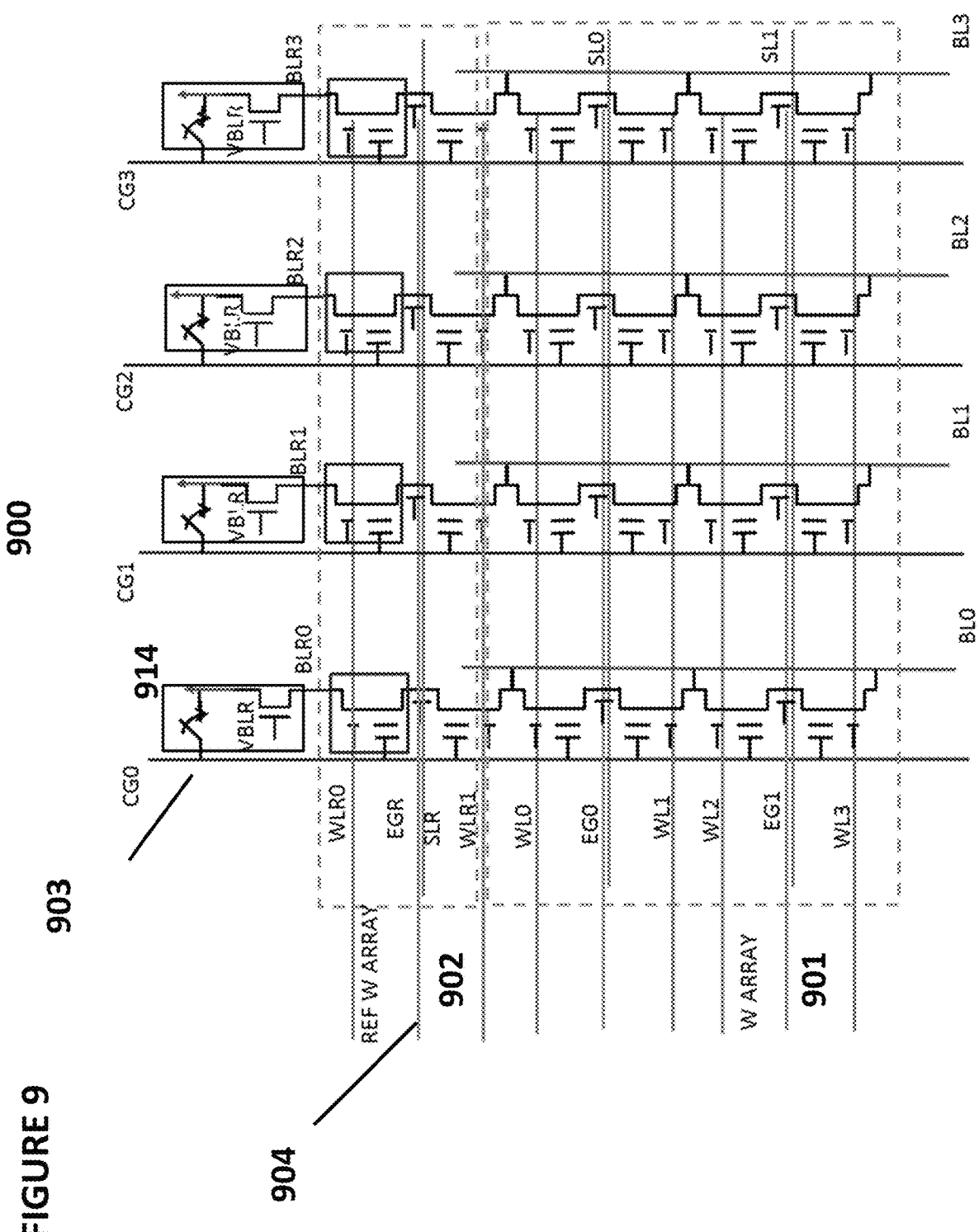
FIG. 9 depicts another embodiment of a vector-by-matrix multiplication system.
Figure 10:
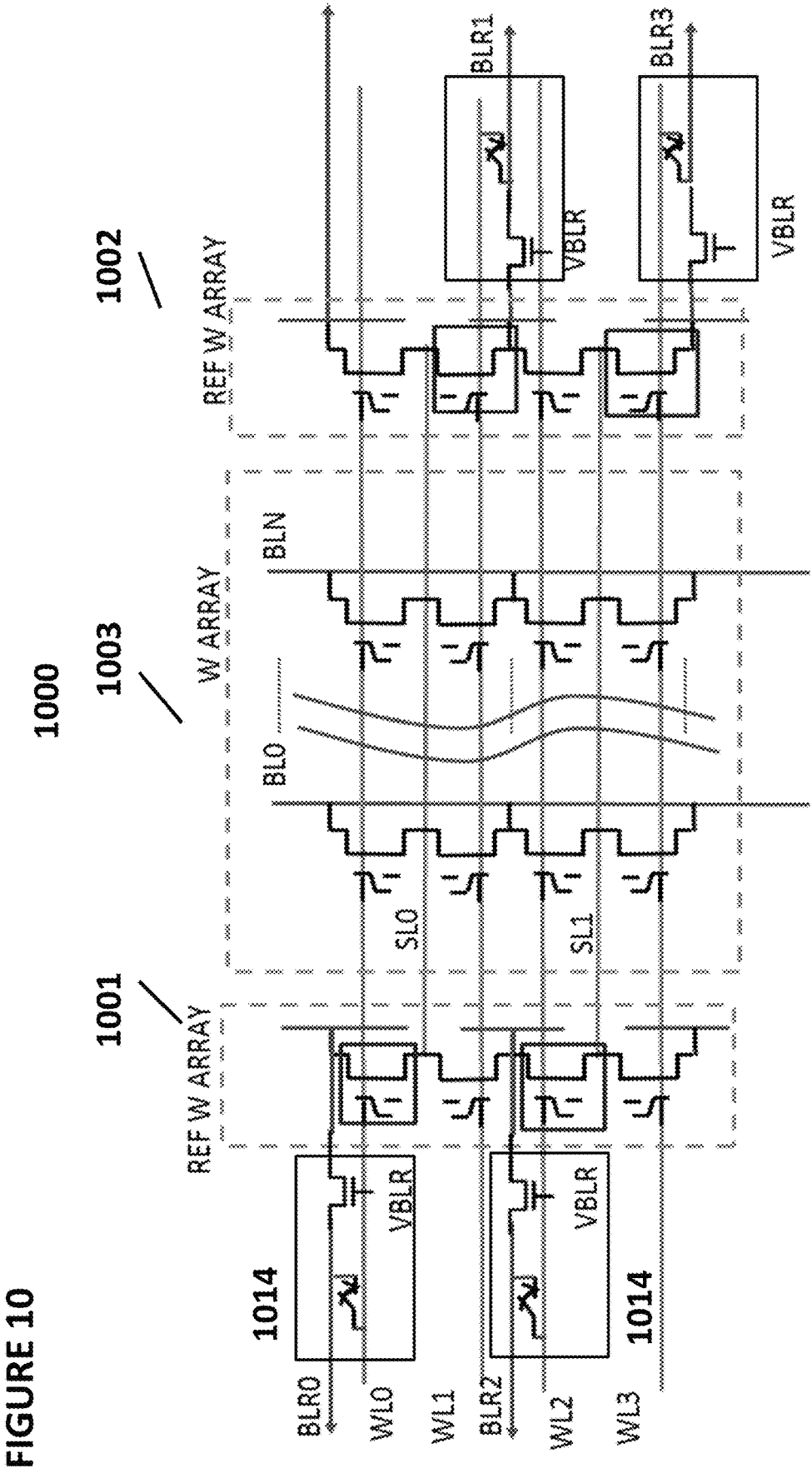
FIG. 10 depicts another embodiment of a vector-by-matrix multiplication system.
Figure 11:
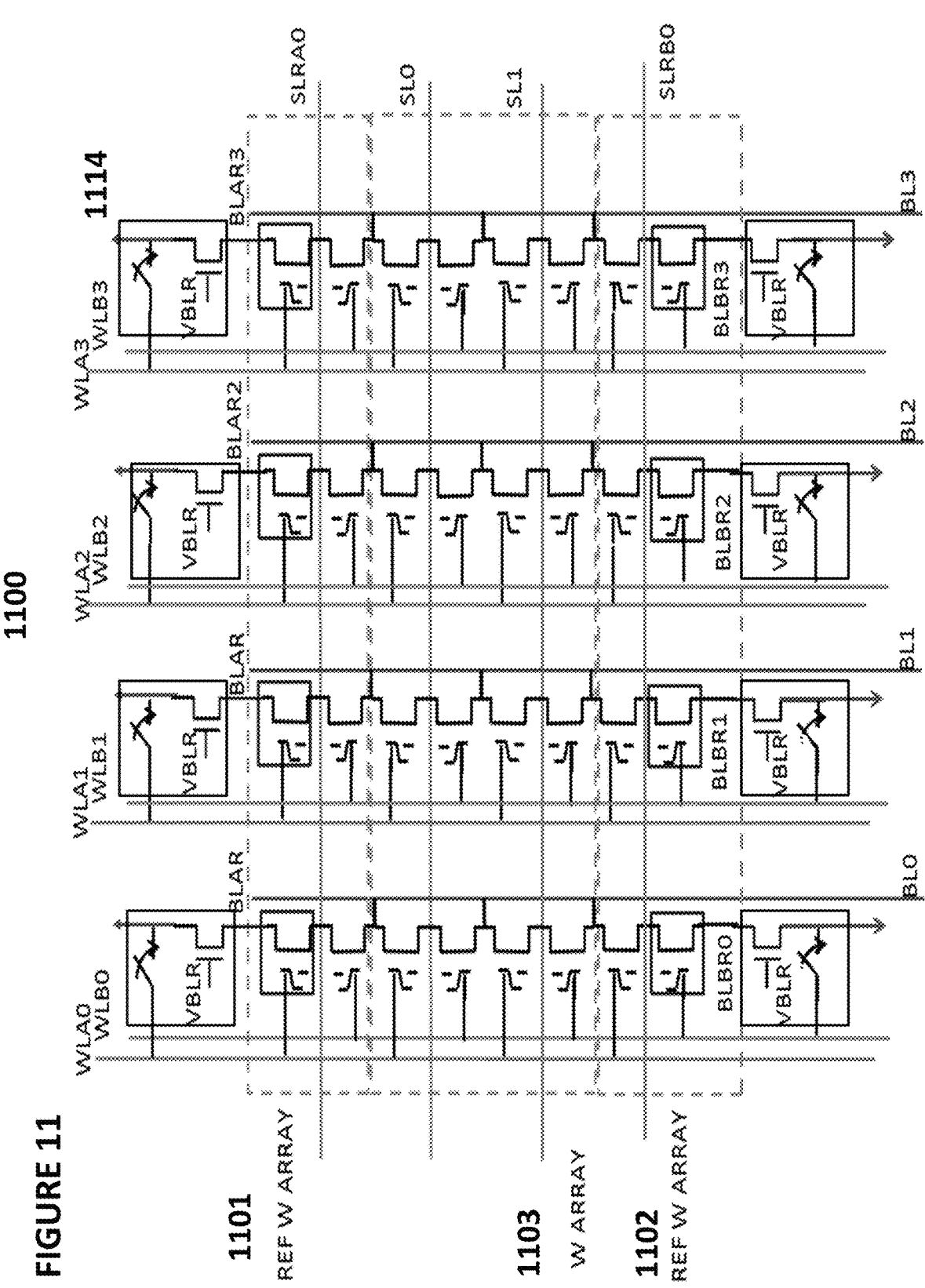
FIG. 11 depicts another embodiment of a vector-by-matrix multiplication system.
Figure 12:
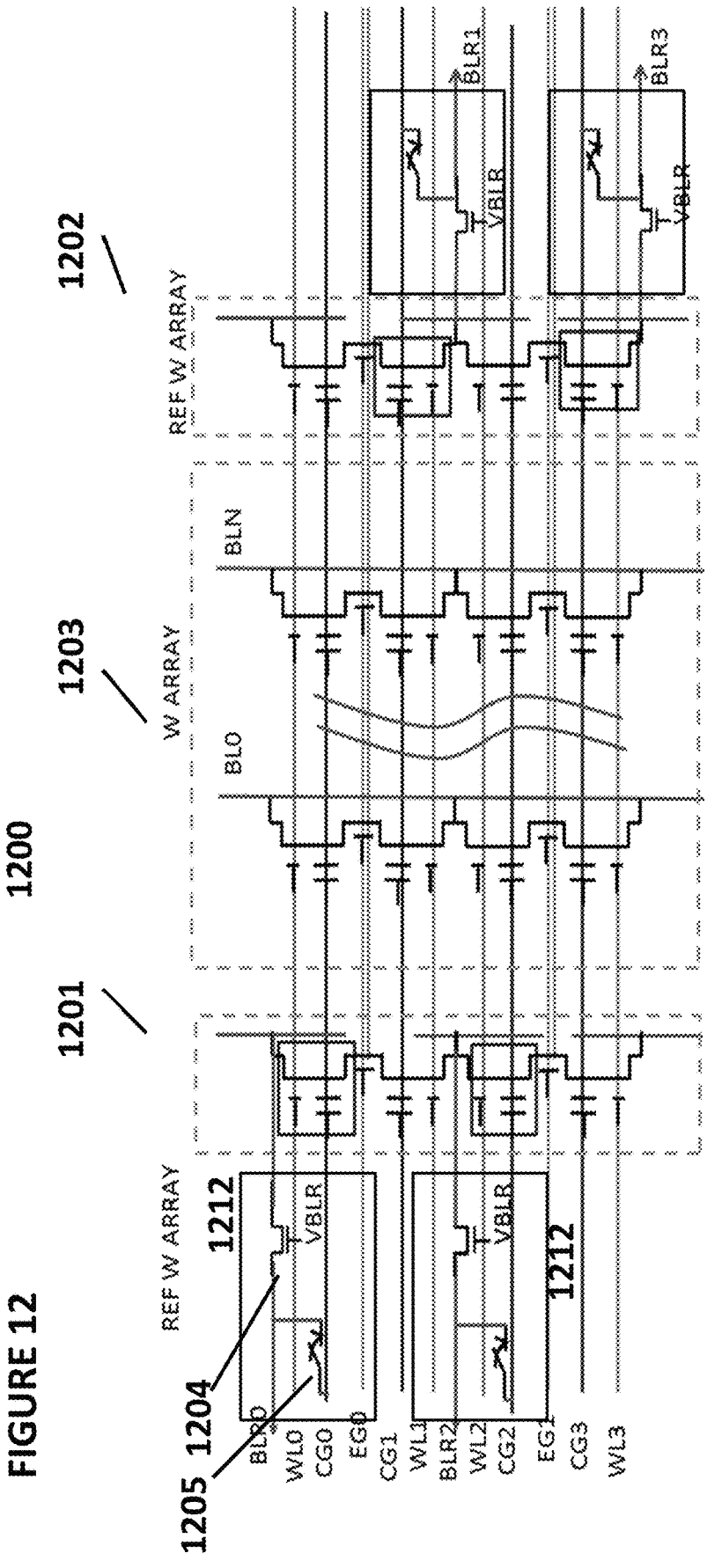
FIG. 12 depicts another embodiment of a vector-by-matrix multiplication system.
Figure 13:
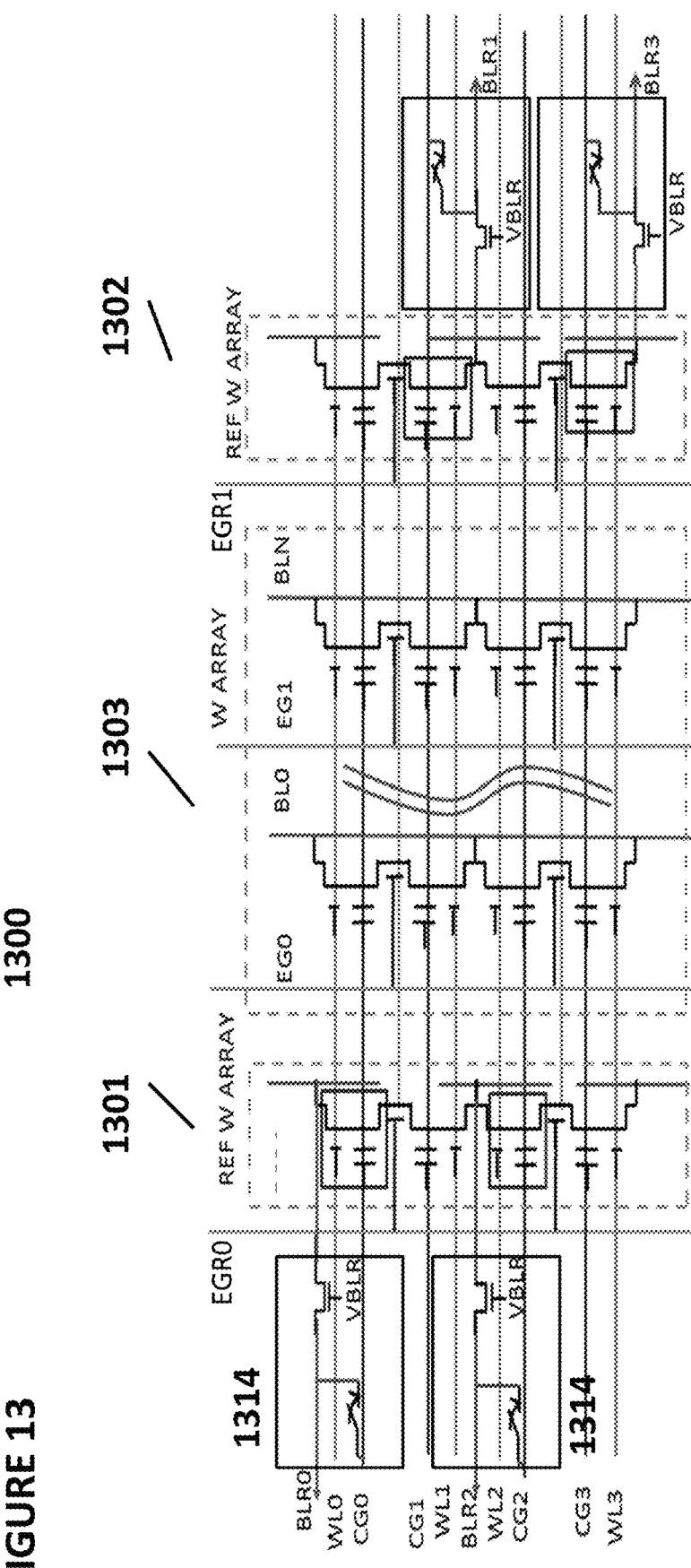
FIG. 13 depicts another embodiment of a vector-by-matrix multiplication system.
Figure 15:
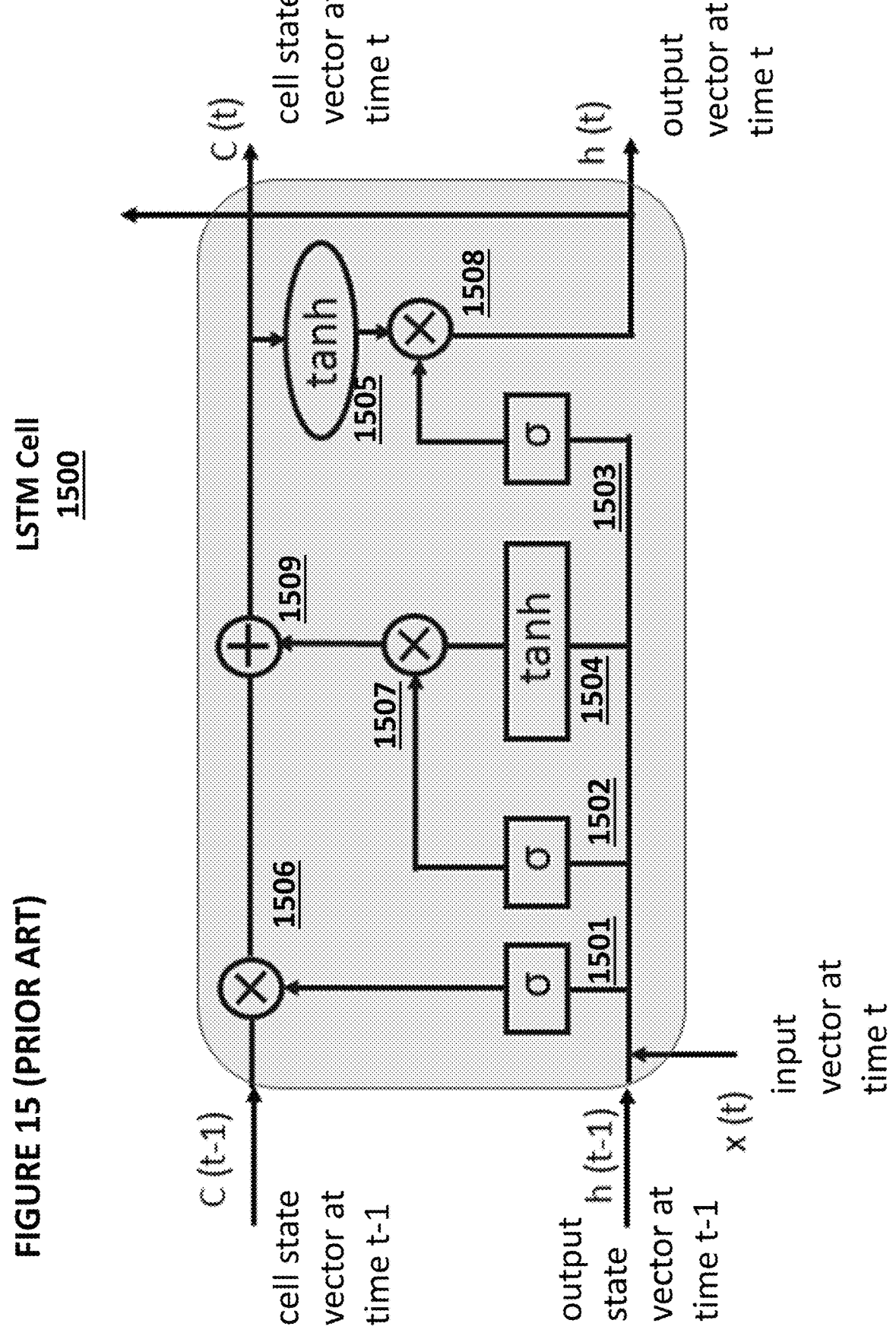
FIG. 15 depicts an exemplary cell for use in a long short-term memory system.
Figure 17:
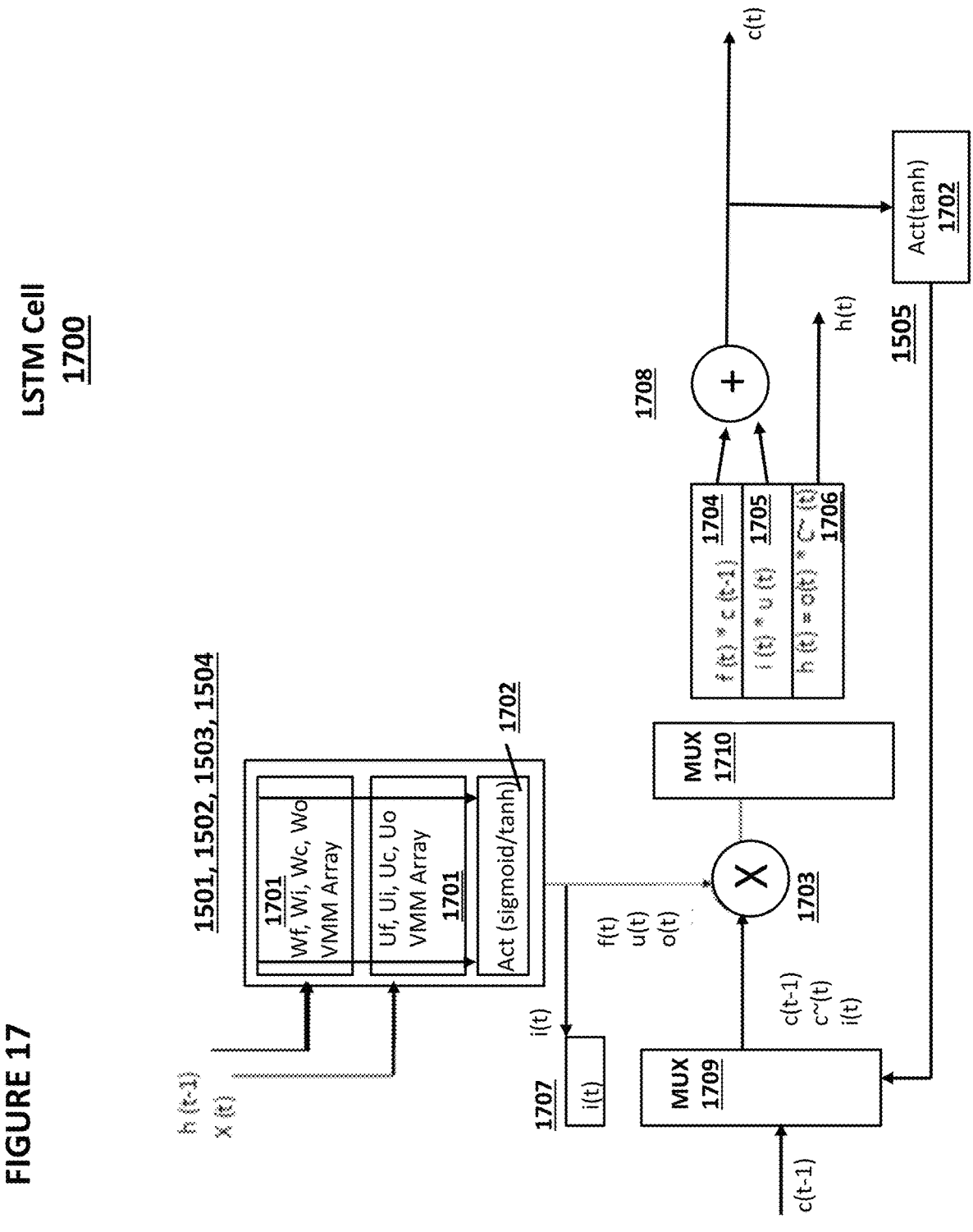
FIG. 17 depicts another embodiment of the exemplary cell of FIG. 15.
Figure 18:
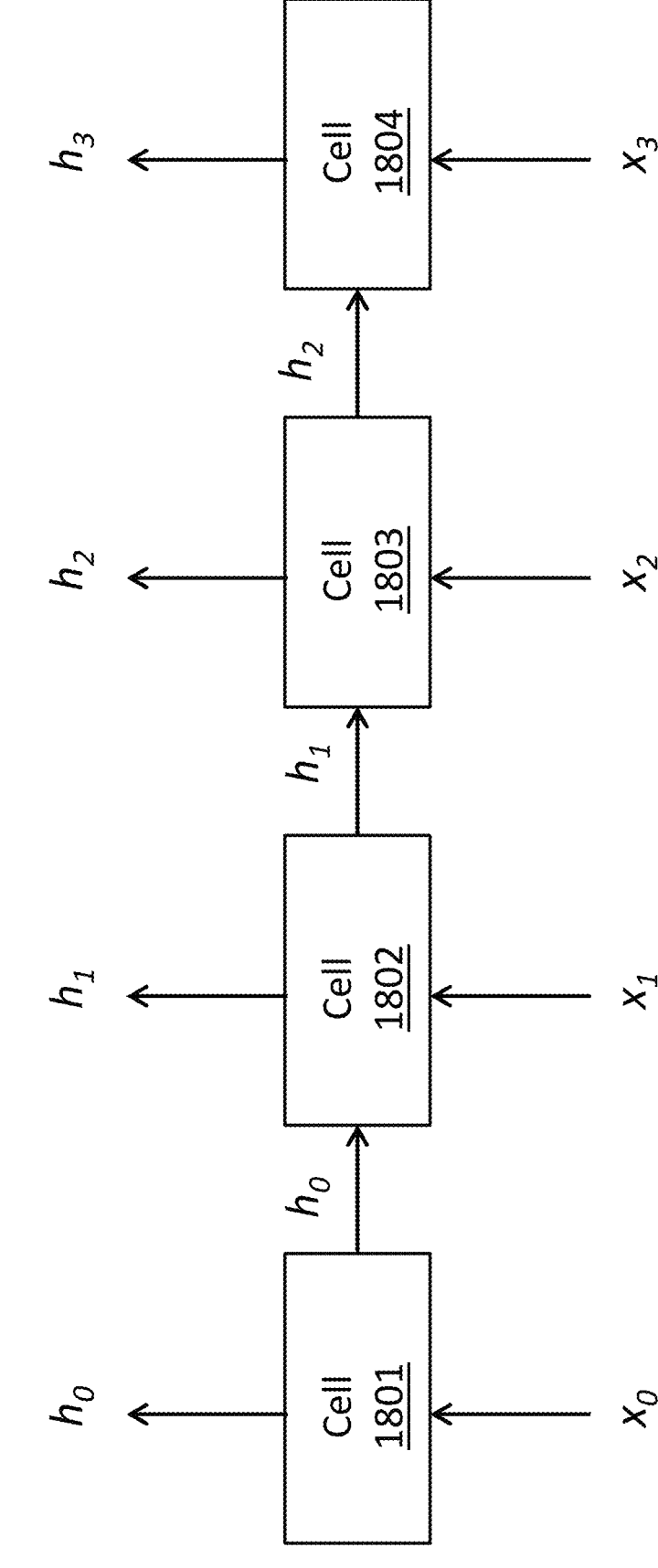
FIG. 18 depicts a prior art gated recurrent unit system.
Figure 19:
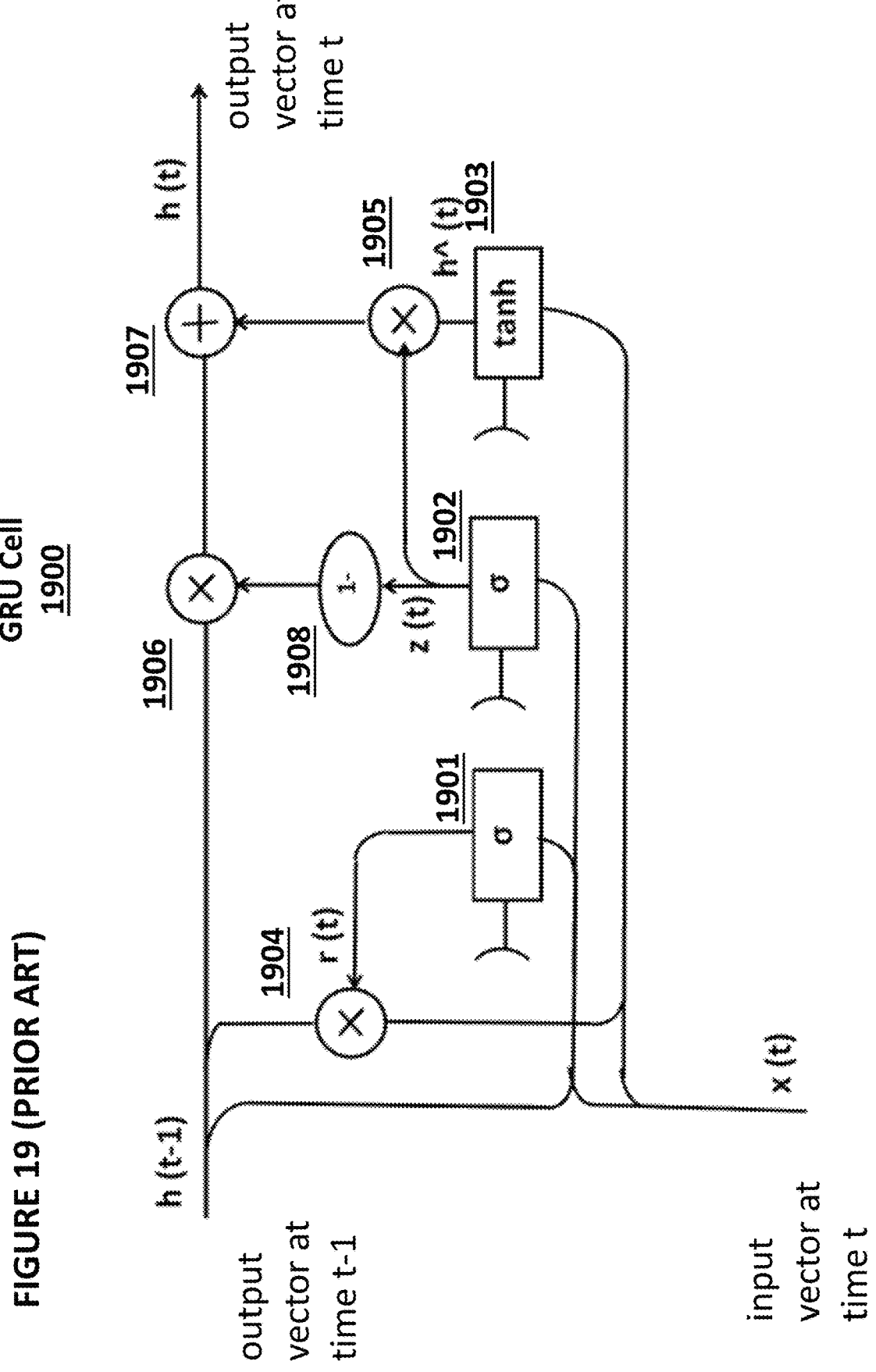
FIG. 19 depicts an exemplary cell for use in a gated recurrent unit system.
Figure 20:
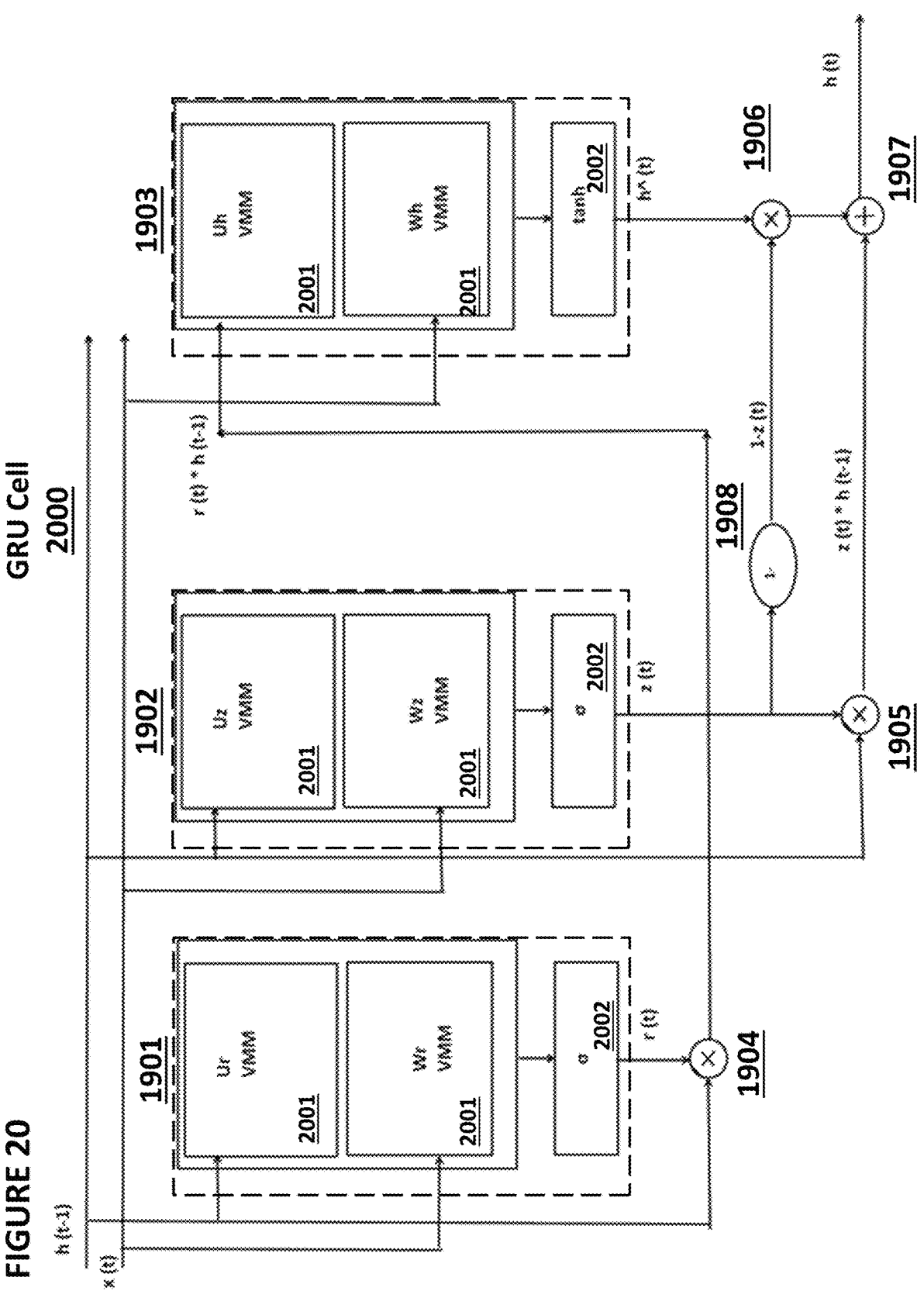
FIG. 20 depicts an embodiment of the exemplary cell of FIG. 19.
Figure 21:
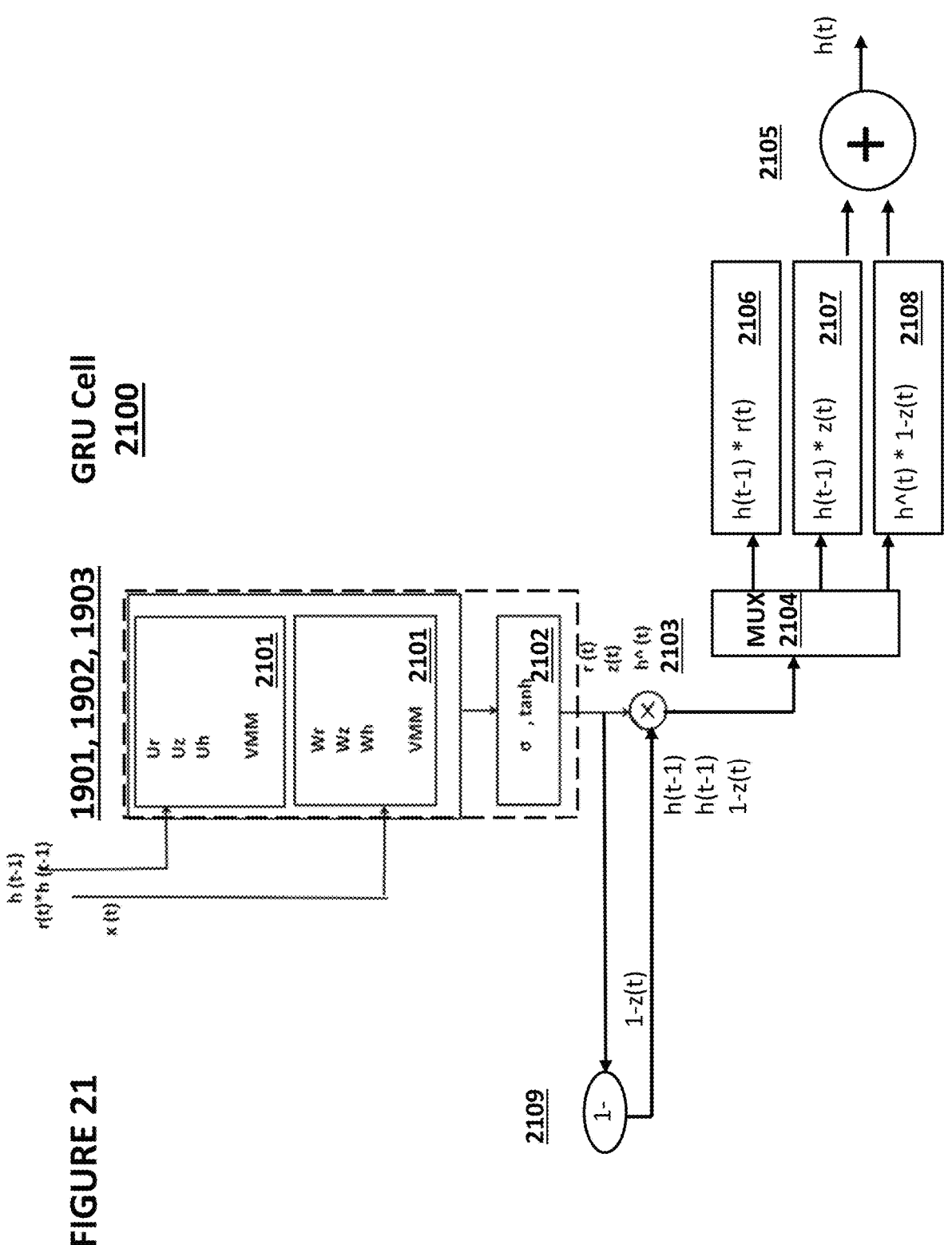
FIG. 21 depicts another embodiment of the exemplary cell of FIG. 19.
Figure 22:
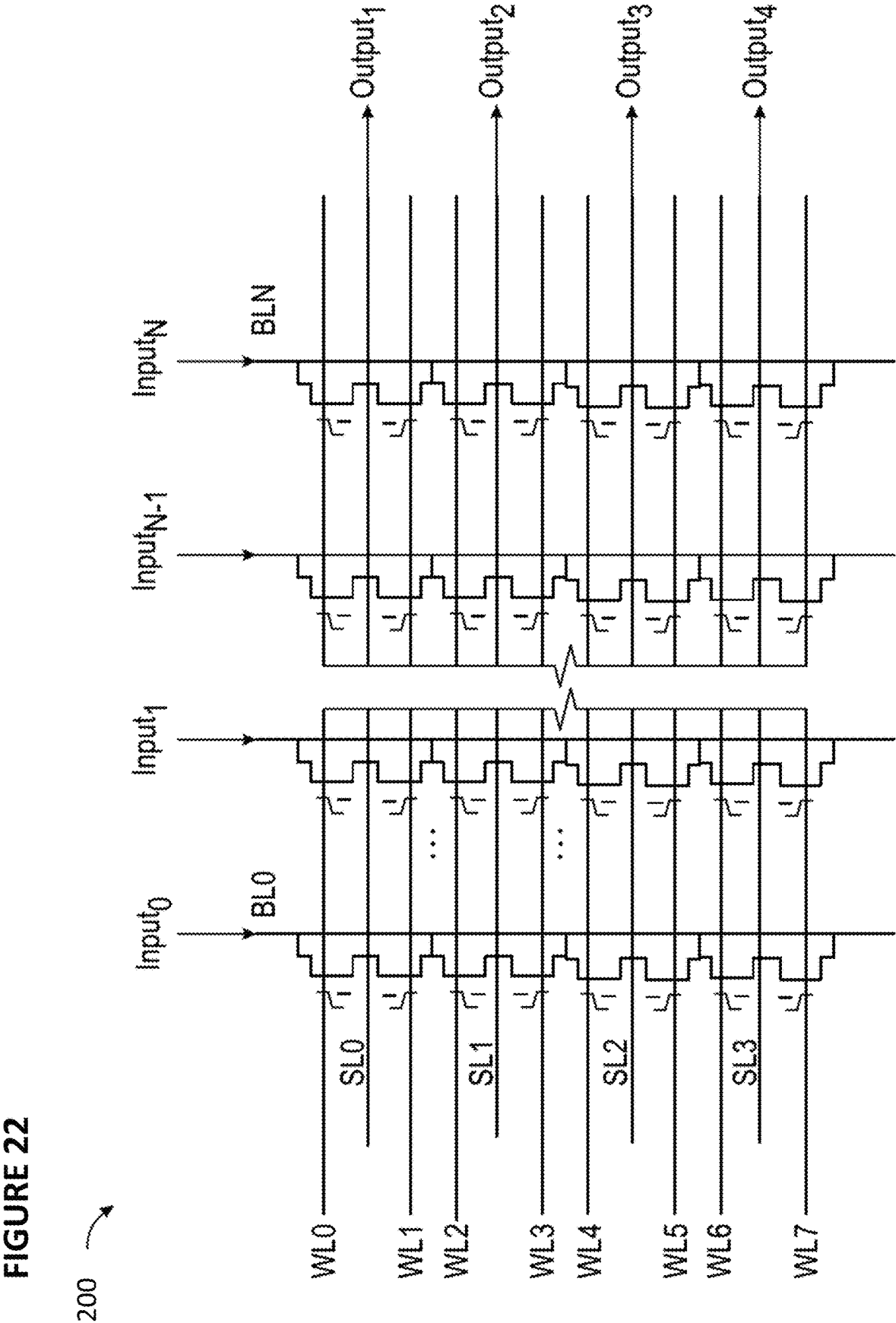
FIG. 22 depicts another embodiment of a vector-by-matrix multiplication system.
Figure 25:
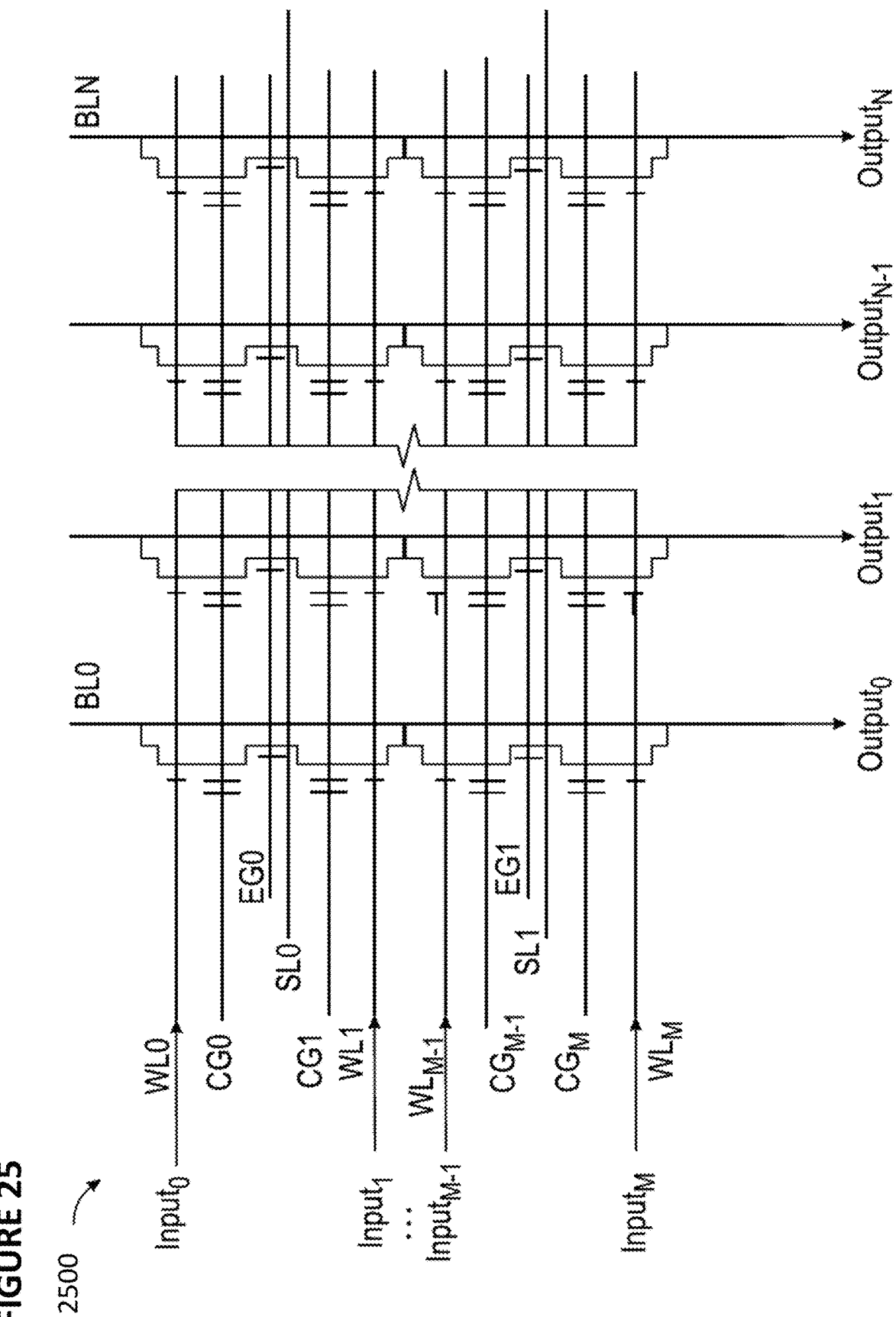
FIG. 25 depicts another embodiment of a vector-by-matrix multiplication system.
Figure 26:
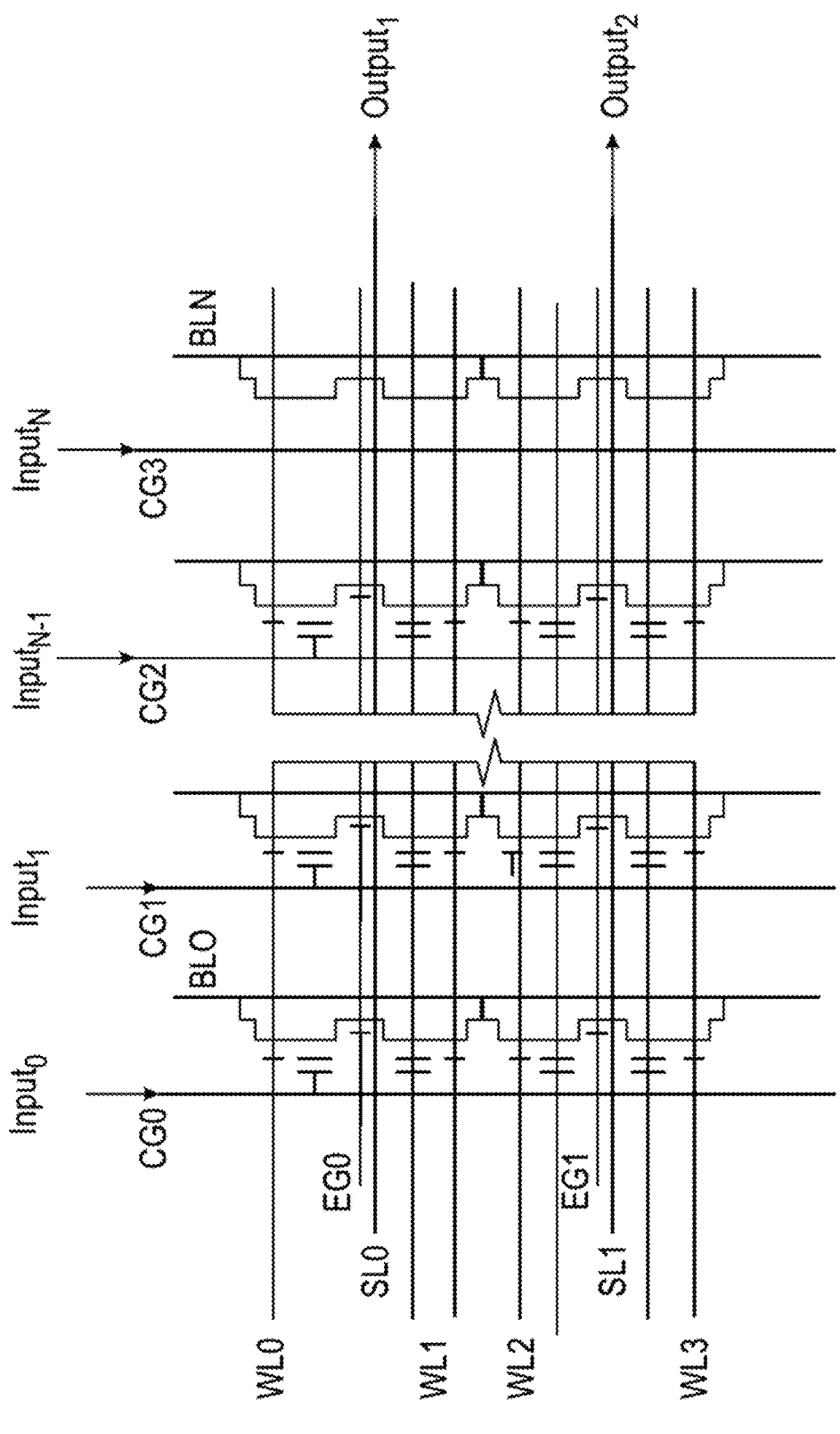
FIG. 26 depicts another embodiment of a vector-by-matrix multiplication system.
Figure 27:
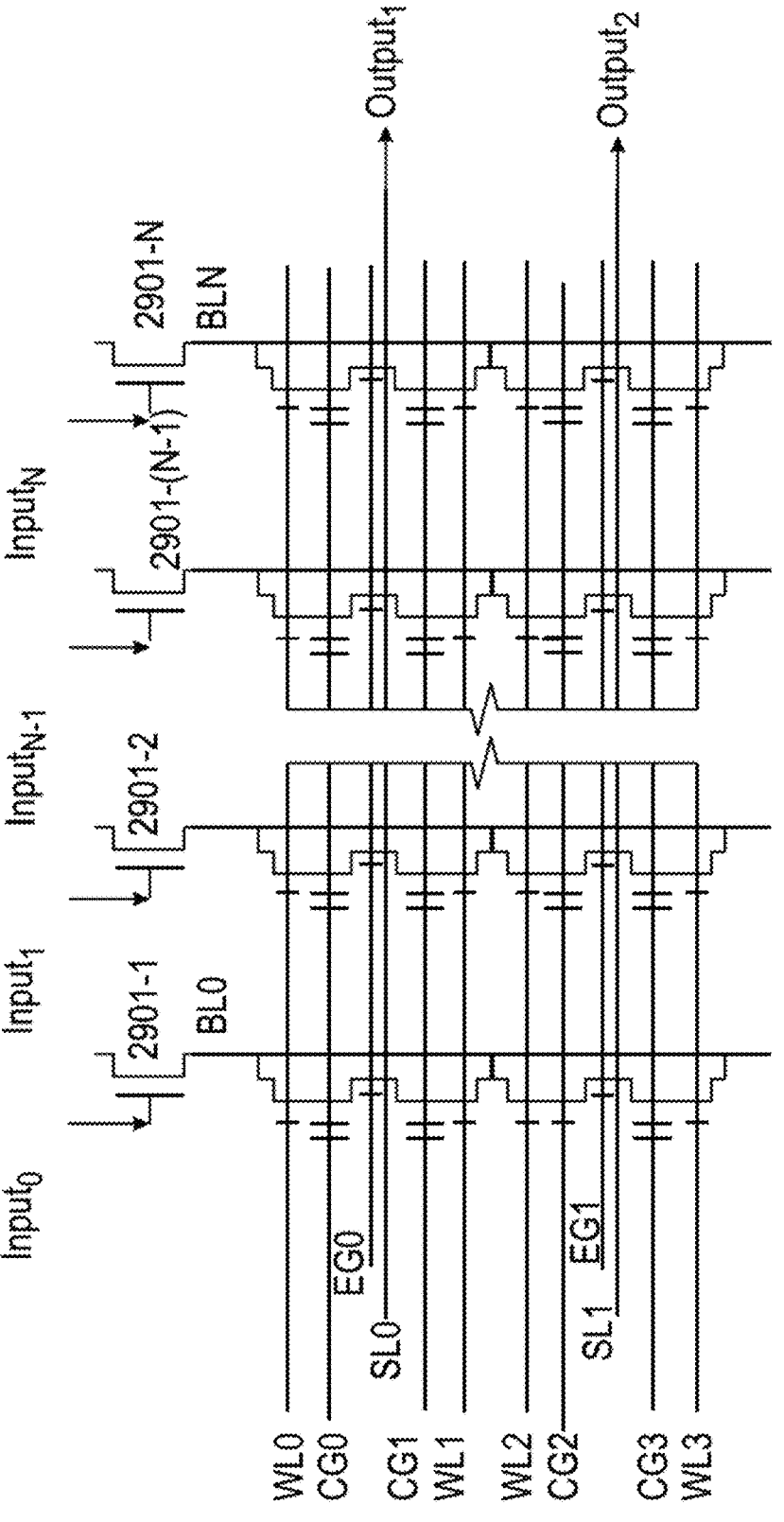
FIG. 27 depicts another embodiment of a vector-by-matrix multiplication system.
Figure 28:
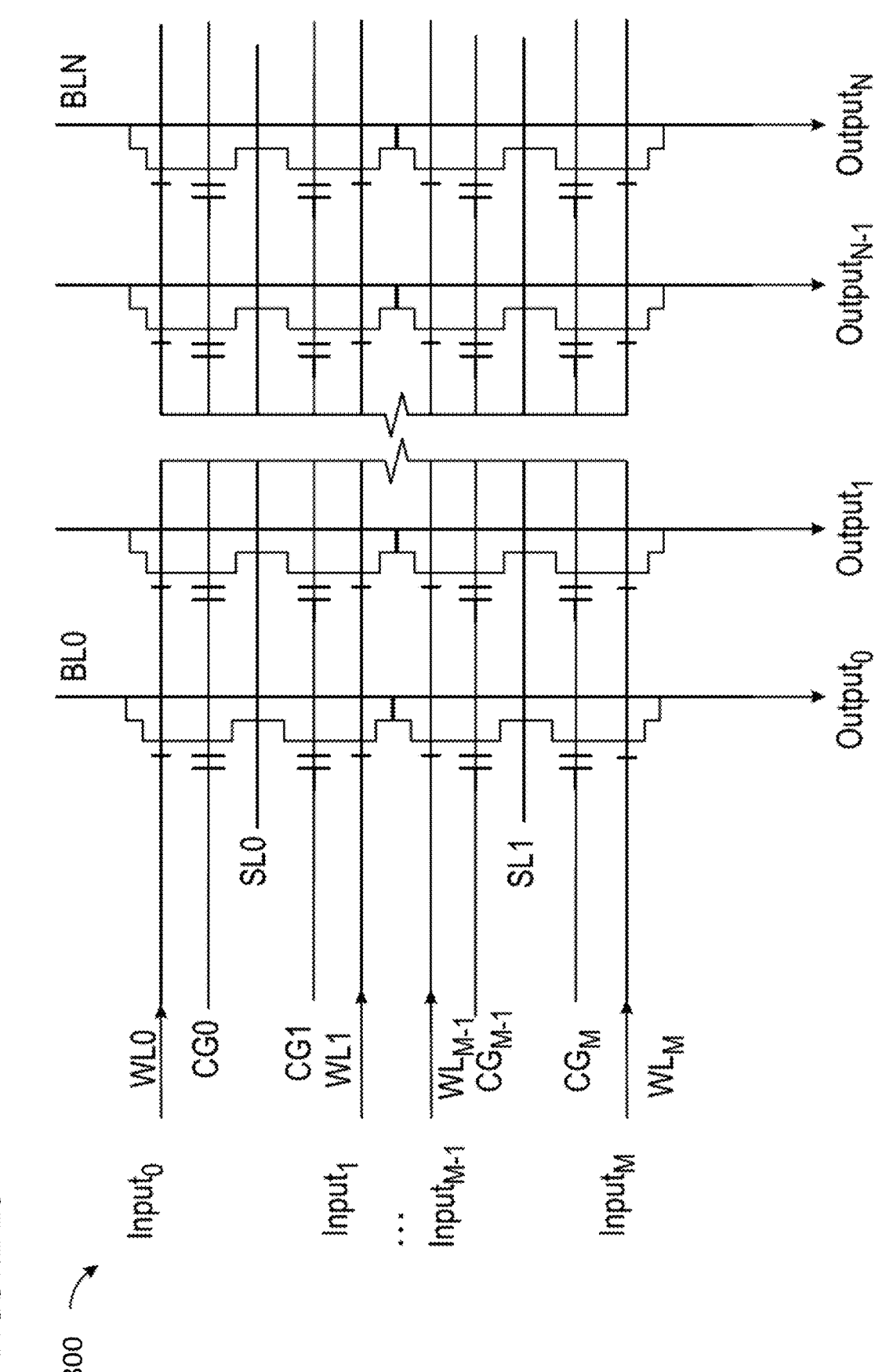
FIG. 28 depicts another embodiment of a vector-by-matrix multiplication system.
Figure 29:
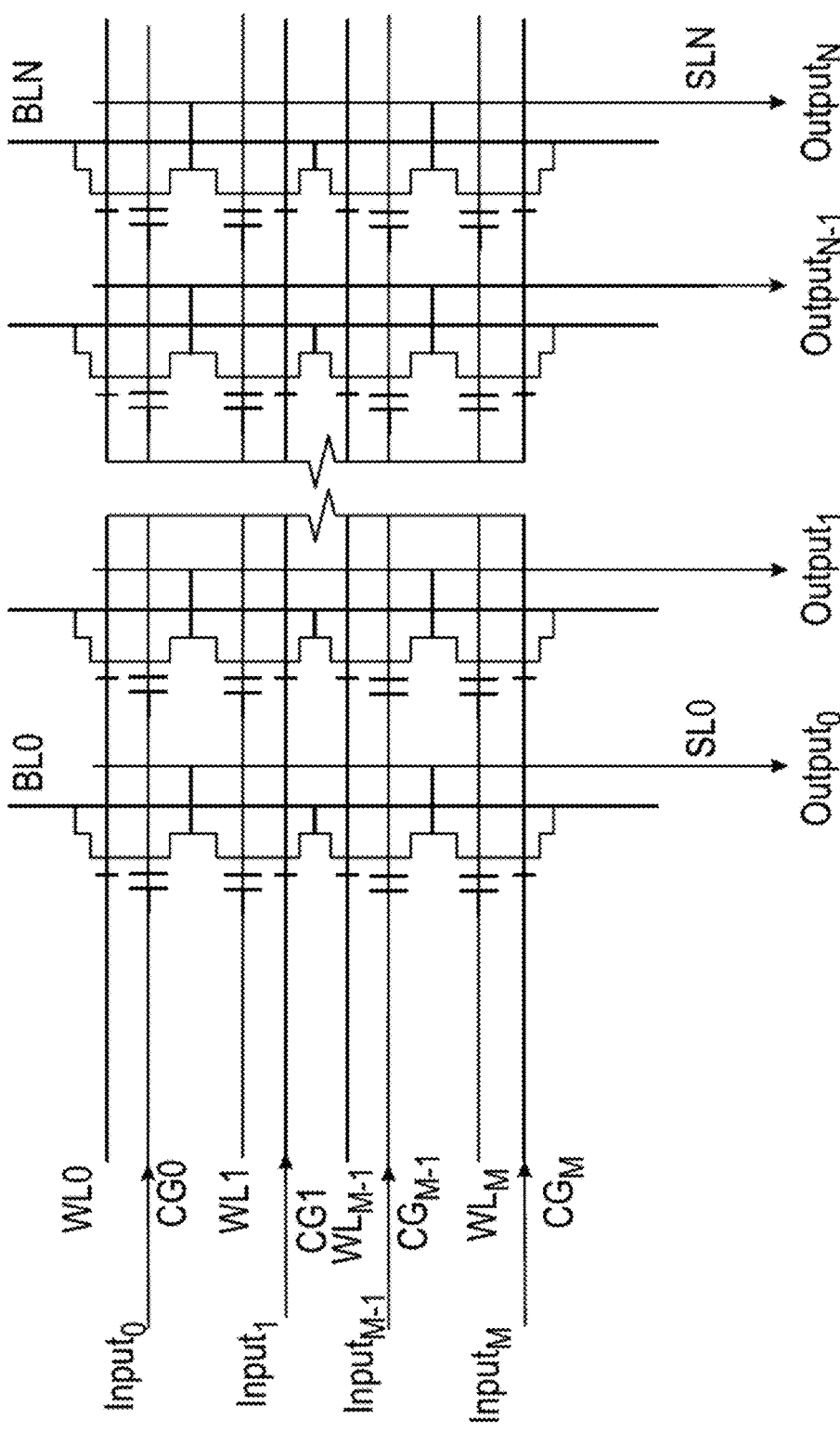
FIG. 29 depicts another embodiment of a vector-by-matrix multiplication system.
Figure 30:
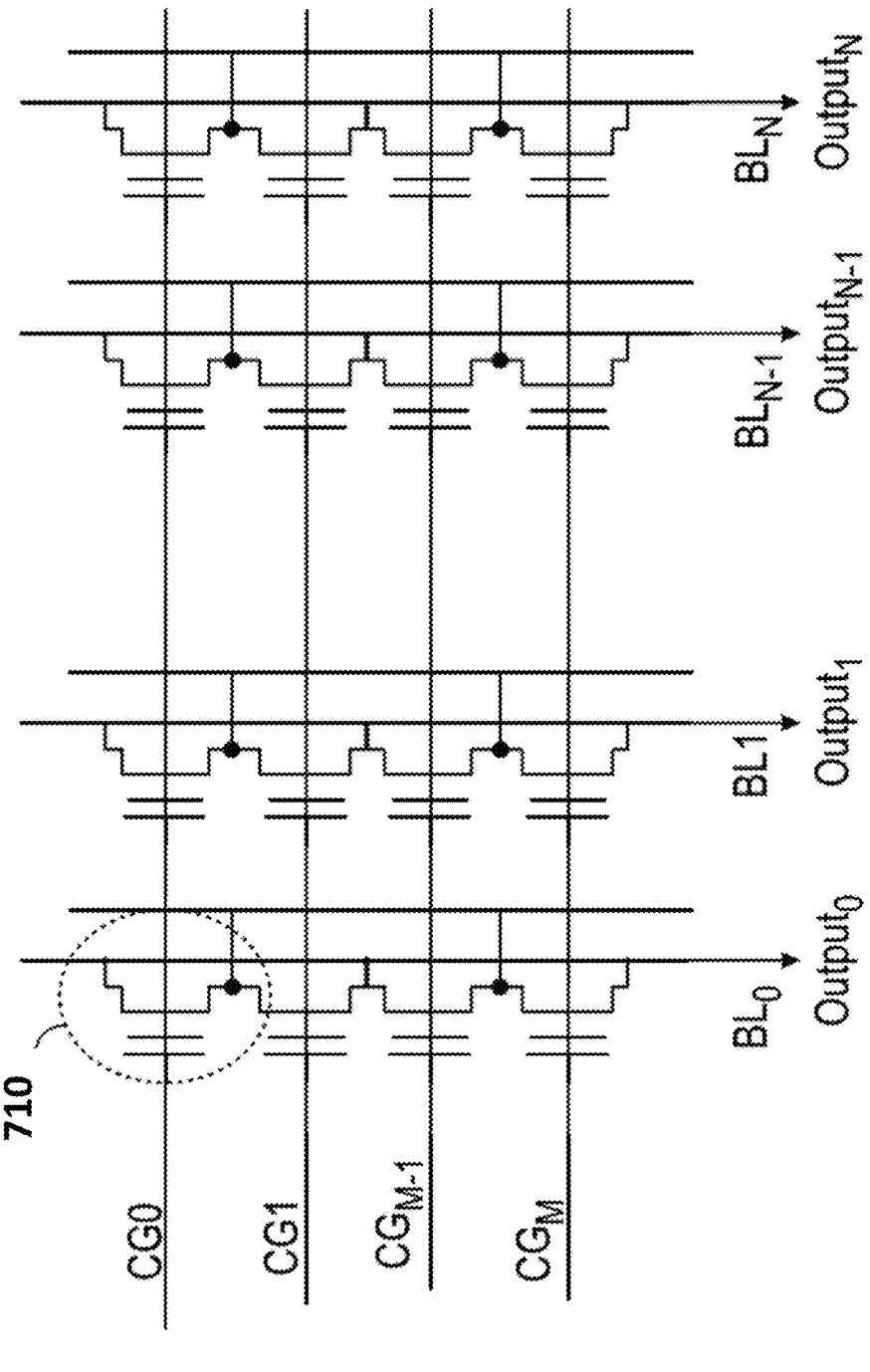
FIG. 30 depicts another embodiment of a vector-by-matrix multiplication system.
Figure 31:
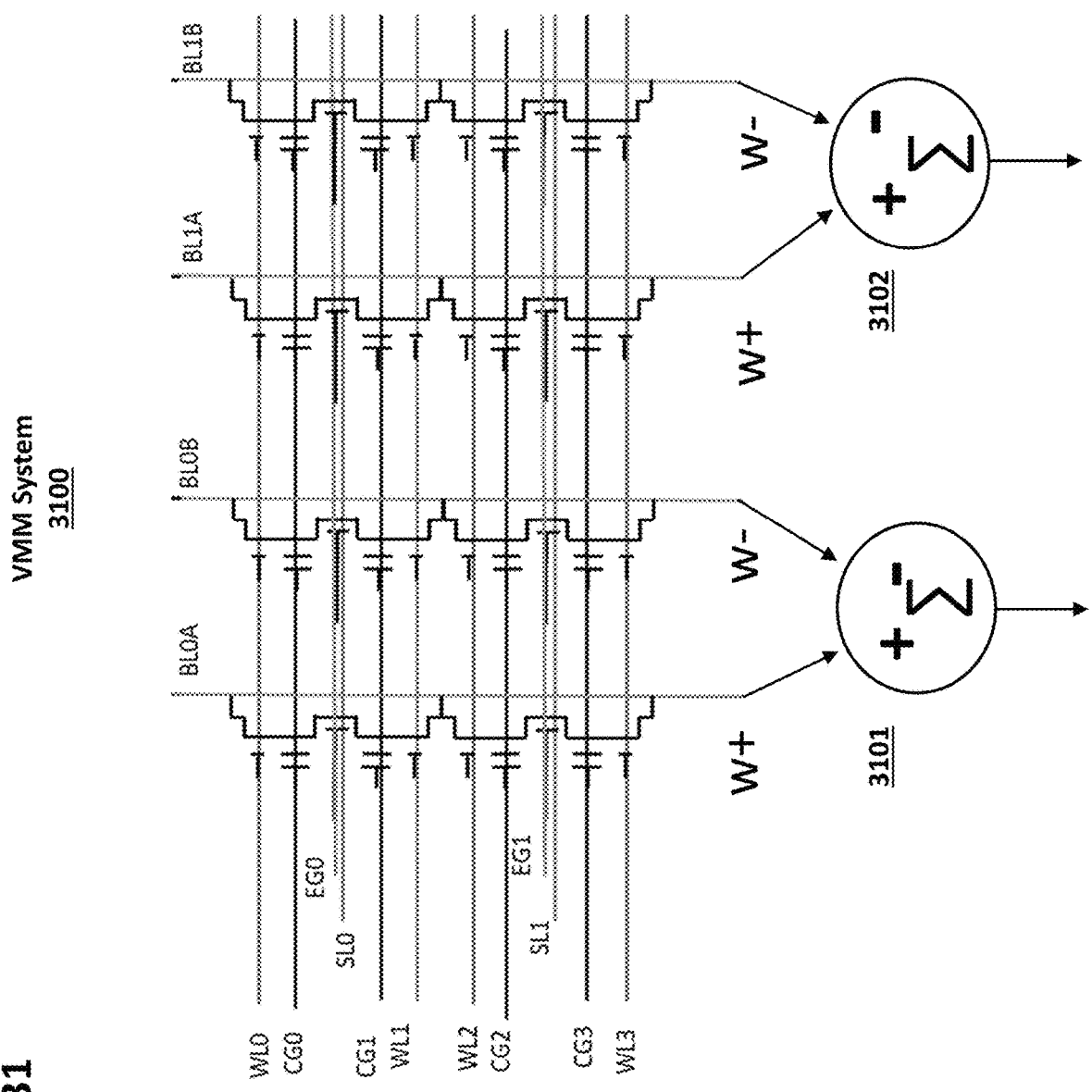
FIG. 31 depicts another embodiment of a vector-by-matrix multiplication system.
Figure 32:
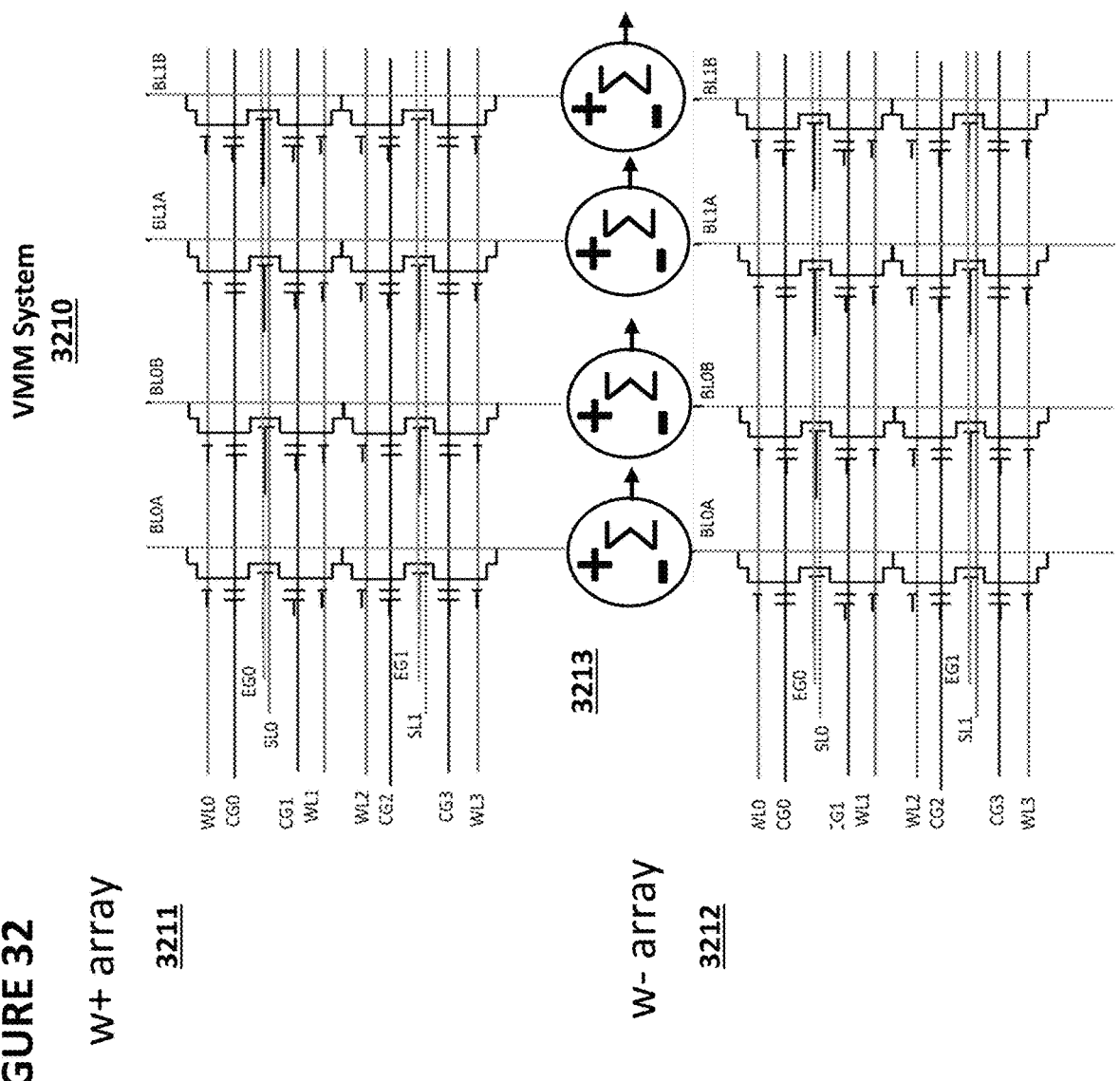
FIG. 32 depicts another embodiment of a vector-by-matrix multiplication system.
Figure 33:
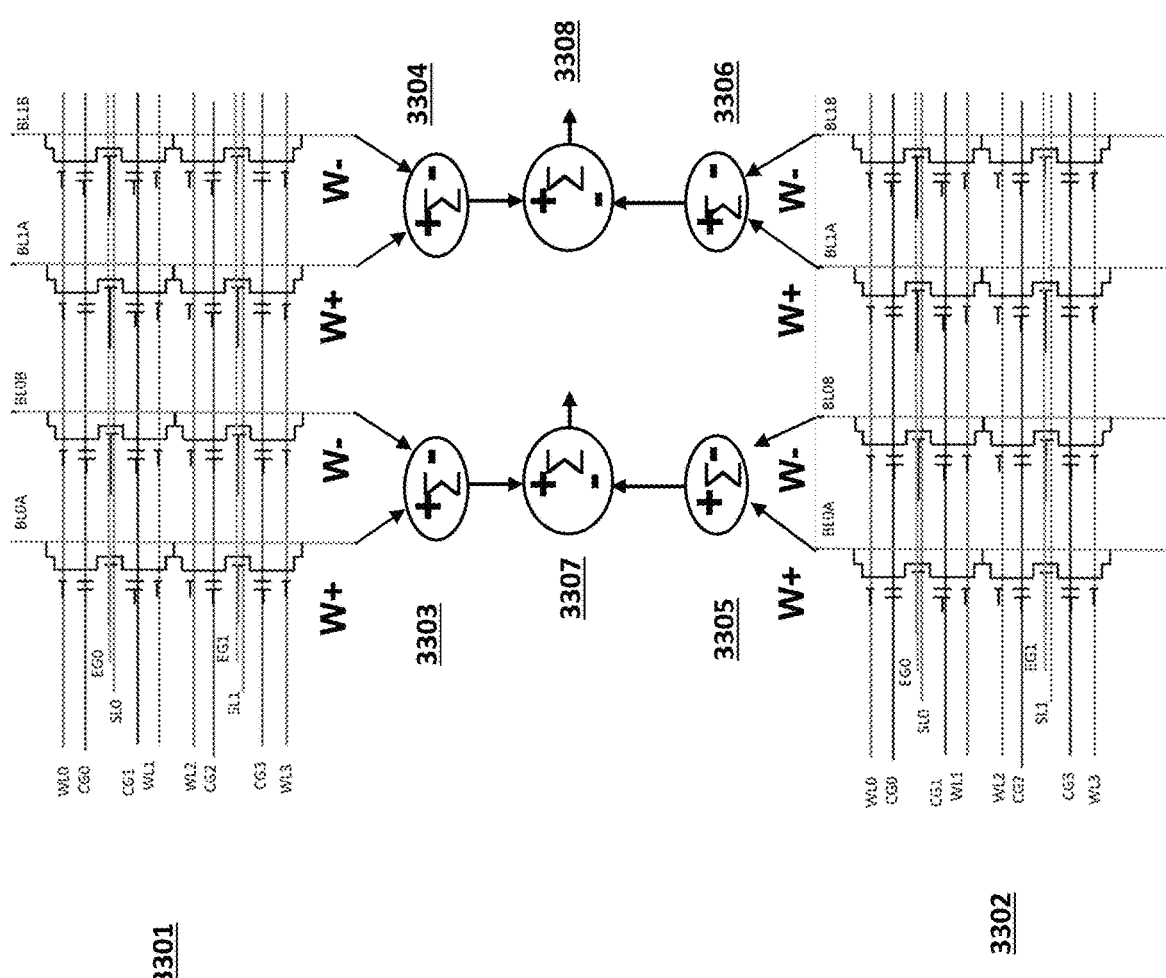
FIG. 33 depicts another embodiment of a vector-by-matrix multiplication system.
Figure 34:
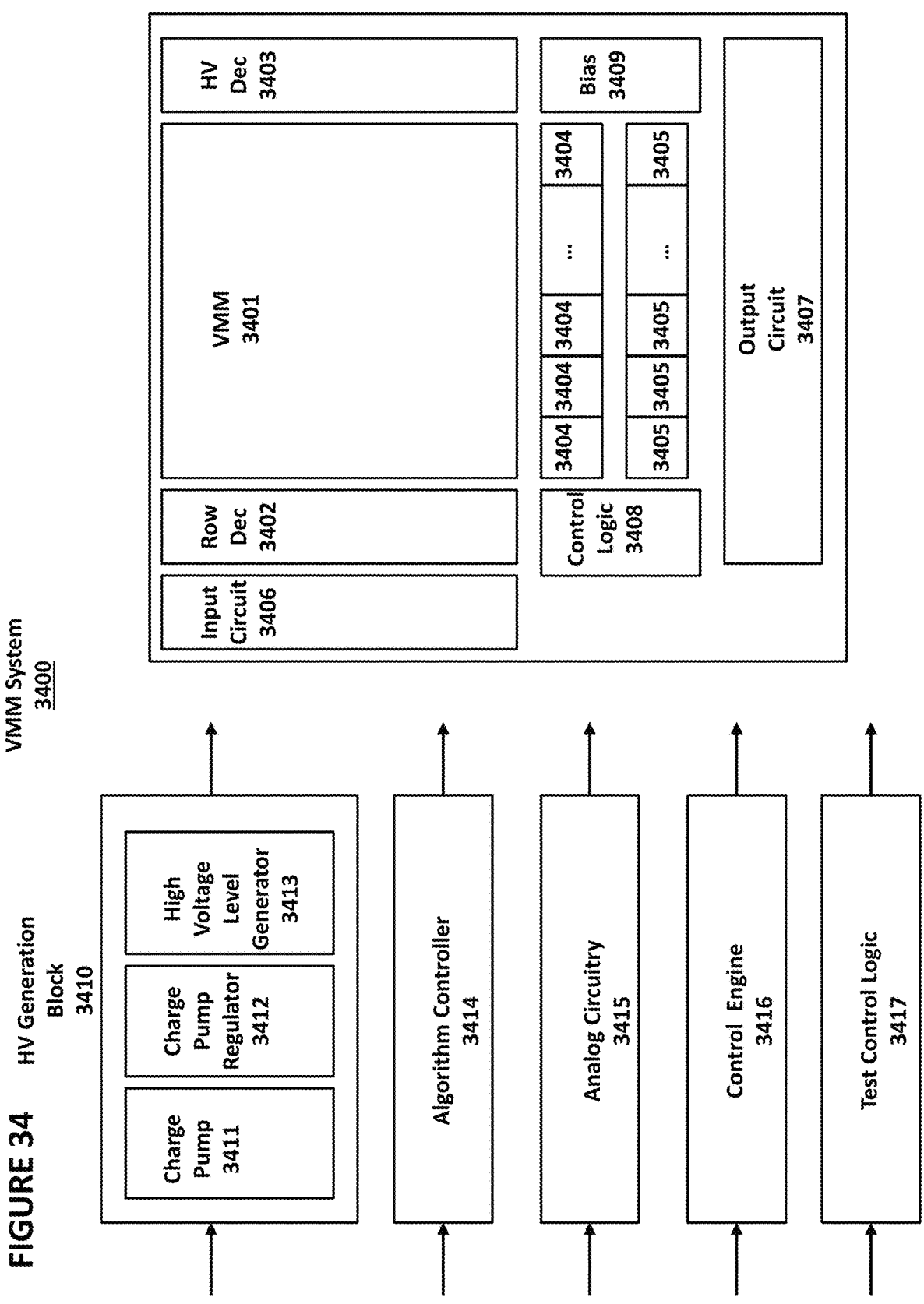
FIG. 34 depicts another embodiment of a vector-by-matrix multiplication system.

FIG. 34 depicts a block diagram of VMM system 3400. VMM system 3400 comprises VMM array 3401, row decoder 3402, high voltage decoder 3403, column decoder 3404, bit line drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage analog precision level generator 3413. VMM system 3400 further comprises (program/erase, or weight tuning) algorithm controller 3414, analog circuitry 3415, control engine 3416 (that may include special functions such as arithmetic functions, activation functions, embedded microcontroller logic, without limitation), and test control logic 3417. The systems and methods described below can be implemented in VMM system 3400.

The input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement normalization, linear or non-linear up/down scaling functions, or arithmetic functions. The input circuit 3406 may implement a temperature compensation function for input levels. The input circuit 3406 may implement an activation function such as ReLU or sigmoid. The output circuit 3407 may include circuits such as a ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. The output circuit 3407 may implement an activation function such as rectified linear activation function (ReLU) or sigmoid. The output circuit 3407 may implement statistic normalization, regularization, up/down scaling/gain functions, statistical rounding, or arithmetic functions (e.g., add, subtract, divide, multiply, shift, log) for neuron outputs. The output circuit 3407 may implement a temperature compensation function for neuron outputs or array outputs (such as bitline output) so as to keep power consumption of the array approximately constant or to improve precision of the array (neuron) outputs such as by keeping the IV slope approximately the same.

As discussed above, a neural network may comprise many different layers, and within each layer, many calculations will be performed involving stored weight values in one or more arrays within that layer. Some layers will be used more than other layers, and it can be appreciated that such layers are more important to the overall accuracy of the neural network based on their high frequency of use.

Figure 35:
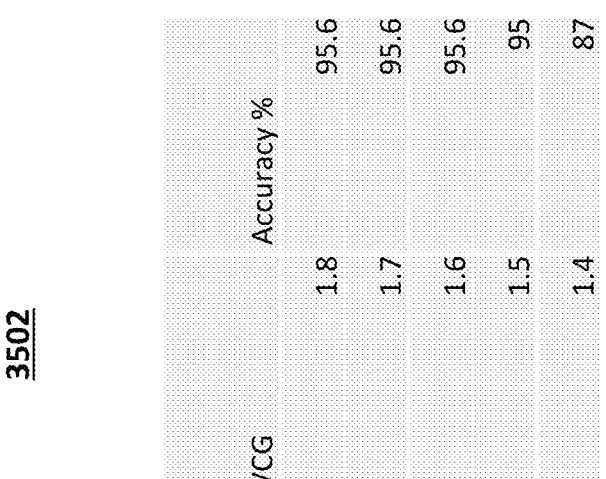
FIG. 35 depicts performance data from a neural network.
Figure 35:
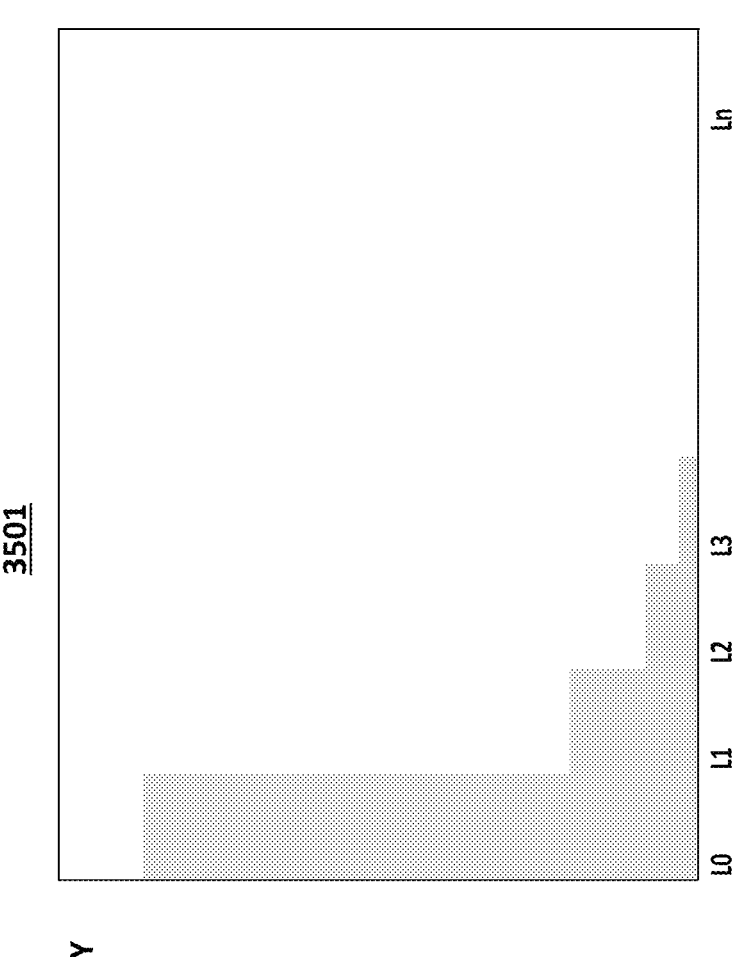

FIG. 35 depicts graph 3501 reflecting data collected by the inventors regarding frequency of use of weights within an MLP (multi-layer perceptron) neural network for an MNIST (Modified National Institute of Standards and Technology) digit classification. In the example shown, there are n levels, where each L (L0, . . . , Ln) represents a range of weights. As can be seen, the lower weights are used much more frequently than the other weight ranges. For this graph, as an example Ln, does not contribute significantly to the overall network performance. Hence, Ln could be set to a 0 value such as by reducing the control gate voltage applied to the array in level Ln, which would result in lower power consumption due to the lower cell current drawn at the lower control gate voltage, without significantly affection accuracy.

A neural network comprises multiple layers. Each layer can have a weight distribution that is specific to that layer. Hence, a different technique may be needed for each layer to improve, overall network performance. For example, Ln might contribute only a small amount in a first layer but might contribute a significant among in a second layer.

The present examples provide for methods of improving operation of a neural network. While the term optimization may be utilized, it is to be understood that the method does not necessarily guarantee absolute optimization, i.e. fully perfect, functional, or effective as possible, but instead the term optimization as used herein is simply meant as an improvement over prior art methods.

FIG. 35 also depicts table 3502, which indicates the accuracy of read operations based on changes to the voltage, VCG, applied to the control gate of memory cells during a read operation. As can be seen, dropping VCG from 1.8V to 1.6V has no impact on accuracy, and dropping VCG from 1.5V to 1.4V has a small impact on accuracy. As the VCG (or VEG) is lowered, the cell current is lowered exponentially based on the sub-threshold equation. This indicates that in some cases, power might be saved by dropping the voltage applied to a terminal of a memory cell without sacrificing accuracy or while sacrificing accuracy to an acceptable degree. Similarly, in the linear region, a lower input row voltage results in lower current. One can further appreciate that changes in operating temperature can impact both accuracy and power consumption, and similarly, VCG and/or EG modulation (i.e., an increase or decrease in magnitude) can be used to obtain improved power and/or accuracy as temperature changes.

Based on this discussion of FIG. 35, it can be appreciated that one can determine and apply different bias voltages for one or more terminals of a memory cell (such as CG, EG, WL, etc.) to improve power consumption (perhaps at the expense of accuracy, for example by lowering the VCG used), to improve accuracy during static temperature conditions (perhaps at the expense of power consumption, for example, by increasing the VCG used), or to improve or maintain accuracy during changing temperature conditions (perhaps at the expense of power consumption, for example, by increasing the VCG as temperature changes). Other performance characteristics could be maximized instead of accuracy and power consumption.

With these concepts in mind, various methods will now be described.

Figure 36:
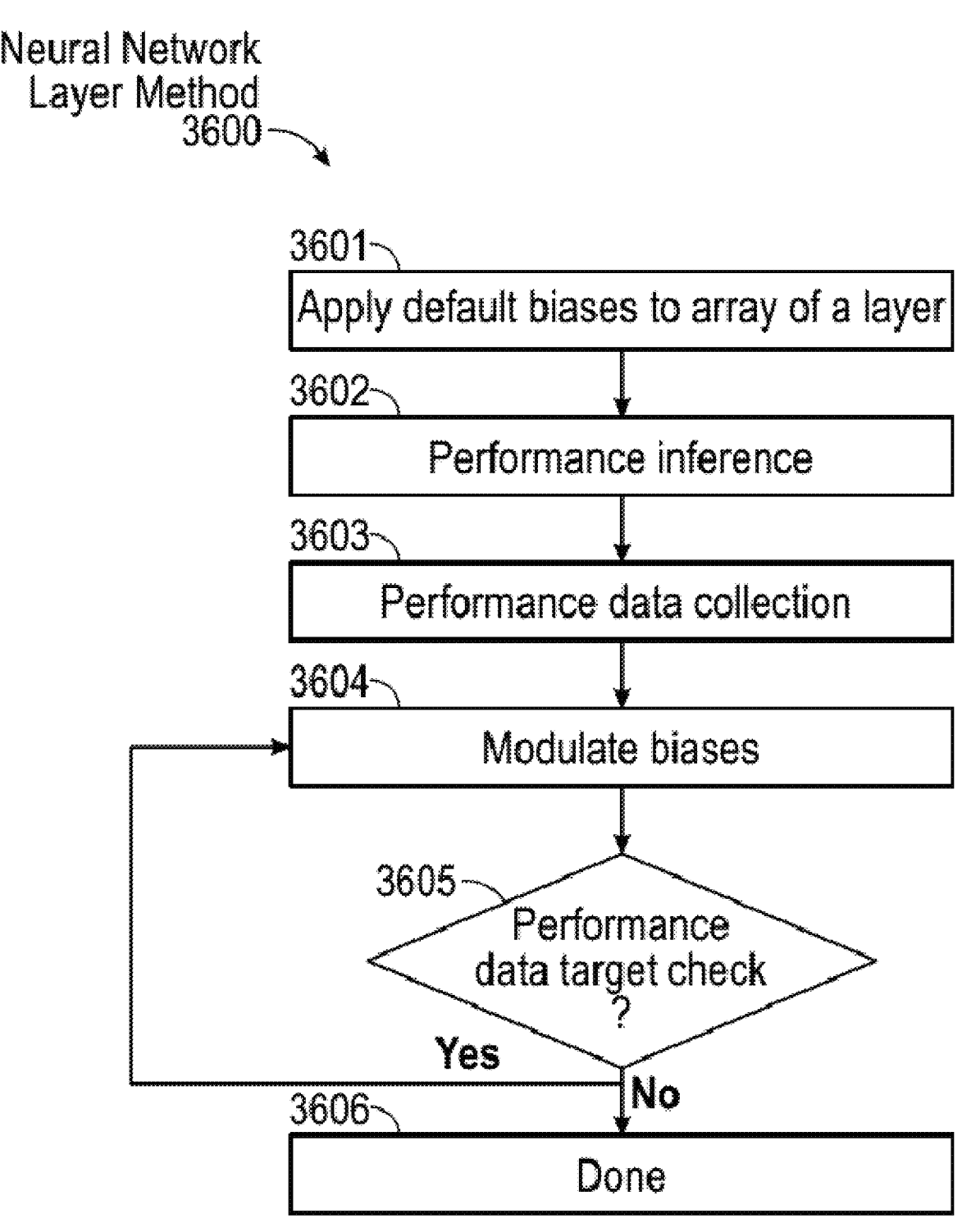
FIG. 36 depicts a neural network method.

FIG. 36 depicts neural network layer method 3600 performed on a particular layer within a neural network. For example, this method might be performed on a layer (or more than one layer) that is deemed more important due to its significant effect on overall network accuracy.

In step 3601, default voltage biases are applied to terminals (e.g., the control gate terminals) of cells in an array of a layer during a read operation. The default voltage biases typically are the same as the bias values used during verify operations when a programmed weight is verified.

In step 3602, performance inference is conducted.

In step 3603, baseline data is collected as to the performance (e.g., accuracy) of the network when default biases are applied to the array. This data is, for example, data indicating the accuracy of an MNIST inference operation. This baseline data will serve as a reference point for performance target checks in step 3605.

In step 3604, the biases are modulated (e.g., increased or decreased by a certain increment) and then applied to terminals (e.g., the control gate terminals) of cells in the layer of the array.

In step 3605, a performance target check is performed. If the performance data result is within a target range compared to the performance data collection performed in step 3603, then the method proceeds to step 3604 until the performance target is not met, at which point the method proceeds to completion in step 3606 and the method stores the previous bias condition, which was the last set of biases that resulted in performance data within the target range.

In step 3606, the previous set of biases are deemed good and are stored for future use (such as in a lookup table) in conjunction with that layer. Optionally, the current operating temperature can be stored along with the bias levels.

Figure 37:
FIG. 37 depicts a neural network array.

FIG. 37 depicts neural network array 3700. Neural network array 3700 comprises arrays 3701-0, . . . , 3701-*n*, where n+1 is the number of arrays in neural network 3700. Neural network 3700 also comprises temperature sensor 3703-*i*, where i is the number of sensors, which senses the operating temperature within a specific location in neural network 3700. Optionally, each array 3701-0, . . . , 3701-*n* contains its own temperature sensor 3703 (such that i=n+1), such that each temperature sensor 3703 is associated with one of the arrays 3701-0, . . . 3701-*n* and the memory cells contained in such array. Temperature to voltage bias lookup table (LUT) 3704-*i*, where i is the number of voltage bias lookup tables, is consulted, and based on the sensed temperature, a bias voltage(s) for one or more terminals (e.g., the control gate terminal or the erase gate terminal, without limitation) is obtained. Those bias voltages, termed temperature biases 3702, are then applied to each cell in the particular array in question. Thus, temperature biases 3702-0 are applied to array 3701-0, and so on. Each array 3701-0, . . . , 3701-*n* forms one or more neurons in the neural network.

Figure 38:
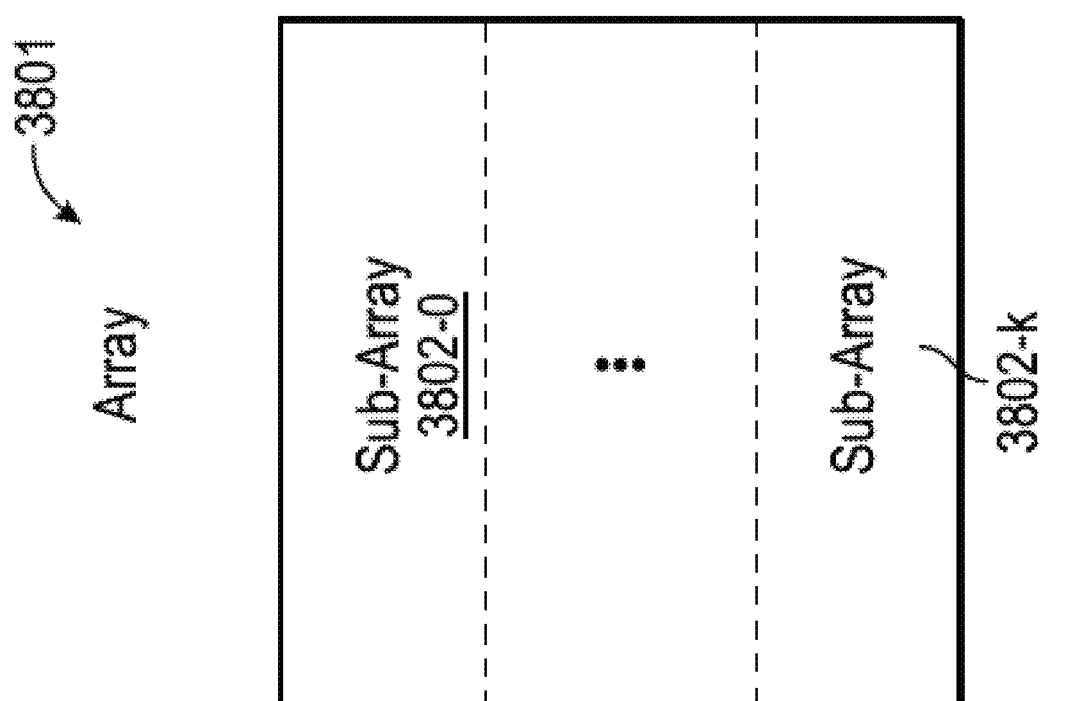
FIG. 38 depicts an array.
Figure 38:
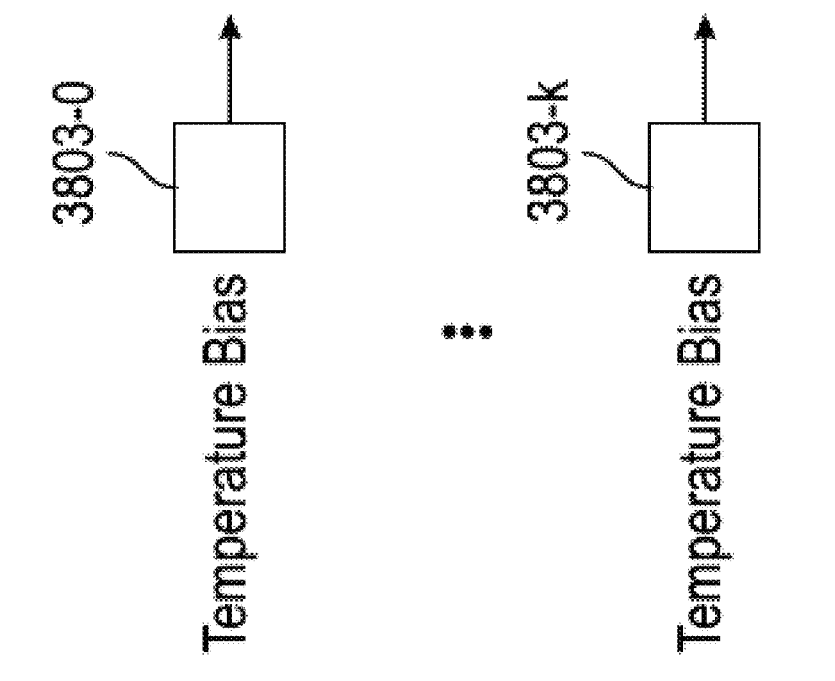

FIG. 38 depicts array 3801. Array 3801 can be used, for example, for any of arrays 3701-0, . . . 3701-*n* in FIG. 37. In this embodiment, different bias voltages (e.g., VCG) can be used for different sub-arrays 3802-0, . . . , 3802-*k* that are contained within the same array 3801, i.e., array 3801 is partitioned into multiple sub-arrays. For example, each sub-array 3802-0, . . . 3802-*k* can receive its own temperature bias 3803-0, . . . 3803-*k*, respectively. In addition to allowing for compensation based on the specific operating temperatures measured at different locations within array 3801, this embodiment also would be suitable for a situation where different types of weights are stored in each sub-array 3802. For example, sub-array 3802-0 might store weights in the range 0-30 nA, array 3801-1 might store weights in the range 30-60 nA, and so forth, since each current range may need different temperature biases.

This embodiment also would be suitable for a situation where the memory cells in different arrays operate in different modes (regions). For example, the cells in sub-array 3802-0 might operate in the sub-threshold mode whereas the cells in sub-array 3802-*n* might operate in the linear mode, since different modes (regions) may need different temperature biases.

Figure 39:
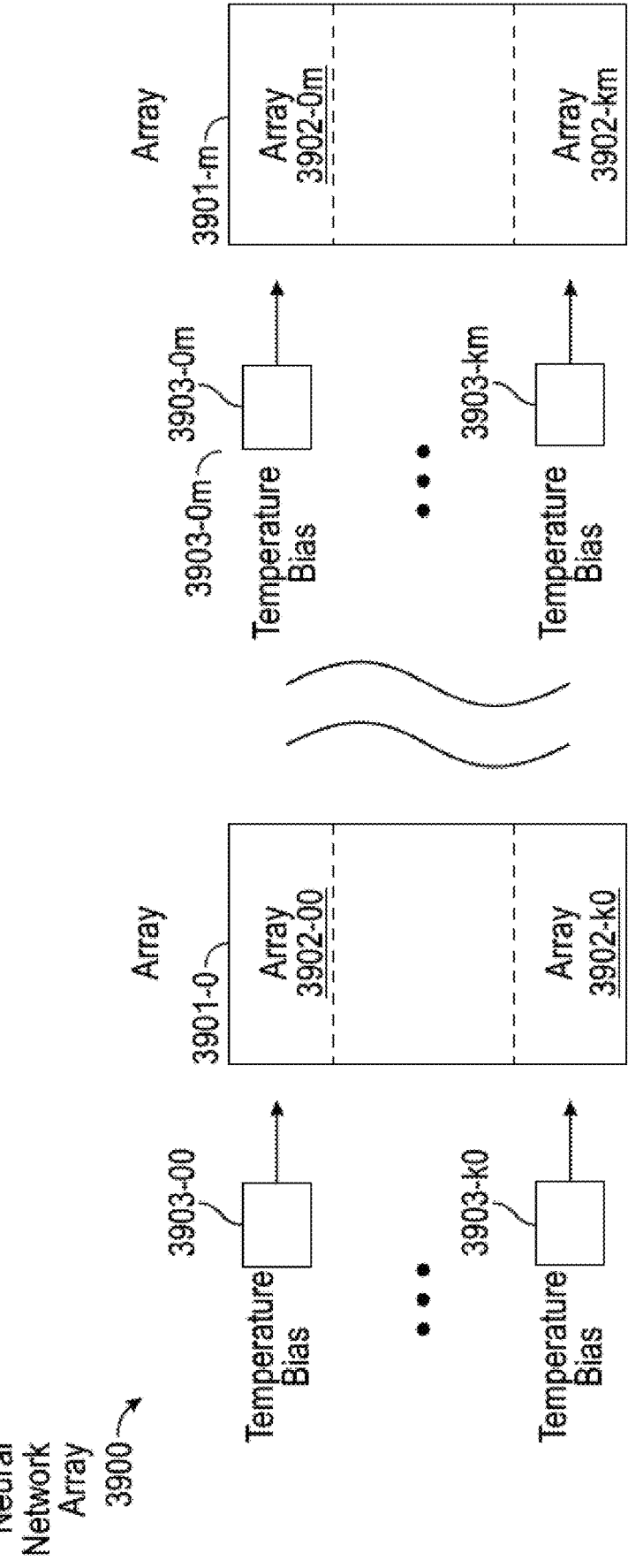
FIG. 39 depicts a neural network array.

FIG. 39 depicts neural network array 3900. In this embodiment, the teachings as to FIG. 38 are extended to m+1 arrays 3901-0, . . . 3901-*m* in neural network array 3900. Each array 3901 is divided into k+1 arrays 3902-0*a*, . . . 3902-*ka* (where a is the array number ranging from 0 to m). Each array 3902 receives its own temperature bias 3903-0*a*, . . . 3903-*ka*, respectively. It is to be further understood that each array 3901 could be divided into different numbers of arrays and need not be divided into the same number of arrays as other arrays 3901.

Figure 40A:
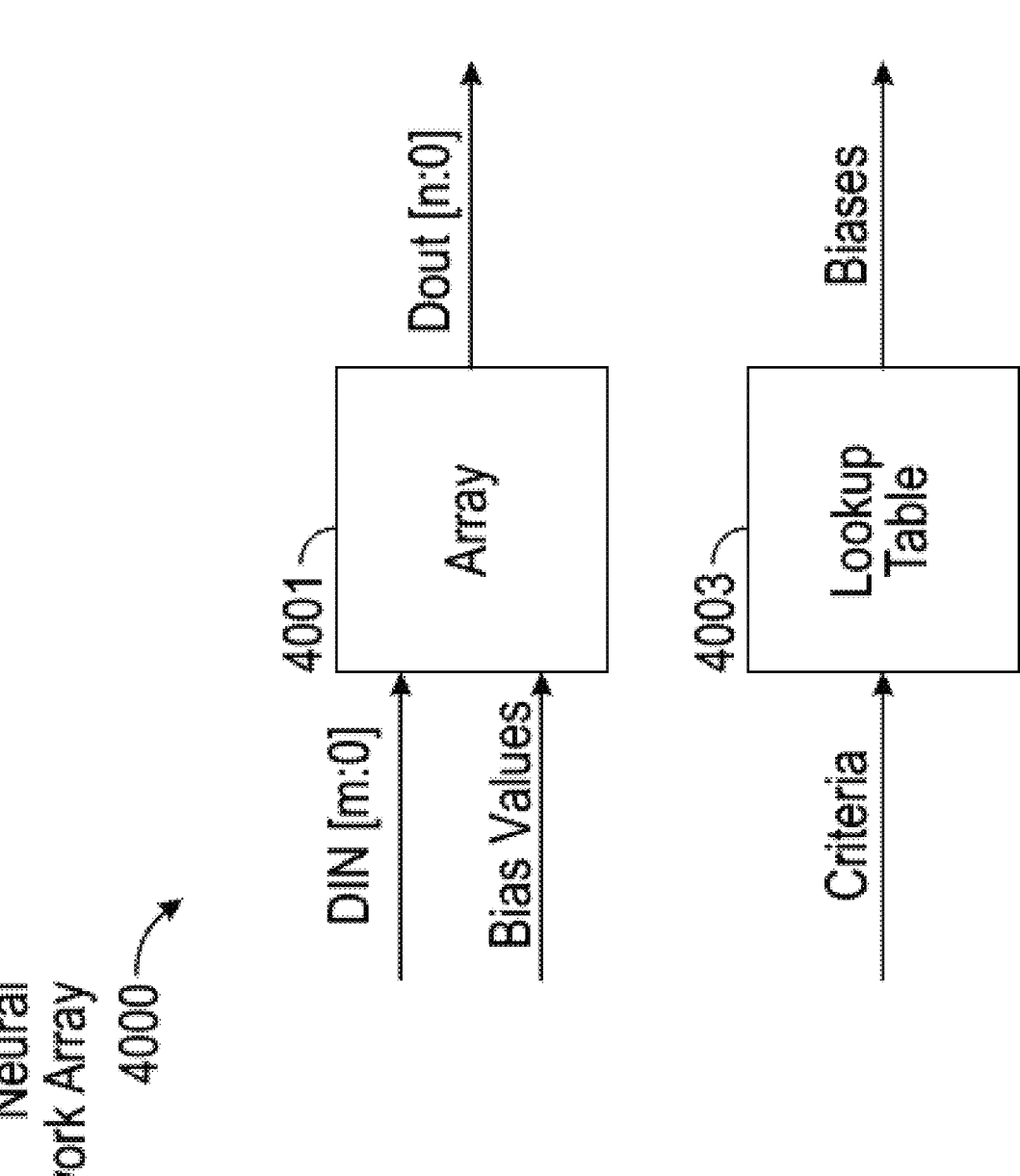
FIG. 40A depicts a method.

FIG. 40A depicts neural network array 4000. In a typical neural network read (inference) operation within a single layer, a digital input value DIN [m:0] is applied to array 4001, which results in a digital output DOUT [n:0] (or alternatively, an analog value). Array 4001 can be an array or a portion of an array.

In neural network 4000, criteria are used to find one or more values in lookup table 4003. The criteria might include, for example, the desired input and output values, current operating temperature values, and whether it is desired to target for lowest power consumption, a target performance (e.g., accuracy or latency) or performance at a certain temperature. Lookup table 4003 will then provide biases based on those criteria. Thereafter, the biases are applied to array 4001 during the read operation, which consummates method 4000. Array 4001 can comprise non-volatile memory cells or volatile memory cells.

Figure 40B:
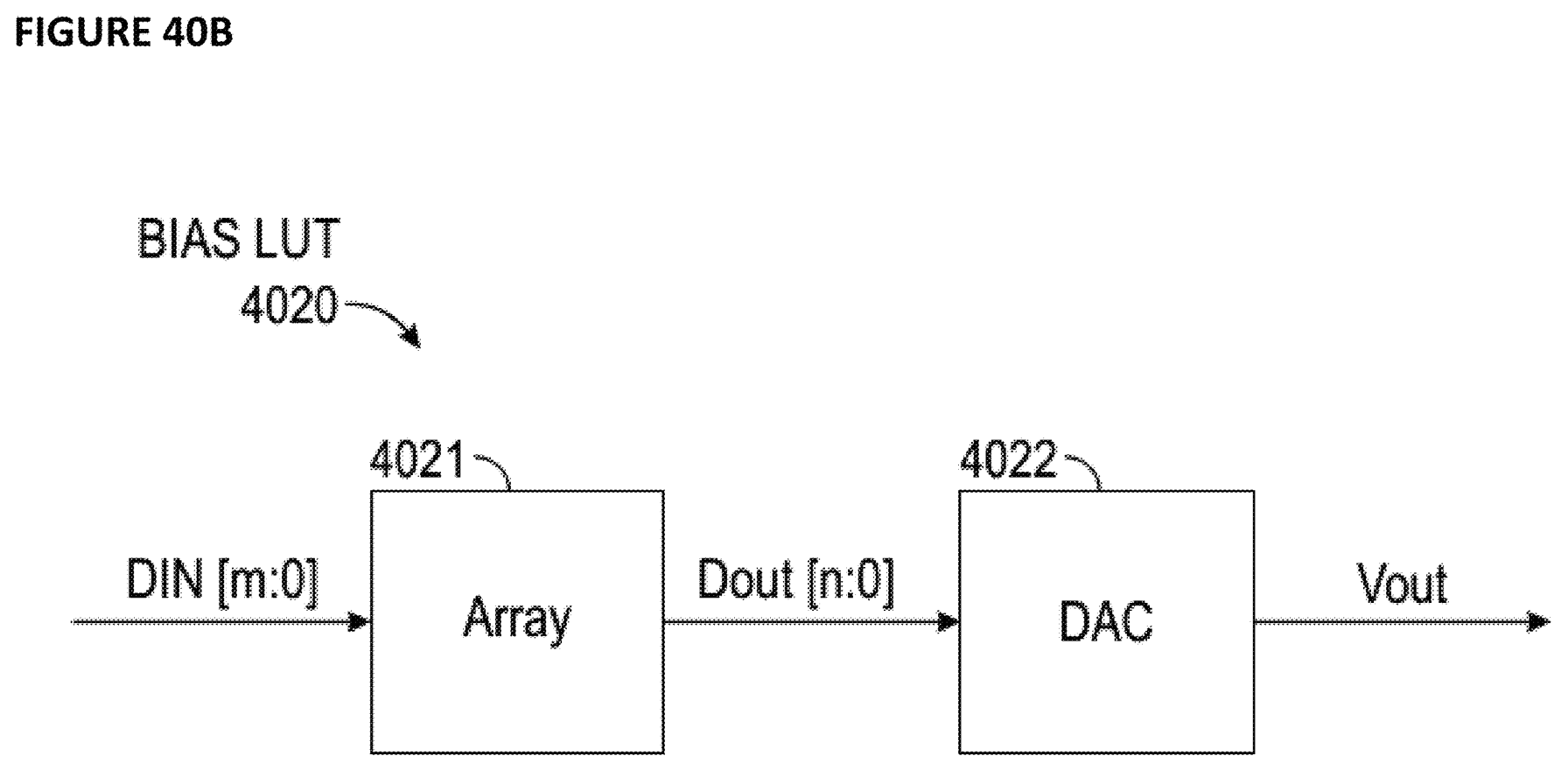

FIG. 40B depicts a bias look up table (BLUT) 4020. Array 4021 is an array or a portion of an array of volatile or non-volatile memory cells. Array 4021 receives a digital input, DIN[m:0] and outputs a digital output, DOUT[n:0]. The digital output data pattern is programmable depending on the desired output such as from linear or sub threshold memory cell relation, or from silicon characterization data, without limitation. The digital output data, DOUT[n:0], is then applied to digital-to-analog converter 4022, which outputs a desirable bias analog voltage to be applied to the array, or sub-array, in question. BLUT 4020 is used, for example, to provide biases values in conjunction with a temperature sensor, i.e., temperature biases, to improve the neural network performance.

Figure 41:
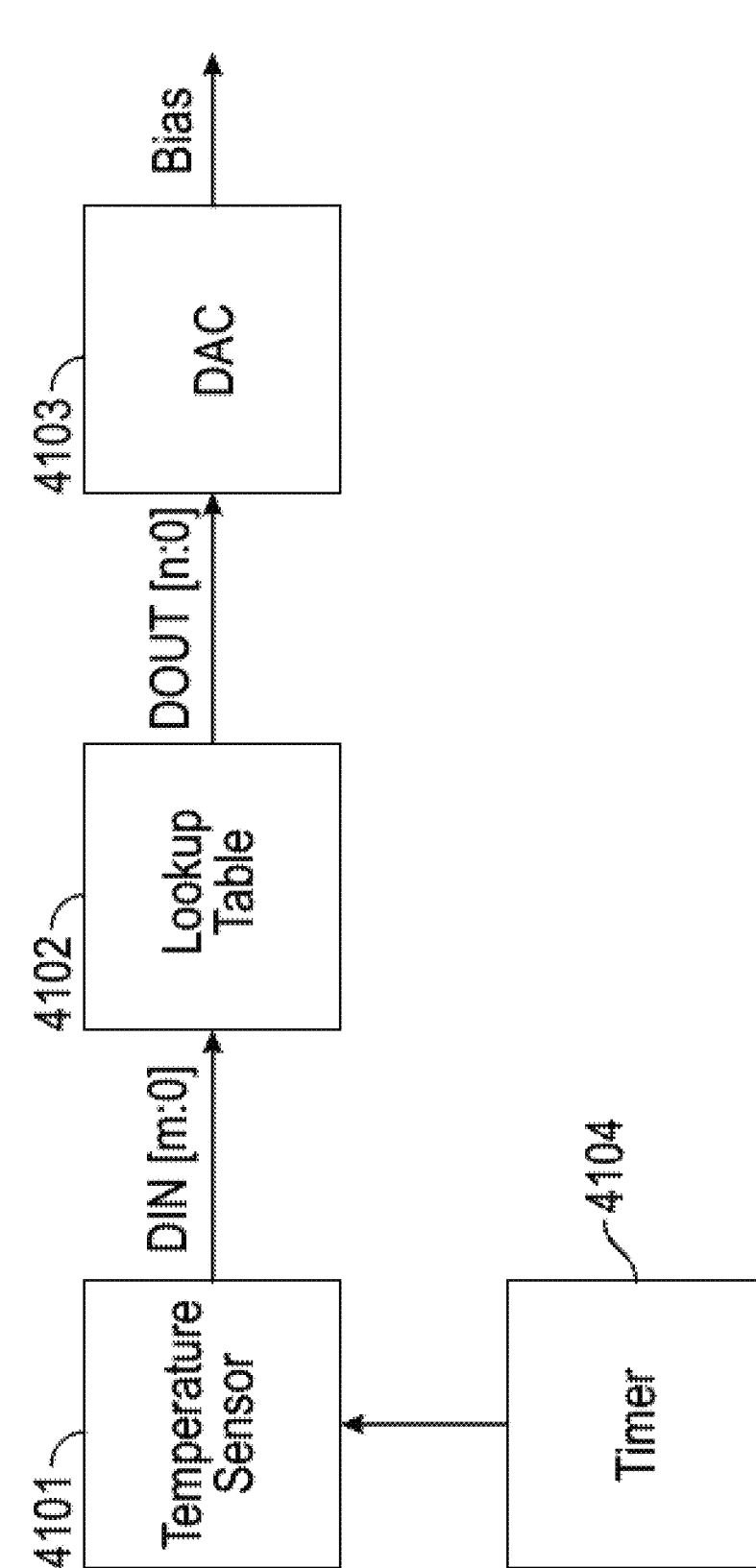
FIG. 41 depicts a method.

FIG. 41 depicts bias generation circuit 4100. Temperature sensor 4101A senses an operating temperature and indicates the operating temperature with digital bits D[m:0]. Optionally a timer 4104 can initiate the temperature sensing and subsequent bias generation such as for example every 10-100 ms (the time that the silicon takes to increase one degree Celsius as example, with one degree Celsius as the allowable temperature change to not affect the network performance significantly). Those D[m:0] bits are used to perform a lookup in lookup table 4102 to find the bias value that should be applied based on that operating temperature, i.e., the appropriate temperature bias. The bias value is indicated with digital bits D[k:0], which are provided to digital-to-analog converter 4103, which converts the digital bits into a bias voltage, which can then be applied to a terminals of memory cells (e.g., control gate terminals) in an array during a read (inference) operation.

Figure 42:
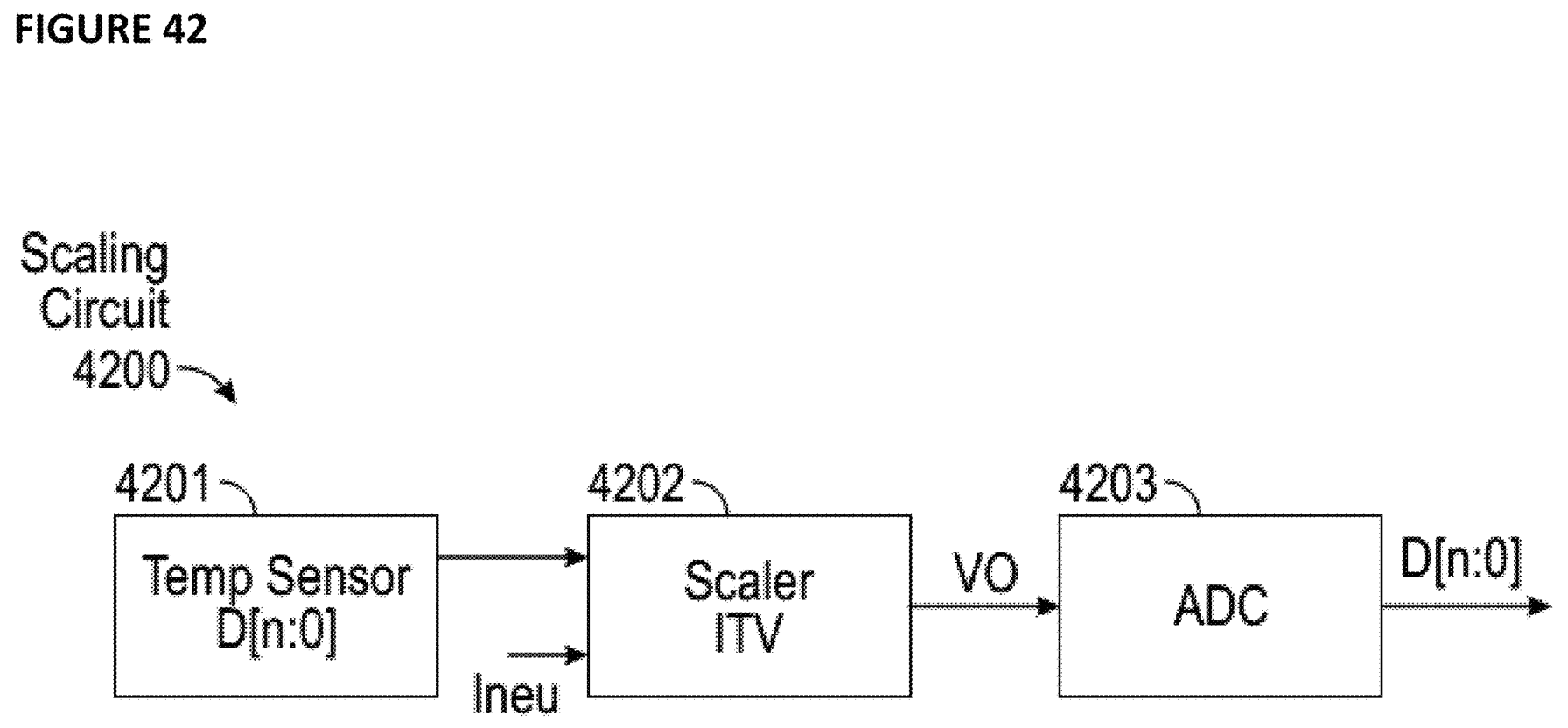

FIG. 42 depicts scaling circuit 4200. Temperature sensor 4201 senses an operating temperature and indicates the operating temperature with digital bits D[n:0]. Those digital bits are provided to scaler 4202, which also receives output neuron current, Ineu, from an array as a result of a neuron read operation. Scaler 4202 performs current-to-voltage conversion of Ineu and performs scaling of that signal based on D[n:0]. For example, for the sub-threshold region, higher temperatures result in higher neuron current (due to higher memory cell current), hence it is desirable to scale down this current before it is applied to the ADC 4203. For the linear region, higher temperatures result in typically lower neuron current (due to lower cell current), hence it is desirable to scale up this current before it is applied to the ADC 4203. The result is a more balanced analog value over temperature that is provided to analog-to-digital converter 4203, resulting in digital output bits D[n:0] that represents the scaled, digital version of Ineu, which scaling at least partially compensates for the senses operating temperature.

Figure 43:
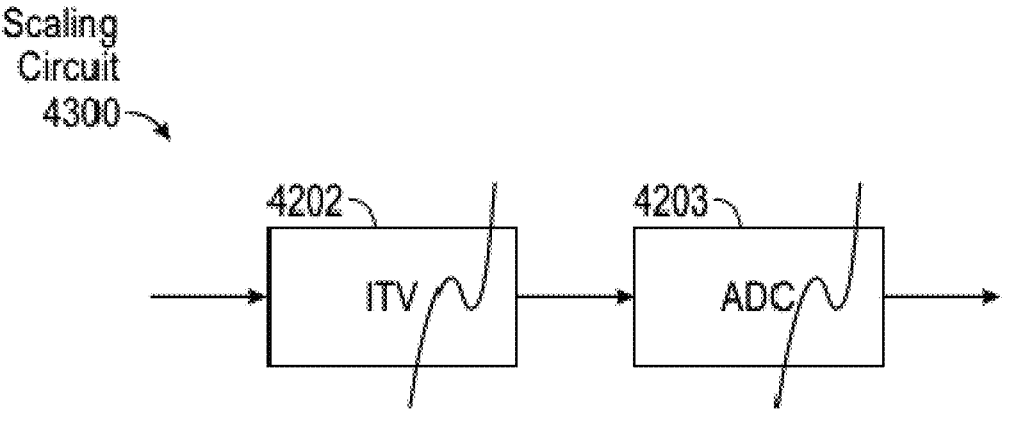
FIG. 43 depicts an implementation of a scaler and an analog-to-digital converter.

FIG. 43 depicts scaling circuit 4300, which is an implementation of scaler ITV (current to voltage converter) 4202 and analog-to-digital converter 4203 from FIG. 42. Scaler 4202 has a programmable gain, which may be programmed by programming an R value (for the ITV circuit that uses R to convert the neuron current into a voltage to be digitized by the ADC) or a C value (for the ITV circuit that uses C to convert the neuron current into a voltage to be digitized by the ADC). Scaler 4202 can also be implemented as a programmable current mirror (for the neuron (bitline) current). ADC 4203 is a programmable n-bit ADC, where n can be, for example, 4 or 8 or 12 bits.

Figure 44A:
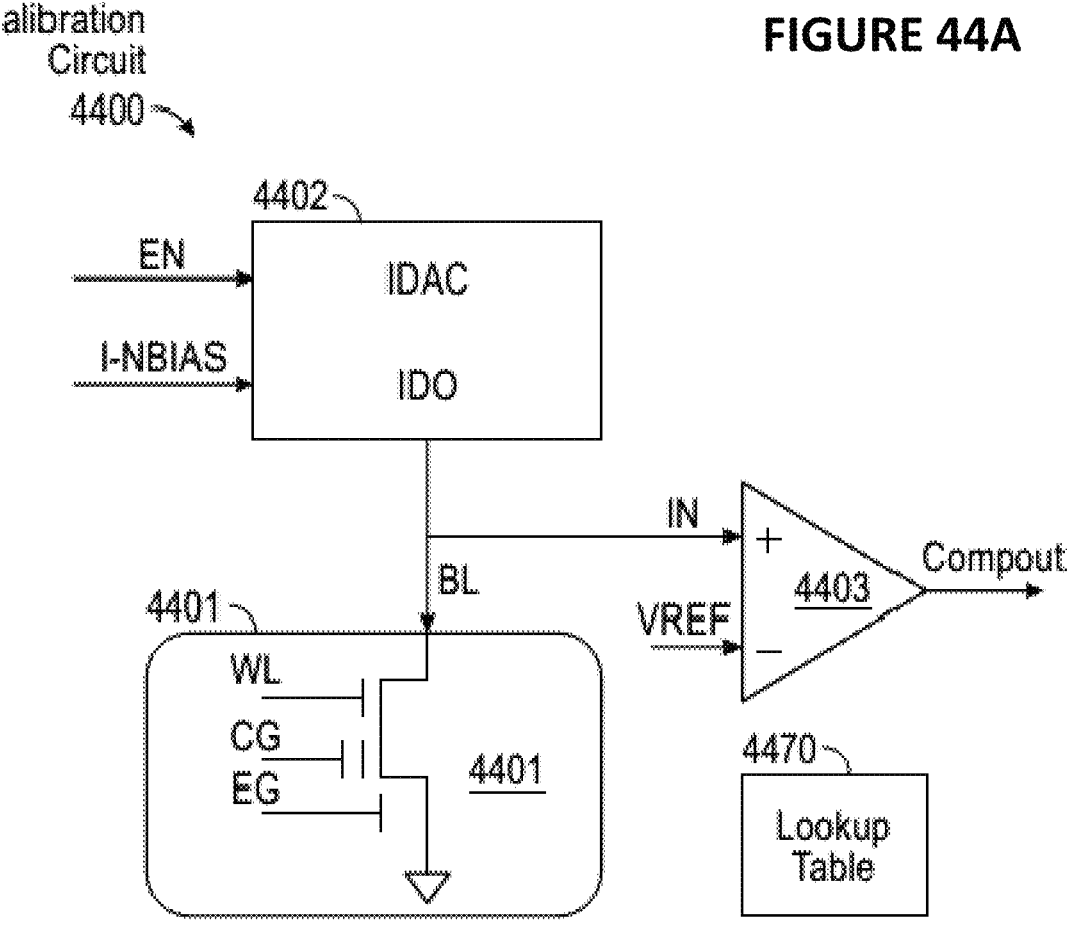
FIG. 44A depicts a calibration circuit.

FIG. 44A depicts calibration circuit 4400, and FIG. 44B depicts calibration method 4450 that utilizes calibration circuit 4400 to populate lookup table 4470 with values. Current digital-to-analog converter 4402 is coupled to the bit line(s) of memory cell(s) 4401 and to the non-inverting input of comparator 4403, which also receives a reference voltage VREF at its inverting input. The memory cell (s) 4401 can be a single cell or a plurality of cells (e.g., from a reference array or a portion of a main array)

As stated above, each non-volatile or volatile memory cell used in the analog neural memory system is to be erased and programmed to hold a very specific and precise amount of charge, i.e., the number of electrons, in the floating gate. For example, each floating gate should hold one of N different values, where N is the number of different weights that can be indicated by each cell. Examples of N include 16, 32, 64, 128, and 256. Calibration method 4450 is performed for each of the N different values that can be stored in memory cell 4401. Each time calibration method 4450 is performed, memory cell 4401 is programmed (tuned) to 1 of the N different values, such as a read current of 10 nA (step 4451).

The voltage on the control gate of memory cell 4401 is measured in accordance with calibration method 4450. The bitline current is varied by current digital to analog converter 4402 from a low current (such as 1 nA) to a high current (such as 100 nA), such that currents of increasing size are applied, and the output of comparator 4403 (referred to as a comparison output) is monitored. At some point, the comparison output will change in value (e.g., from a "0" to a "1") (step 4452). When the flip occurs, i.e., before any change in the bitline current by current digital to analog converter 4402, the control gate voltage of memory cell 4401 is measured, and that control gate voltage can be stored in lookup table 4470. The method is repeated for the other N possible values that can be stored in memory cell. If more than one cell is used then the currents provided by the current DAC (IDAC) need be adjusted accordingly, for example if 4 cells are used with 1 nA each cell (for example for averaging), then the IDAC current is 4 nA. The resulting CG voltages are stored in lookup table 4470 (step 4454).

In another embodiment, lookup table 4470 is further expanded to include values for a plurality of temperatures within the expected operating range, such that lookup table 4470 is a temperature bias lookup table (TBLUT).

For example, for in a situation where N=128 (which corresponds to an 8-bit input value), an equivalent current range might be 1 na to 128 nA with each 1 nA increment associated with one of N levels. Calibration circuit 4400 and calibration method 4450 are then used to populate lookup table 4470 with CG voltages for all 128 levels for each of a plurality of different temperatures (e.g., −40 C, −39 C, . . . 0 C, . . . 25 C, 26 C, . . . , 85 C). If, for example, 10 different temperature points are used for N=128, then lookup table will be populated with 1280 values (one value for each of the 128 levels for each of the 10 different temperatures.

In another calibration method, a plurality of cells are used to store (weights) currents which represents samples in the array. A bias current from IDAC 4402 is then applied and CG is extracted as above for each of the plurality of cells and their corresponding stored values (weights). This can be determined over temperature and stored in a look up table so the CG bias changes over temperature can be recalled from the look up table for different stored values (weights) and be applied to the arrays based on the stored value for the cell in question. Optionally, this can be performed in real-time and the biases applied to various cells in the array during operation.

In another embodiment, calibration circuit 4400 and calibration method 4450 of FIG. 44 can be used to do calculate an average of the CG voltage to be applied for each of the N levels for each of the plurality of different temperatures. For example, for each value of N and each temperature, M different readings can be taken and the average reading stored in lookup table 4470. If, for example, 10 different temperature points are used for N=128, then 1280*M readings will be taken, with 1280 different averages stored in lookup table 4470.

In another embodiment, instead of taking measurements for all N possible values for each of the plurality of temperatures, measurements instead can be taken for a smaller set of possible values (e.g., for 4 of the N possible values instead of all N possible values), and the averages of those smaller set of possible values can be stored in lookup table 4470 for the particular temperature used. Thus, if 10 different temperatures are used, then lookup table 4470 will contained only 10 values (one value for each of the 10 different temperatures.

In another embodiment, the EG bias voltage is also varied. Measurements of the CG voltage are taken at different EG bias voltages, and CG and EG biases are stored in lookup table 4470.

Figure 45:
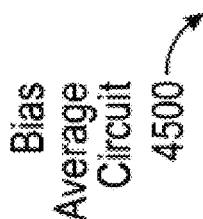
FIG. 45 depicts a bias averaging circuit.

FIG. 45 depicts bias average circuit 4500 for determining an average bias based on measurements performed on n+1 different memory cells. The calibration method 4450 is performed on n+1 different cells, each resulting in a voltage (e.g., VCG) that represents the "optimal" or average bias voltage for that cell.

Each cell is associated with a measuring block 4501, here shown as measuring blocks 4501-0 through 4501-*n*. Each measuring block 4501 is identical. Measuring block 4501-0 comprises operation amplifier 4502-0, PMOS transistors 4503-0 and 4504 arranged as a current mirror, NMOS transistor 4505-0, and resistor 4506-0. Other measuring blocks 4501 contain identical components. During operation, each measuring block 4501 contributes the mirrored current through its PMOS transistor 4504, which is summed at the top terminal of resistor 4507, which resistor 4507 may be a variable resistor. The output, VOUT, is the average of the various voltages that were provided as inputs to blocks 4501 (by proper ratio of value of the resistor 4507 over 4506**). The output voltage VOUT=(R−4507/R−4506)*summation of VIN0 to VINn, for example n=3, R−4507/R4506=¼, VOUT=(¼)*(VIN0+VIN1+VIN2+VIN3), =average voltage of four input voltages VIN0-3.

The output voltage, VOUT, can be applied as a bias to a control gate terminal of one or more cells in the neural network memory array.

Figure 46A:
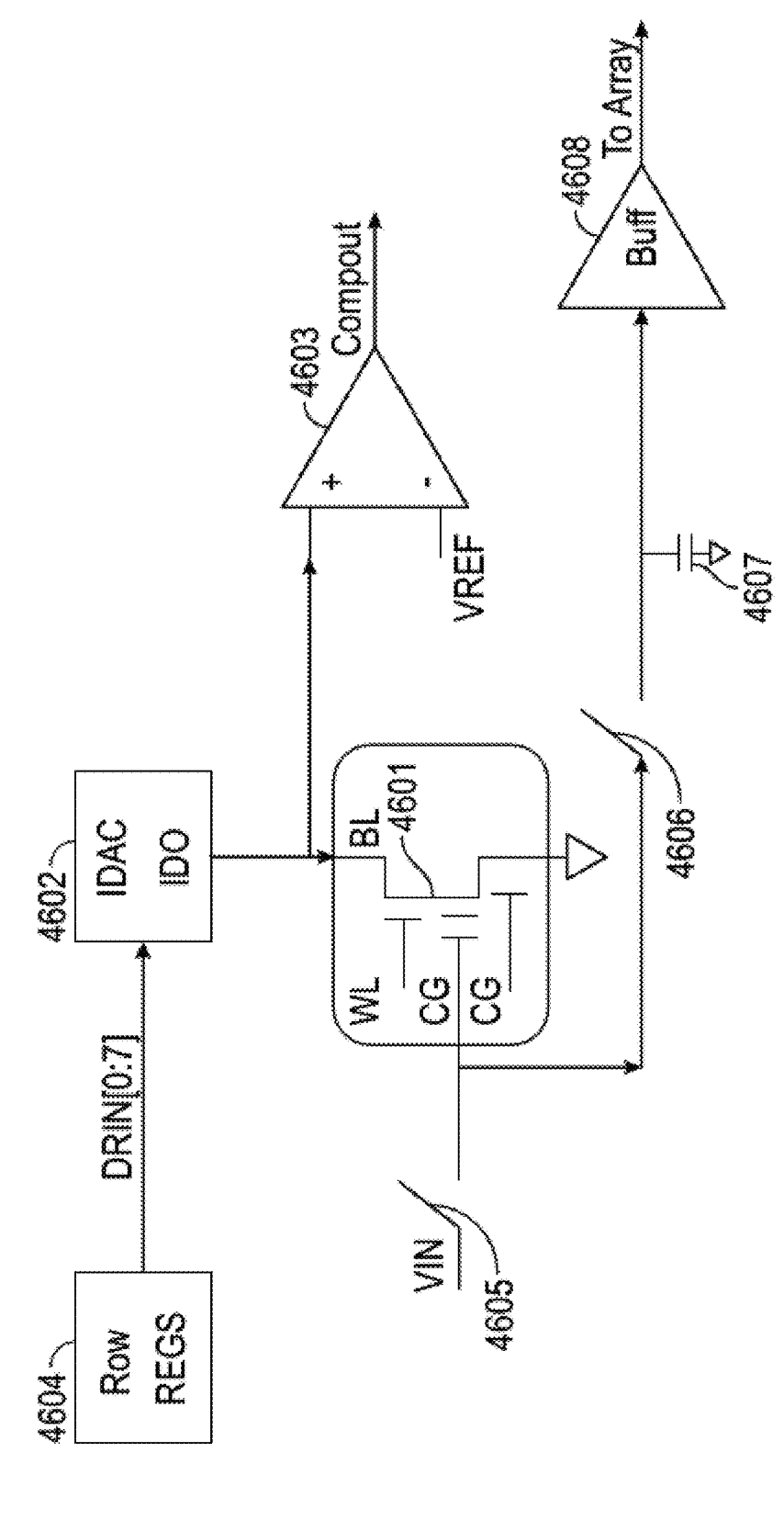
FIG. 46A depicts a bias generation block.

FIG. 46A depicts bias generation block 4600. Bias generation block 4600 comprises current digital-to-analog converter 4602 coupled to the bit line of memory cell 4601 and to a non-inverting input of comparator 4603, which comparator 4603 also receives a reference voltage VREF to its inverting input (where VREF is the same VREF shown in FIG. 44). Row registers 4604 provide a digital value, DRIN [0:7], to IDAX 4602, which converts the digital value into a current applied to the bit line terminal of cell 4601. An external voltage, VIN, is applied to the CG terminal when switch 4605 is closed. Switch 4606 is closed, and capacitor 4607 is charged to the same voltage as CG. When the output of comparator 4603 changes, switch 4606 is opened; the voltage of capacitor 4607 at that point represents the CG voltage that caused the output of comparator 4603 to change, which is a determined bias voltage. That is, switch 4606 and capacitor 4607 form a sample-and-hold circuit. That voltage is held steady by buffer 4608 and then applied to control gates in an array. The memory cell 4601 can be operated in the sub-threshold region or the linear region.

Figure 46B:
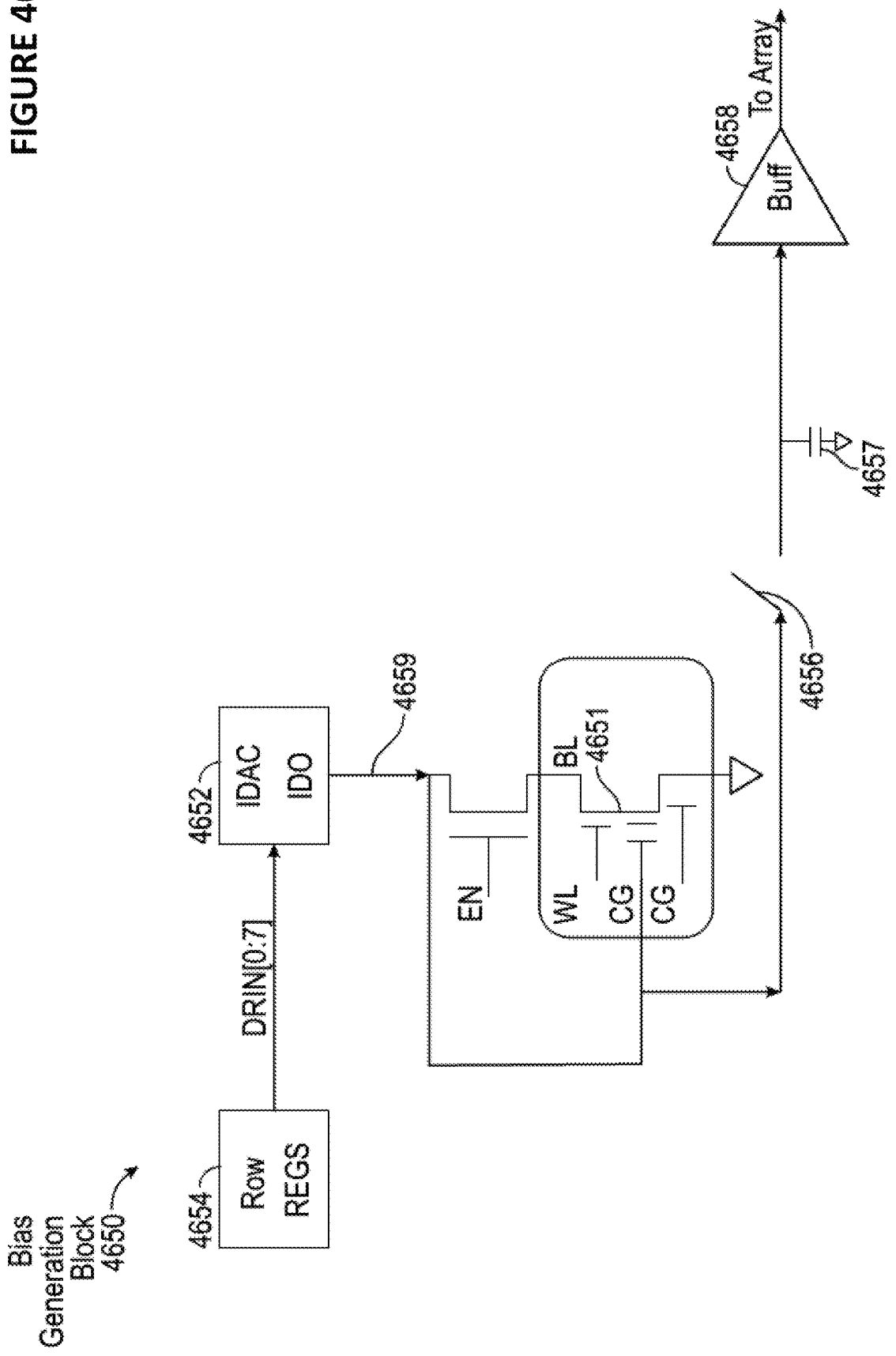
FIG. 46B depicts another bias generation block.

FIG. 46B depicts bias generation block 4650, which is similar to bias generation block 4600 except the memory cell 4651 is diode connected to generate the CG bias and does not use a comparator. Bias generation block 4650 can be used in FIG. 44A to generate CG bias values for look up table 4470. Bias generation block 4650 comprises current digital-to-analog converter 4652 coupled to the bit line of memory cell 4651. Current digital-to-analog converter 4652 is controlled by row registers 4654. The voltage on control gate of cell 4651 is sampled by switch 4656, which then charges capacitor 4657 to that voltage, which capacitor 4657 holds the voltage after switch 4656 is opened. That is, switch 4656 and capacitor 4657 form a sample-and-hold circuit. That voltage is held steady by buffer 4658 and then applied to control gates in an array. Memory cell 4651 can be operated in the sub-threshold region or the linear region. Bias generation block 4650 converts an input digital value DRIN[0:7] from row registers 4654 into an equivalent CG voltage to be applied to the array.

Figure 46C:
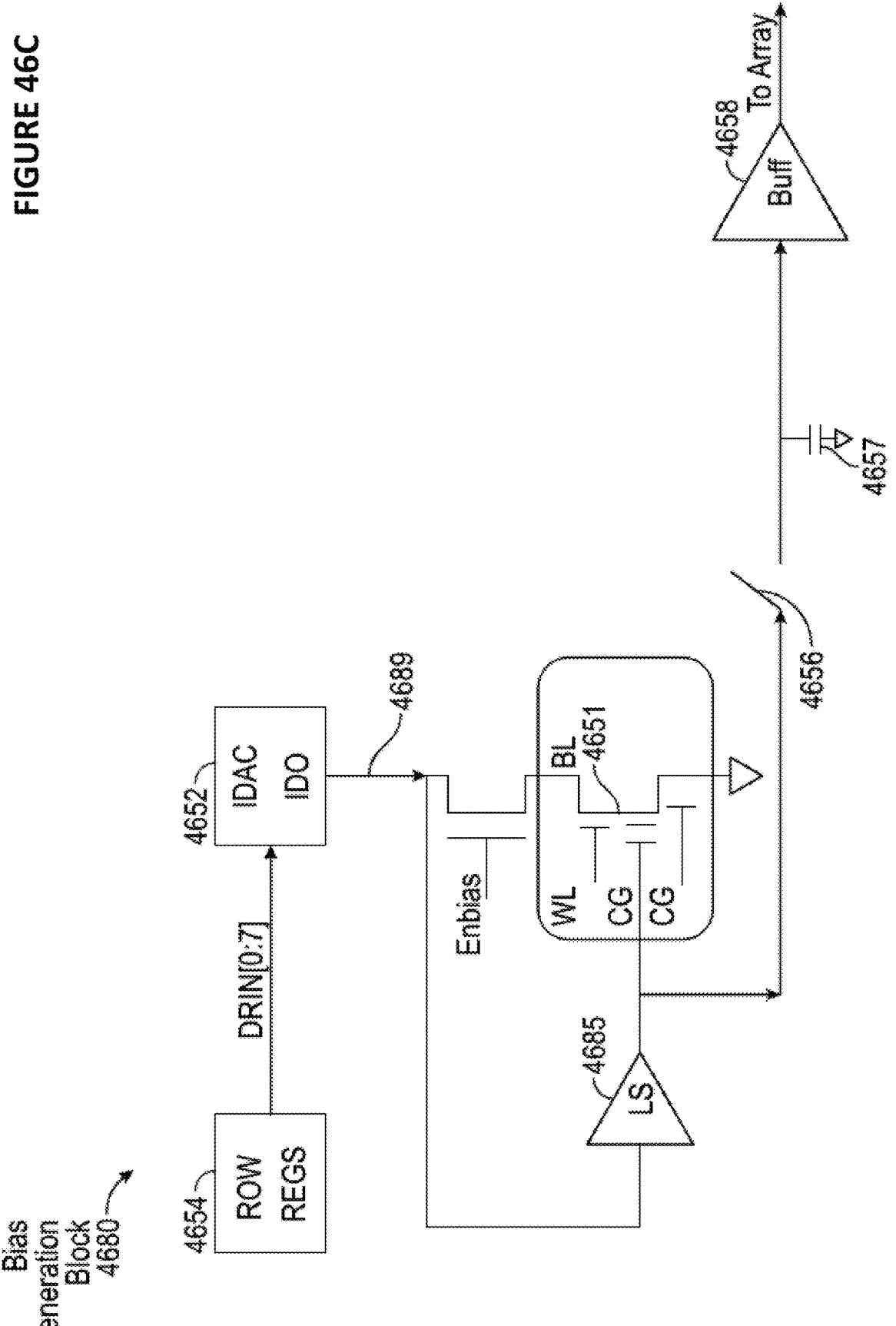
FIG. 46C depicts another bias generation block.

FIG. 46C depicts bias generation block 4680, which is similar to bias generation block 4650 except that it adds level shifter 4685. Bias generation block 4680 can be used in FIG. 44A to generate CG bias values for look up table 4470. Bias generation block 4680 comprises current digital-to-analog converter 4652 coupled to the bit line of memory cell 4651. Current digital-to-analog converter 4652 is controlled by row registers 4654. Level shifter 4685 is placed between the output of current digital-to-analog converter 4652 and the control gate terminal of memory cell 4651, and shifts, for example, the voltage by a bias voltage (e.g., 0.2V-0.5V). The voltage on control gate of cell 4651 is sampled by switch 4656, which then charges capacitor 4657 to that voltage, which capacitor 4657 holds the voltage after switch 4656 is opened. That is, switch 4656 and capacitor 4657 form a sample-and-hold circuit. That voltage is held steady by buffer 4658 and then applied to control gates in an array. Memory cell 4651 can be operated in the sub-threshold region or the linear region. Bias generation block 4650 converts an input digital value DRIN[0:7] from row registers 4654 into an equivalent CG voltage to be applied to the array.

Figure 47:
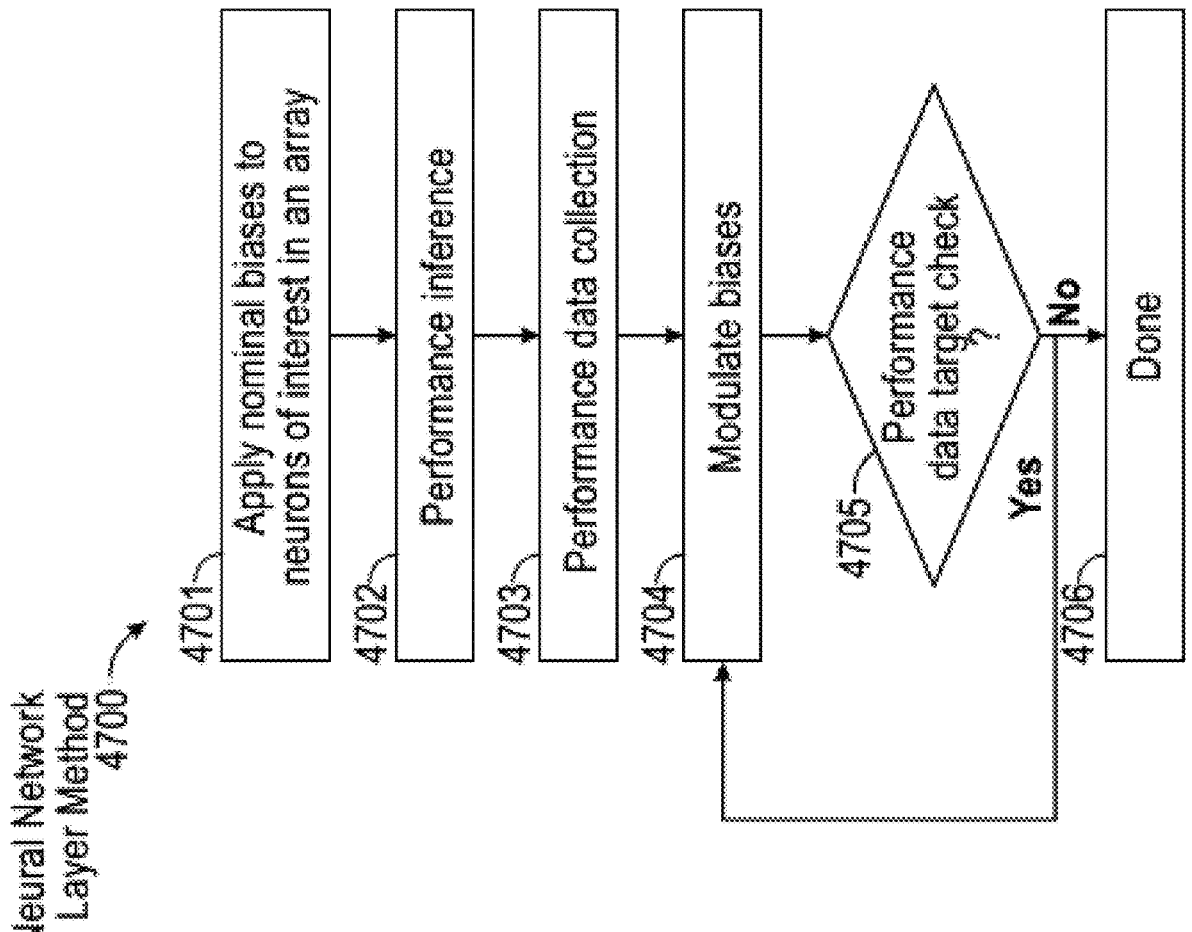
FIG. 47 depicts a neural network layer method.

FIG. 47 depicts a neural network neuron method 4700 performed on a particular neuron within a neural network. In step 4701, nominal biases are applied to the particular neurons of interest of the array. This method might be performed on a neuron that is deemed more important due to its frequency of use. Steps 4702 to 4706 are identical to steps 3602 to 3606 in FIG. 36.

FIG. 48 depicts neural network method 4800. The method 4800 comprises sensing an operating temperature associated with a first set of memory cells (step 4801); determining a bias in a lookup table based on the sensed operating temperature (step 4802); applying the determined bias to terminals of the first set of memory cells (step 4803); and performing a read operation on the first set of memory cells (step 4804). Optionally, the first set of memory cells can comprise all cells in an array. Optionally, the first set of memory cells can comprise all cells in all arrays. Optionally, method 4800 further comprises sensing an operating temperature associated with a second set of memory cells (step 4805); determining a bias in a lookup table based on the second sensed operating temperature (step 4806); applying the determined bias to terminals of the second set of memory cells (step 4807); and performing a read operation on the second set of memory cells (step 4808).

FIG. 49 depicts neural network operation method 4900, which is similar to neural network operation method 4800 except that bias calibration is performed in in real time. Neural network operation method 4900 comprises sensing an operating temperature associated with a first set of memory cells (step 4901); determining a bias based on the sensed operating temperature (step 4902), applying the determined bias to terminals of the first set of memory cells (step 4903); and performing a read operation on the first set of memory cells (step 4904). Optionally, the first set of memory cells can comprise all cells in an array. Optionally, the first set of memory cells can comprise all cells in all arrays. Optionally, method 4900 further comprises sensing an operating temperature associated with a second set of memory cells (step 4905); determining a bias based on the second sensed operating temperature (step 4906); applying the determined bias to terminals of the second set of memory cells (step 4907); and performing a read operation on the second set of memory cells (step 4908).

FIG. 50 depicts neural network method 5000, which comprises programming one or more memory cells (step 5001); applying a plurality of currents to the programmed memory cells (step 5002); measuring a voltage of a control gate terminal of each programmed memory cell and storing the voltage as a determine bias for a cell storing the value stored in the programmed memory cell (step 5003) applying bias voltages to terminals of a set of memory cells based using the determined biases for cells storing the values to be stored in the set of memory cells (step 5004); and performing a read operation on the set of memory cells (step 5005).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
programming a memory cell capable of storing any of N values with 1 of the N values;
applying, by a current source, a series of currents of increasing size to a bit line of the memory cell;
comparing a voltage of the bit line to a reference voltage to generate a comparison output; and
when the comparison output changes value, measuring a voltage of a control gate terminal of the memory cell and storing the voltage in a bias lookup table.

2. The method of claim 1, wherein the memory cell is a non-volatile memory cell.

3. The method of claim 1, wherein the memory cell is a volatile memory cell.

4. The method of claim 1, wherein the voltage of the control gate terminal is measured using a sample-and-hold circuit.

5. A calibration circuit comprising:
a memory cell capable of storing any of N values with 1 of the N values, the memory cell comprising a control gate terminal;
a bit line coupled to the memory cell;
a current digital-to-analog converter to apply a series of currents of increasing size to the bit line;
a comparator to compare a voltage of the bit line to a reference voltage to generate a comparison output; and
a bias lookup table to store a voltage of the control gate terminal when the comparison output changes value.

6. The circuit of claim 5, wherein the memory cell is a non-volatile memory cell.

7. The circuit of claim 5, wherein the memory cell is a volatile memory cell.

8. The circuit of claim 5, comprising a sample-and-hold circuit to measure the voltage of the control gate terminal.

9. A method comprising:
programming a memory cell;
applying, by a current source, a series of currents of increasing size to a bit line of the programmed memory cell;
comparing a voltage of the bit line to a reference voltage to generate a comparison output;
when the comparison output changes value, measuring a voltage of a control gate terminal of the memory cell and storing the voltage as a determined bias;
applying the determined bias to a control gate line coupled to a set of memory cells; and
performing a read operation on the set of memory cells.

10. A system comprising:
a memory cell capable of storing any of N values with 1 of the N values, the memory cell comprising a control gate terminal;
a bit line coupled to the memory cell;

a current digital-to-analog converter to apply a series of currents of increasing size to the bit line;

a comparator to compare a voltage of the bit line to a reference voltage to generate a comparison output; and a buffer to apply a voltage of the control gate terminal to a control gate line coupled to a row of memory cells when the comparison output changes value.

11. The system of claim 10, comprising a capacitor coupled between an input of the buffer and ground.

12. The system of claim 10, comprising a register to provide digital inputs to the current digital-to-analog converter.

\* \* \* \* \*